United States Patent
Ogata et al.

(10) Patent No.: US 8,222,807 B2
(45) Date of Patent: Jul. 17, 2012

(54) ORGANIC ELECTROLUMINESCENCE DEVICE AND METHOD OF PRODUCING ORGANIC DEVICE

(75) Inventors: Tomoyuki Ogata, Kanagawa (JP);
Kazuki Okabe, Kanagawa (JP);
Koichiro Iida, Kanagawa (JP);
Masayoshi Yabe, Kanagawa (JP)

(73) Assignee: Mitsubishi Chemical Corporation, Tokyo (JP)

( * ) Notice: Subject to any disclaimer, the term of this patent is extended or adjusted under 35 U.S.C. 154(b) by 129 days.

(21) Appl. No.: 12/526,970

(22) PCT Filed: Feb. 15, 2008

(86) PCT No.: PCT/JP2008/052546
§ 371 (c)(1),
(2), (4) Date: Aug. 13, 2009

(87) PCT Pub. No.: WO2008/099926
PCT Pub. Date: Aug. 21, 2008

(65) Prior Publication Data
US 2010/0090590 A1 Apr. 15, 2010

(30) Foreign Application Priority Data
Feb. 15, 2007 (JP) .................. 2007-034466

(51) Int. Cl.
*H01J 1/62* (2006.01)
*B32B 9/00* (2006.01)
*H01L 51/00* (2006.01)

(52) U.S. Cl. ............. 313/504; 428/690; 427/66; 445/24

(58) Field of Classification Search .............. 428/690
See application file for complete search history.

(56) References Cited

U.S. PATENT DOCUMENTS

| 6,515,314 | B1 | 2/2003 | Duggal et al. |
| 2002/0045062 | A1 | 4/2002 | Senoo et al. |
| 2003/0044518 | A1 | 3/2003 | Senoo et al. |
| 2003/0129524 | A1* | 7/2003 | Yanaka ............... 430/157 |
| 2004/0247934 | A1 | 12/2004 | Takeuchi et al. |
| 2006/0142520 | A1* | 6/2006 | Jones et al. .......... 526/328.5 |

(Continued)

FOREIGN PATENT DOCUMENTS

JP  7 85973  3/1995

(Continued)

OTHER PUBLICATIONS

Yang, Xiaohui et al., "Highly Efficient Polymeric Electrophosphorescent Diodes", Advanced Materials, vol. 18, pp. 948-954, (2006).

(Continued)

*Primary Examiner* — Karabi Guharay
*Assistant Examiner* — Michael Santonocito
(74) *Attorney, Agent, or Firm* — Oblon, Spivak, McClelland, Maier & Neustadt, L.L.P.

(57) ABSTRACT

To provide an organic electroluminescence device that can suppress rise in the driving voltage at the time of constant-current energization and degradation in brightness at the time of energization, and thus excels in its driving lifetime, the organic electroluminescence device comprises: a substrate; an anode and a cathode overlying the substrate; and a plurality of organic layers disposed between the anode and the cathode, and the plurality of organic layers comprise at least: a first layer formed by means of polymerization of a polymerizable compound; and a second layer disposed adjacently to the first layer and containing a polymerization initiator.

8 Claims, 1 Drawing Sheet

U.S. PATENT DOCUMENTS

| | | | |
|---|---|---|---|
| 2006/0189788 A1* | 8/2006 | Araki et al. | 528/425 |
| 2007/0029556 A1* | 2/2007 | Su et al. | 257/79 |
| 2007/0148593 A1* | 6/2007 | Shimada et al. | 430/270.1 |
| 2009/0230846 A1 | 9/2009 | Yabe et al. | |

FOREIGN PATENT DOCUMENTS

| | | |
|---|---|---|
| JP | 9 153641 | 6/1997 |
| JP | 10-17688 | 1/1998 |
| JP | 2001 297882 | 10/2001 |
| JP | 2001 303038 | 10/2001 |
| JP | 2003 73666 | 3/2003 |
| JP | 2004 103401 | 4/2004 |
| JP | 2005-37881 | 2/2005 |
| JP | 2007-182432 | 7/2007 |
| WO | WO 2006/123667 A1 | 11/2006 |

OTHER PUBLICATIONS

Japanese Office Action issued Mar. 1, 2011, in Patent Application No. 2008-034930 (with English-language translation).

Japanese Office Action issued Mar. 1, 2011, in Patent Application No. 2011-016536 (with English-language translation).

Extended European Search Report issued Mar. 22, 2011, in Patent Application No. 08711376.7.

Decision of Rejection with English language translation. Mailed by the Chinese Patent Office on Mar. 23, 2012 in corresponding Chinese Patent Application No. 200880001524.

* cited by examiner

ORGANIC ELECTROLUMINESCENCE DEVICE AND METHOD OF PRODUCING ORGANIC DEVICE

TECHNICAL FIELD

The present invention relates to an organic electroluminescence device that comprises a layer formed by means of polymerization of a polymerizable compound and a method of producing an organic device that comprises a layer formed by means of polymerization of a polymerizable compound.

BACKGROUND ART

In recent years, electroluminescence devices that uses organic thin films (organic electroluminescence devices) have been developed. As formation methods of organic thin films (organic layers) of organic electroluminescence devices include vacuum evaporation method and wet coating method.

Vacuum evaporation method has advantages of improved charge injection from the anode and/or cathode and easy containment of excitons into the emitting layer, since it is easy to form a laminated structure by the method.

On the other hand, wet coating method has advantages such as no vacuum process, ease in forming large-area devices, and ease in mixing two or more kinds of materials having different functions in one layer (coating liquid).

However, it is difficult to form a laminated structure by wet coating method, and therefore, devices produced by the method are inferior to those produced by vacuum evaporation method in driving stability and thus most of them have not yet been developed to a practical level presently.

Particularly, it has been difficult to form a laminated structure of three or more organic layers by wet coating method, even though a laminated structure of two organic layers is possible by methods such as utilizing an organic solvent and an aqueous solvent.

In order to solve such problems with respect to lamination of organic layers, Patent Document 1, for example, discloses a process in which an organic layer of an organic electroluminescence device is formed through polymerization reaction of a film formed from a solution that contains a diamine compound having epoxy group.

In another instance, Non-Patent Document 1 discloses a process in which a hole-transport layer of an organic electroluminescence device is formed through polymerization reaction of a film formed from a solution containing a diamine compound having oxetane group.

By these methods, a solvent-resistant organic layer can be formed by wet coating method and thus three or more organic layers can be laminated.

[Patent Document 1] Japanese Patent Laid-Open Publication No. Hei 7-85973
[Non-Patent Document 1] Advanced Materials 2006, 18, 948-954.

DISCLOSURE OF THE INVENTION

Problem to Be Solved by the Invention

However, there were problems in the techniques of the above-mentioned Patent Document 1 and Non-Patent Document 1, in which an organic layer is formed by polymerizing a polymerizable compound. Namely, though a polymerization initiator is used with the polymerizable compound in such techniques, the polymerization initiator degrades when applying current and it generates products which will inhibit the charge injection into the emitting layer and the charge movement within the luminescent layer. This makes rise in the driving voltage of the resultant device at the time of constant-current energization and decrease in the brightness stability at the time of energization, which leads to a shortened driving lifetime of the device.

The present invention has been made in view of the above problems.

Namely, an object of the present invention is to provide an organic electroluminescence device that comprises a layer formed by means of polymerization of a polymerizable compound, can suppress rise in the driving voltage at the time of constant-current energization and degradation in brightness at the time of energization, and thus excels in its driving lifetime.

In addition, the other object of the present invention is to provide a production method of an organic device that comprises a layer formed by means of polymerization of a polymerizable compound and of which layers performing major functions have improved chemical stabilities.

Means for Solving the Problem

The inventors of the present invention made an intensive investigation to solve the above problem. As a result thereof, the inventors made the following findings. Namely, when they put the polymerization initiator, which is usually put in a composition together with the polymerizable compound when preparing an organic layer by forming the composition into a layer containing the polymerizable compound and polymerizing the polymerizable compound, unusually in a different layer from the one which is formed through polymerization of the polymerizable compound, the polymerization of the polymerizable compound unexpectedly proceeded to form an organic layer and a device that is free from the above-mentioned problem could be obtained. This findings led the inventors to the completion of the present invention.

Namely, the subject matter of the present invention lies in an organic electroluminescence device comprising: a substrate; an anode and a cathode overlying the substrate; and a plurality of organic layers disposed between the anode and the cathode, wherein the plurality of organic layers comprise at least: a first layer formed by means of polymerization of a polymerizable compound; and a second layer disposed adjacently to the first layer and containing a polymerization initiator (claim 1).

In this case, it is preferable that the plurality of organic layers further comprise an emitting layer, and the emitting layer, the first layer and the second layer are arranged in the listed order (claim 2).

Further, it is preferable that the first layer is a hole-transport layer and the second layer is a hole-injection layer (claim 3).

Further, it is preferable that the content of the polymerization initiator in the second layer is 0.1 weight % or higher (claim 4).

Another subject matter of the present invention lies in a method of producing an organic device that comprises a plurality of organic layers comprising at least a first layer formed by means of polymerization of a polymerizable compound and a second layer disposed adjacently to the first layer and containing a polymerization initiator, comprising the steps of: film formation using a composition containing the polymerization initiator to form the second layer; film formation using a composition containing the polymerizable compound to form a layer containing the polymerizable compound; and polymerization of the polymerizable compound to form the first layer (claim 5).

In this case, it is preferable that the organic device is an organic electroluminescence device further comprising: a substrate; and an anode and a cathode overlying the substrate, and the plurality of organic layers, which comprise the first layer and the second layer, are formed between the anode and the cathode (claim 6).

Still another subject matter of the present invention lies in an organic electroluminescence device comprising: a substrate; an anode and a cathode overlying the substrate; an emitting layer disposed between the anode and the cathode; a polymerized layer formed by means of polymerization of a polymerizable compound; and an adjacent layer disposed adjacently to the polymerized layer at the opposite side to the emitting layer and containing a polymerization initiator, wherein the ratio between QB and QA (namely, QB/QA) is smaller than 0.5, where QA (%) is the ratio of the number of molecules of the polymerization initiator contained in the surface part of the adjacent layer at the side of the polymerized layer, measured by means of XPS method, to the number of molecules of the component other than the polymerization initiator, contained in the surface part of the adjacent layer at the side of the polymerized layer, measured by means of XPS method, and QB (%) is the ratio of the number of molecules of the polymerization initiator contained in the surface part of the polymerized layer at the side of the emitting layer, measured by means of XPS method, to the number of molecules of the component other than the polymerization initiator, contained in the surface part of the polymerized layer at the side of the emitting layer, measured by means of XPS method (claim 7).

Advantageous Effect of the Invention

According to the present invention, an organic electroluminescence device that comprises a layer formed by means of polymerization of a polymerizable compound, can suppress rise in the driving voltage at the time of constant-current energization and degradation in brightness at the time of energization, and thus excels in its driving lifetime can be provided.

In addition, according to the present invention, by a method of producing an organic device that comprises a layer formed by means of polymerization of a polymerizable compound, an organic device of which layers performing major functions have improved chemical stabilities can be easily and efficiently produced.

EXPLANATION OF LETTERS OR NUMERALS

Figure 1:
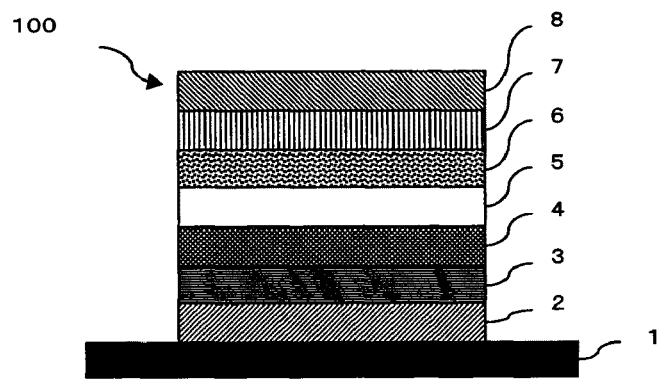
FIG. 1 is a cross-sectional view schematically illustrating the layered structure of the organic electroluminescence device of one embodiment of the present invention.

1: substrate
2: anode
3: hole-injection layer
4: hole-transport layer
5: emitting layer
6: hole-inhibition layer
7: electron-injection layer
8: cathode
9: electron-transport layer
100: organic electroluminescence device

BEST MODES FOR CARRYING OUT THE INVENTION

The present invention will be described in detail below. However, the present invention is not at all limited to the below description, but any modification can be made without departing from the scope of the invention.

I. Basic Structure

The organic electroluminescence device of the present invention comprises a substrate, an anode and a cathode overlying the substrate, and a plurality of organic layers disposed between the anode and the cathode.

And it is characterized in that one of the above-mentioned plurality of organic layers is a layer that is formed by means of polymerization of a polymerizable compound (this is referred to as the "first layer") and another, which is disposed adjacently to the first layer, is a layer that contains a polymerization initiator (this is referred to as the "second layer").

[I-1. Polymerizable Compound]

In the present invention, a "polymerizable compound" means an organic compound having a polymerizable group. In this context, a "polymerizable group" means a group that generates a new chemical bond through its reaction with the same or a different group of another molecule that is located in vicinity. As an example of such a group include a group that generates a new chemical bond through its reaction with the same or a different group of another molecule that is located in vicinity by heat and/or irradiation of activating energy line, or by receiving energy from another molecule such as one of a sensitizer.

Polymerizable compounds are categorized into groups with and without a repetitive unit, according to their structures. There is no special limitation on the polymerizable compound of the present invention, insofar as it is a compound having the above-mentioned polymerizable group. Among them, it is preferably a polymerizable compound having no repetitive unit because it can be of high purity easily then. On the other hand, it is preferably a polymerizable compound having a repetitive unit because it can be superior in its film-formation capability then. Therefore, the polymerizable compound can be selected from any of the monomers having a polymerizable group, and oligomers or polymers that are formed by polymerization of such monomers. In the present Description, an "oligomer" means a lower polymer of which degree of polymerization is about 2 to 20, and a "polymer" means a higher polymer of which degree of polymerization is over 20, for the sake of convenience.

There is no limitation on the polymerizable group. However, groups containing unsaturated double bond, cyclic ether, benzocyclobutene or the like are preferable.

Particularly, the groups selected from the following group T of polymerizable groups are preferable in terms of ease in insolubilization.

Group T of Polymerizable Groups:

[Chemical Formula 1]

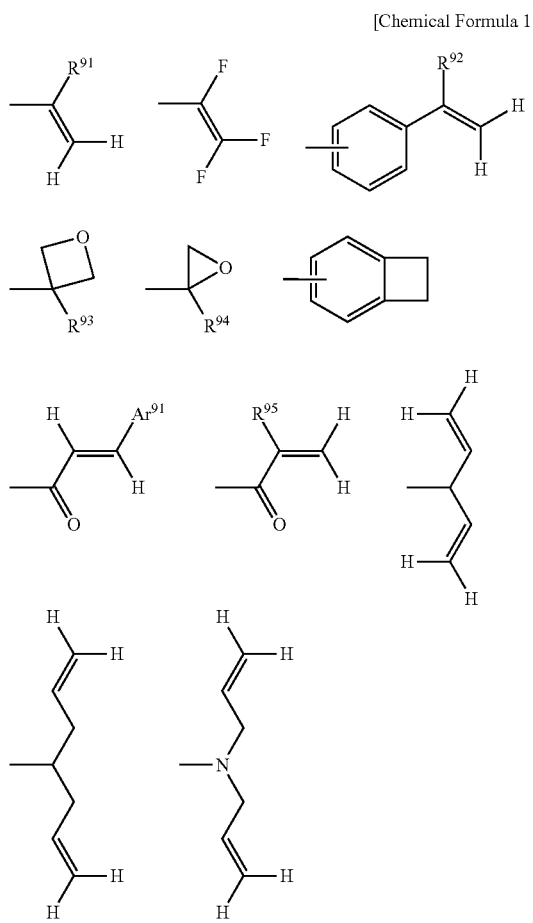

Group T' of Polymerizable Groups:

[Chemical Formula 2]

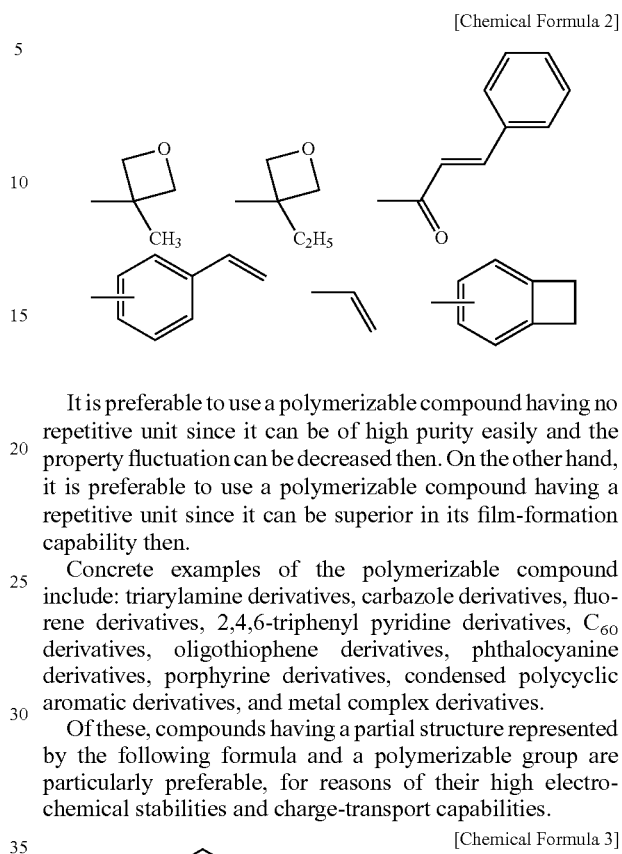

It is preferable to use a polymerizable compound having no repetitive unit since it can be of high purity easily and the property fluctuation can be decreased then. On the other hand, it is preferable to use a polymerizable compound having a repetitive unit since it can be superior in its film-formation capability then.

Concrete examples of the polymerizable compound include: triarylamine derivatives, carbazole derivatives, fluorene derivatives, 2,4,6-triphenyl pyridine derivatives, $C_{60}$ derivatives, oligothiophene derivatives, phthalocyanine derivatives, porphyrine derivatives, condensed polycyclic aromatic derivatives, and metal complex derivatives.

Of these, compounds having a partial structure represented by the following formula and a polymerizable group are particularly preferable, for reasons of their high electrochemical stabilities and charge-transport capabilities.

[Chemical Formula 3]

In the above formulae, $R^{91}$ to $R^{95}$ represent, independently of each other, a hydrogen atom or an alkyl group.

$Ar^{91}$ represents an aromatic hydrocarbon group that may have a substituent or an aromatic heterocycle group that may have a substituent.

Particularly, it is preferable that the polymerizable group is a group selected from the following group T' of polymerizable groups, in terms of superior electrochemical durability.

Examples of the polymerizable compounds having no repetitive unit, among the above particularly preferable polymerizable compounds, include the compounds with the following structures.

[Chemical Formula 4]

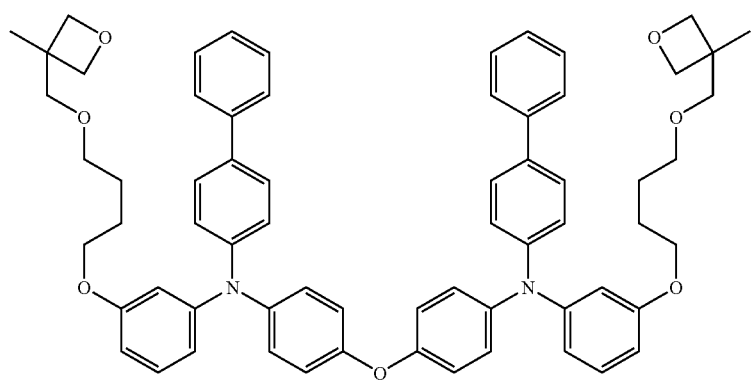

-continued
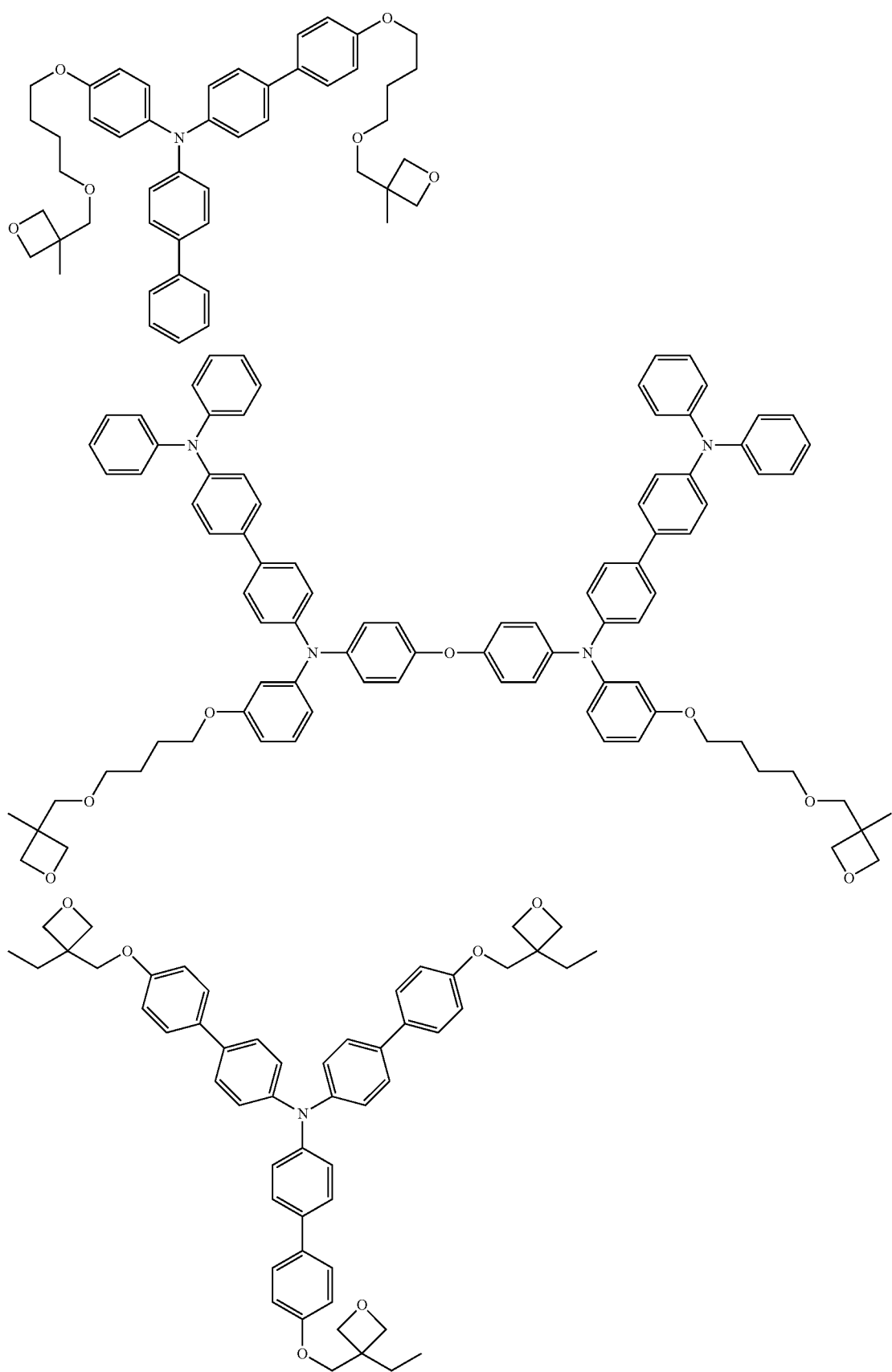

-continued
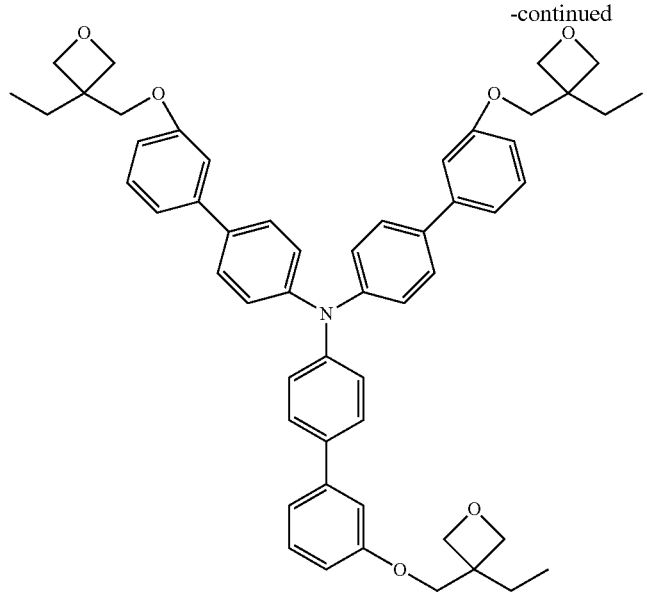
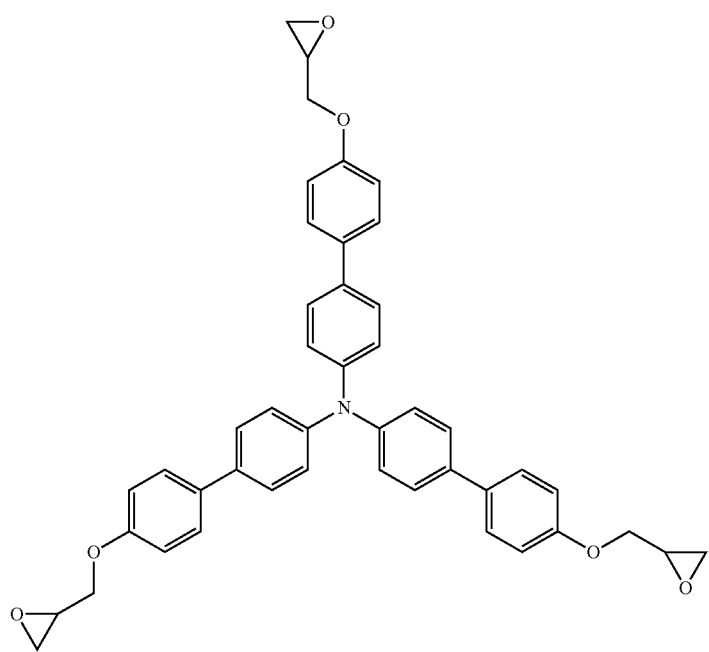

-continued
[Chemical Formula 5]
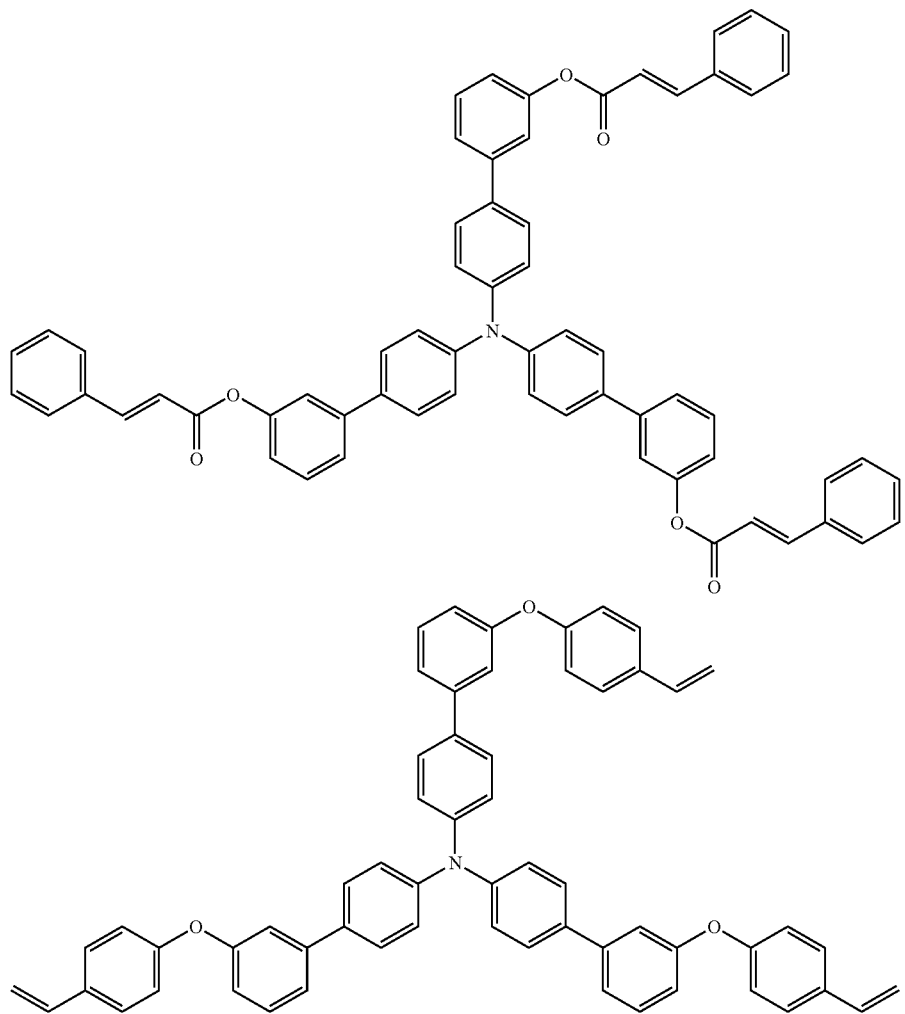
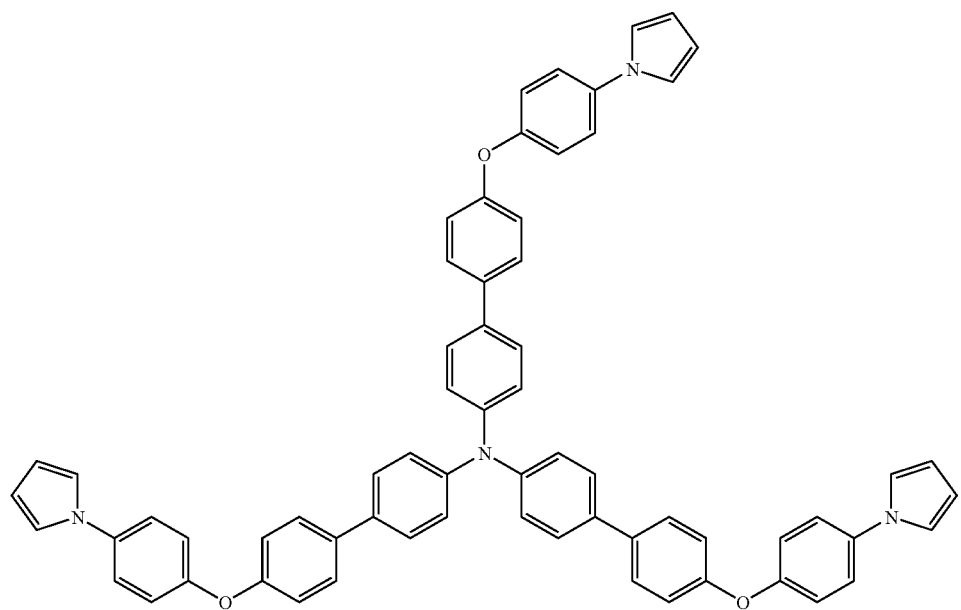

-continued
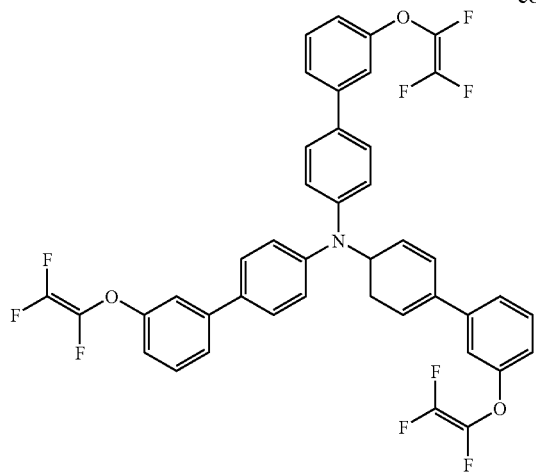
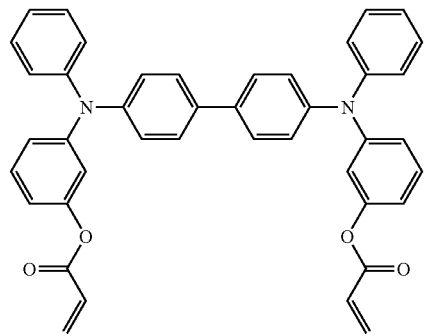
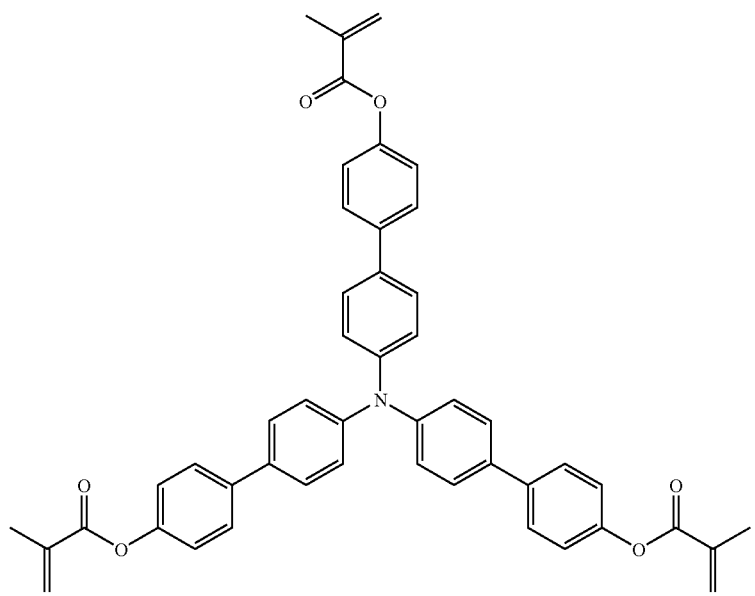
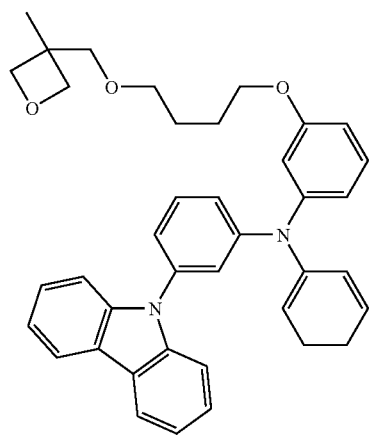
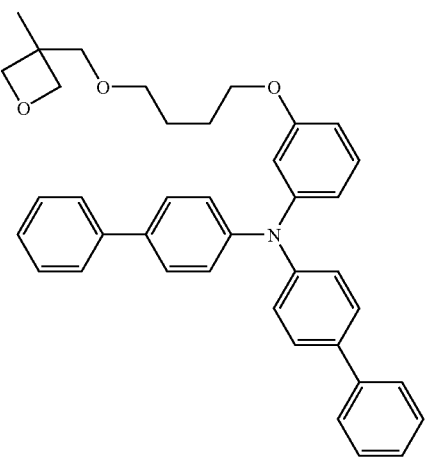
On the other hand, examples of the polymerizable compounds having a repetitive unit, among the above particularly preferable polymerizable compounds, include the compounds with the following structures.

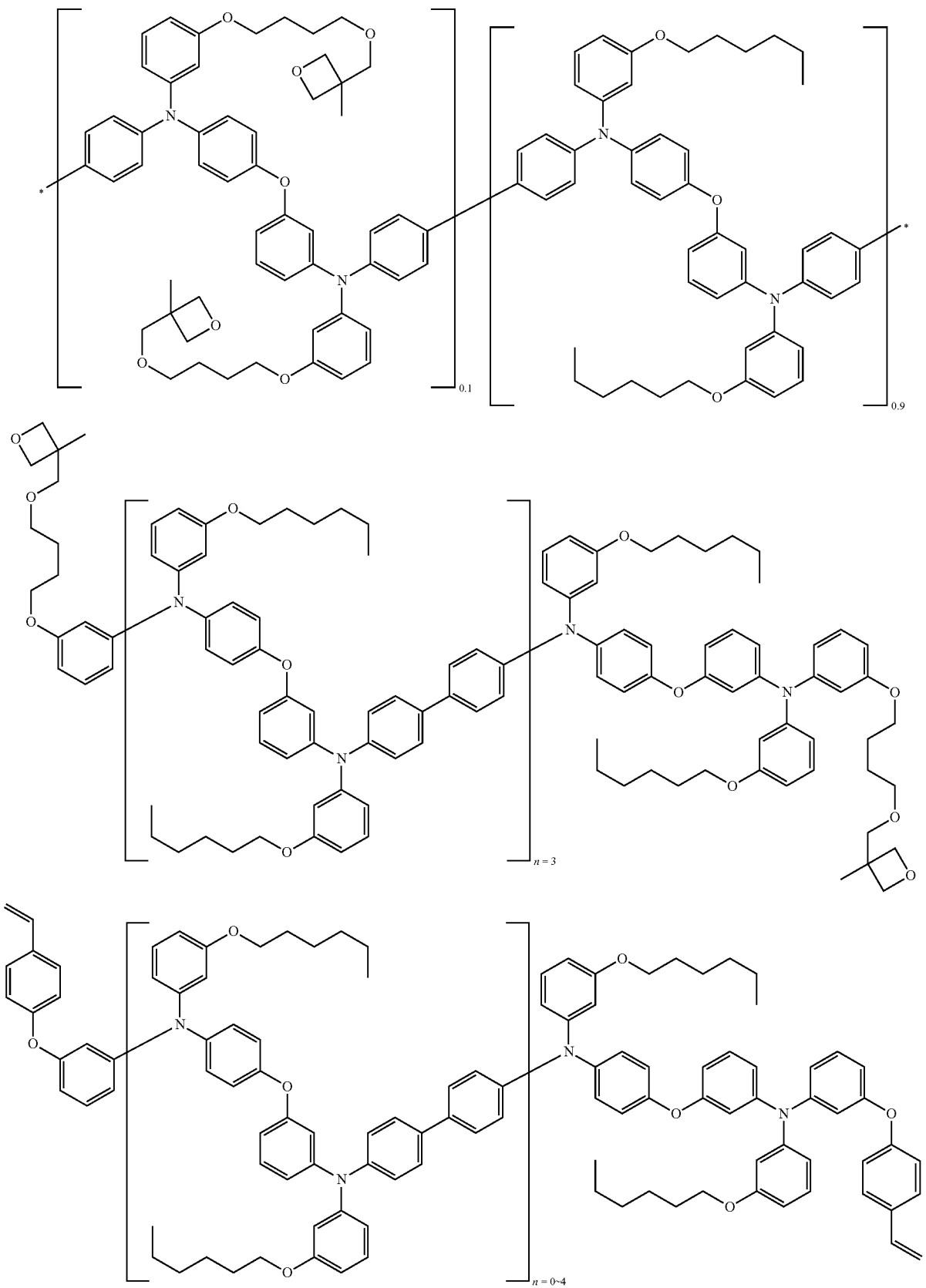

17
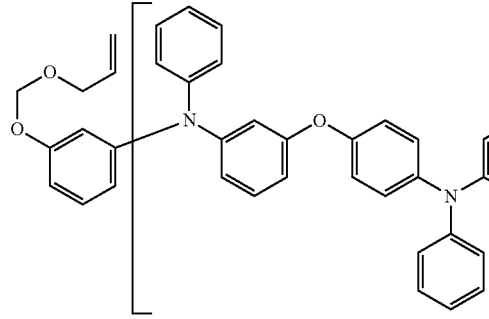
-continued
18
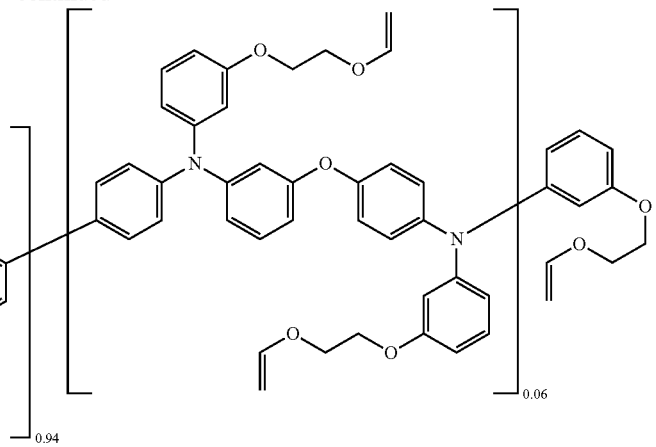
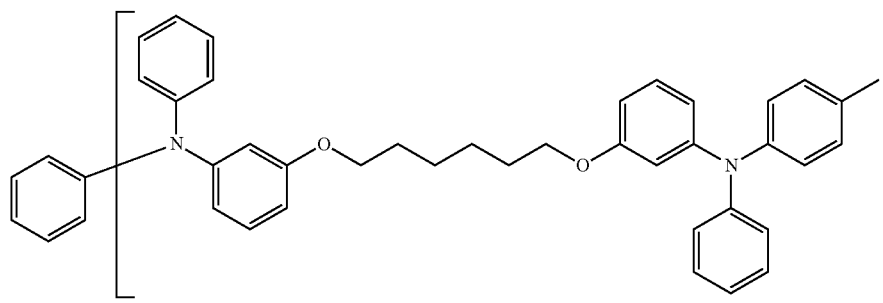
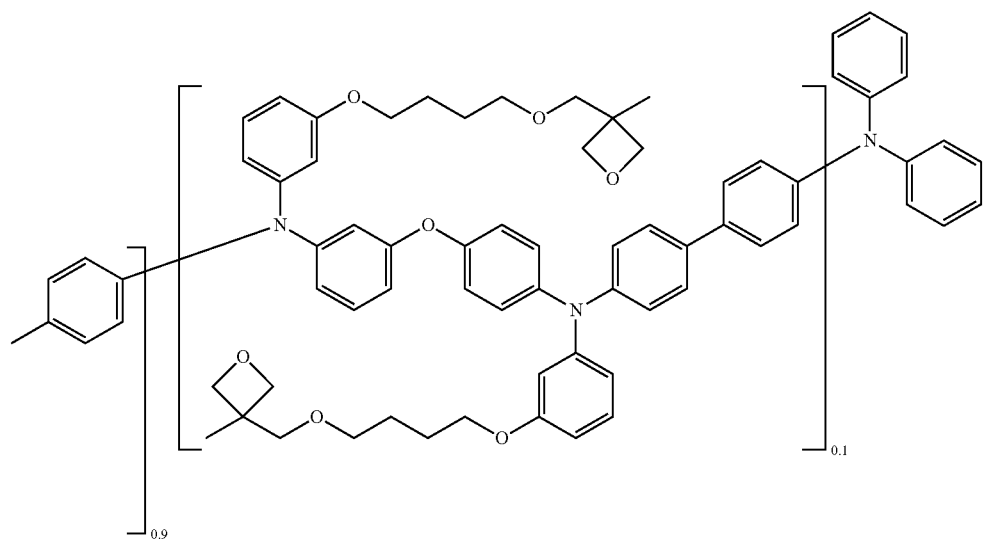

-continued
[Chemical Formula 7]
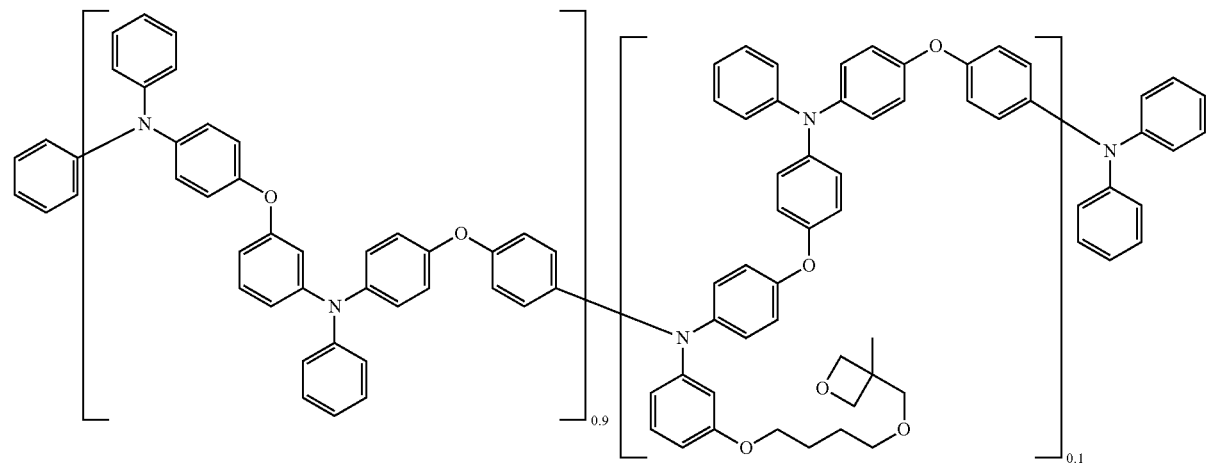
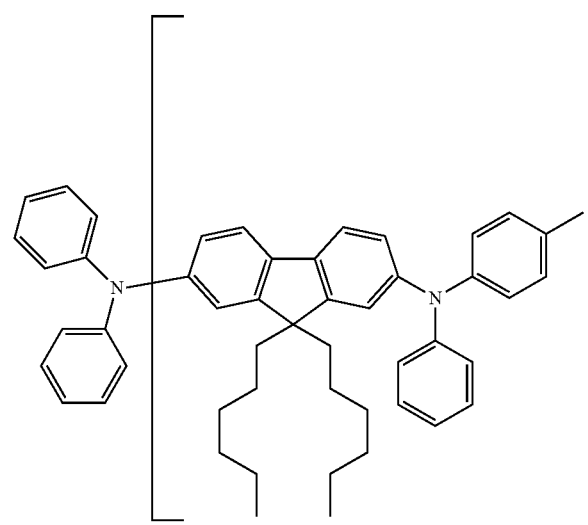

-continued
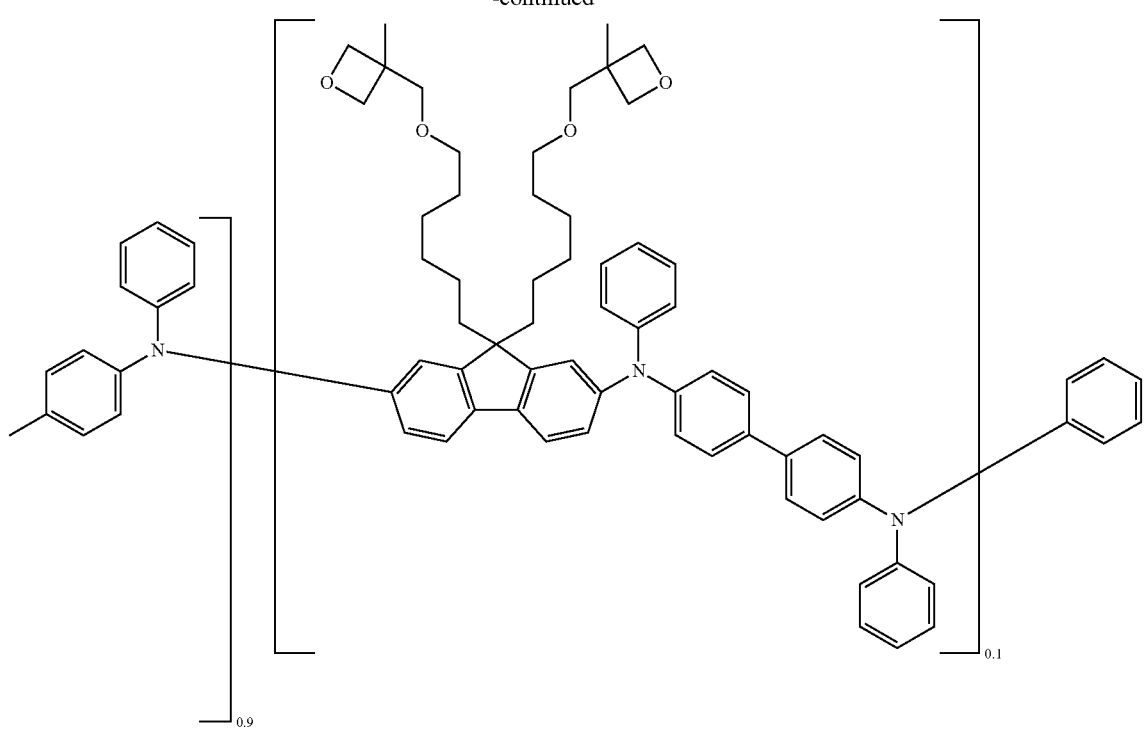
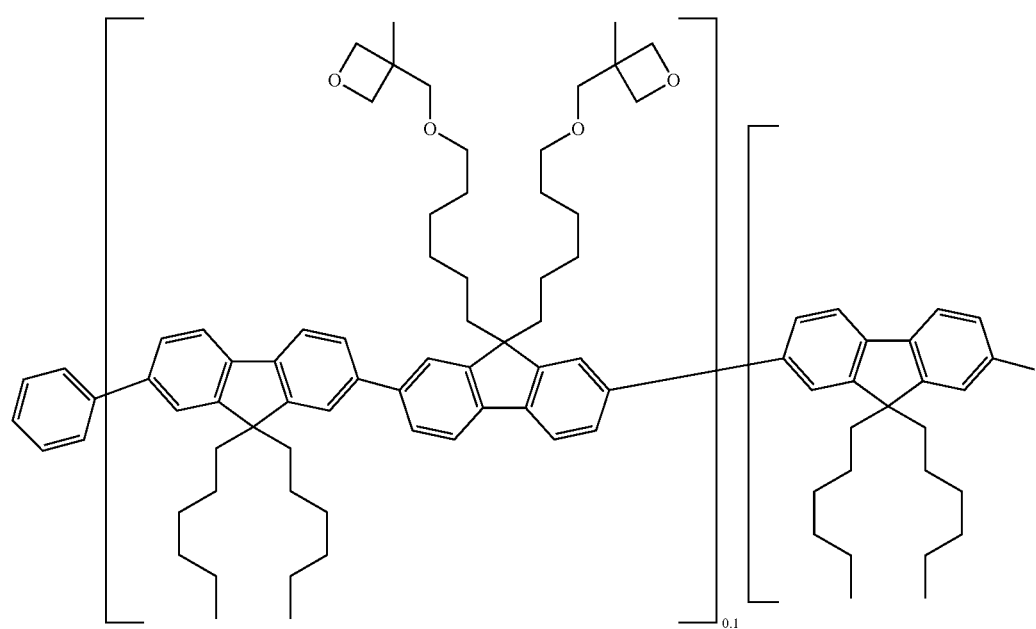

-continued

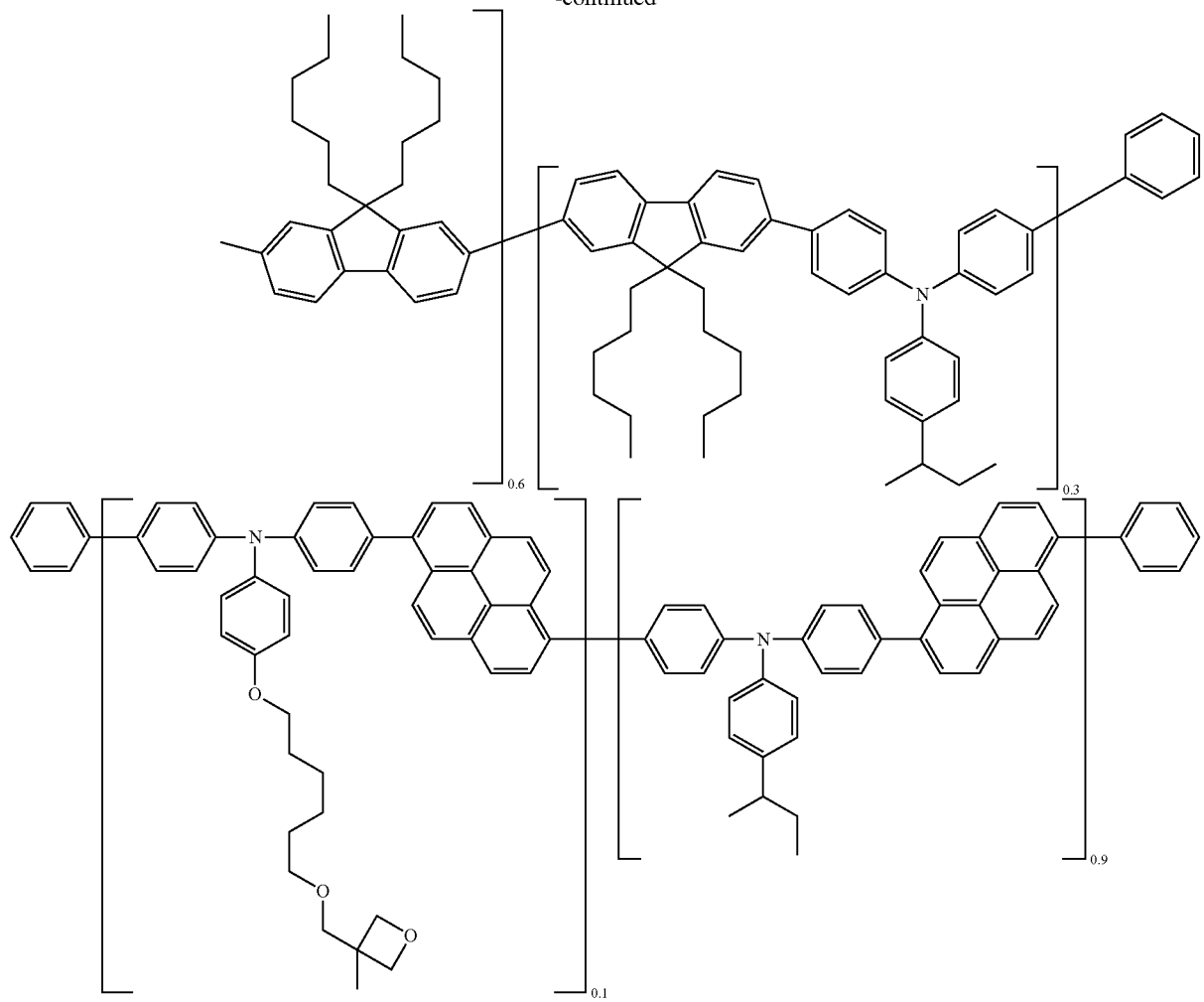

The polymerizable compound can be used either as a single kind thereof or as a mixture of two or more kinds in any combination and in any ratio.

When the polymerizable compound according to the present invention has no repetitive unit, the weight-average molecular weight of the polymerizable compound is in the range of usually 300 or higher, preferably 500 or higher, and usually 5000 or lower, preferably 2500 or lower. When the weight-average molecular weight of the polymerizable compound having no repetitive unit is too low, the charge-transport capability may decrease. When it is too high, the solubility may decrease.

On the other hand, when the polymerizable compound according to the present invention has a repetitive unit, the weight-average molecular weight of the polymerizable compound is in the range of usually 500 or higher, preferably 2000 or higher, more preferably 4000 or higher, and usually 2,000,000 or lower, preferably 500,000 or lower, more preferably 200,000 or lower. When the weight-average molecular weight of the polymerizable compound having a repetitive unit falls below the lower limit, the film-formation capability of the polymerizable compound may decrease. In addition, because the glass transition point, melting point and vaporization temperature of the polymerizable compound are lowered, the heat resistance may be extremely deteriorated. When the weight-average molecular weight exceeds the upper limit, the refinement of the polymerizable compound may be difficult because of heightened molecular weight of the impurities.

Incidentally, the weight-average molecular weight is decided by means of SEC (size exclusion chromatography). In an SEC measurement, a component of higher molecular weight is eluted more quickly, and a component of lower molecular weight is eluted more slowly. The weight-average molecular weight and the number-average molecular weight are calculated by converting the elution time of the sample to a molecular weight using a calibration curve calculated from the elution time of a polystyrene having known molecular weight (standard sample).

[I-2. Polymerization Initiator]

In the present invention, a "polymerization initiator" means an active species that is degraded by heat or an activating energy line such as light so as to prompt the initiation of polymerization of the polymerizable compound. Examples of the polymerization initiator include: compounds that form cation, radical, anion or the like; and compounds that transmit excitation energy generated by irradiation of an activating energy line such as light to the polymerizable compound efficiently.

Concrete examples of the polymerization initiator include: organic peroxide, phenylalkylketone, organic onium salt. Of these, organic onium salt is preferable.

Concrete examples of the organic peroxides include: acetyl peroxide, benzoyl peroxide, lauroyl peroxide, t-dibutyl peroxide.

Concrete examples of the phenylalkylketone include: IRGACURE 651, IRGACURE 184 and DAROCUR 1173, which are manufactured by Ciba Specialty Chemicals Inc.

Concrete examples of the organic onium salt include: organic iodonium salt and organic sulfonium salt. Of these, organic onium salts represented by the following formulae (I-1) to (I-3) are particularly preferable, because they provide both strong oxidative power and high solubility.

[Chemical Formula 8]

(I-1)

[Chemical Formula 9]

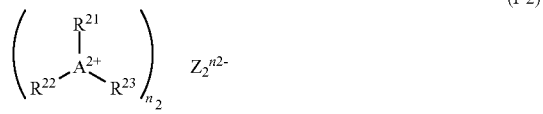
(I-2)

[Chemical Formula 10]

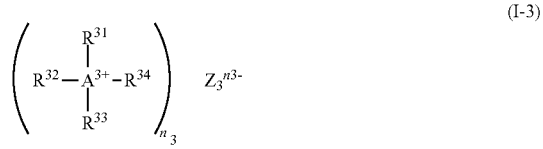
(I-3)

$R^{11}$, $R^{21}$ and $R^{31}$ in the above formulae (I-1) to (I-3) represent, independently of each other, an organic group bound to $A^1$ to $A^3$, respectively, via a carbon atom. $R^{12}$, $R^{22}$, $R^{23}$ and $R^{32}$ to $R^{34}$ represent, independently of each other, an arbitrary group. Two or more neighboring groups of $R^{11}$ to $R^{34}$ may combine together to form a ring.

$A^1$ to $A^3$ each represent an element belonging to the third and subsequent periods in the periodic table. $A^1$ represents an element belonging to group 17 of the long form periodic table. $A^2$ represents an element belonging to group 16 of the long form periodic table. $A^3$ represents an element belonging to group 15 of the long form periodic table.

$Z_1^{n1-}$ to $Z_3^{n3-}$ represent, independently of each other, a counter anion.

Then n1 to n3 represent, independently of each other, an ionic valency of the counter anion.

Within the scope of the present invention, there is no special limitation on the kind of $R^{11}$, $R^{21}$ and $R^{31}$, on condition that they possess a carbon atom to bind them to $A^1$ to $A^3$. The molecular weights of $R^{11}$, $R^{21}$ and $R^{31}$, including their substituents, are each in the range of usually 1000 or lower, preferably 500 or lower. Preferable examples of $R^{11}$, $R^{21}$ and $R^{31}$ include an alkyl group, alkenyl group, alkinyl group, aromatic hydrocarbon group and aromatic heterocyclic group, from the standpoint of delocalization of positive charge. Particularly preferable is an aromatic hydrocarbon group or an aromatic heterocyclic group from the standpoint of delocalization of positive charge and heat stability.

The aromatic hydrocarbon group includes a univalent group derived from a 5- or 6-membered monocyclic ring or from a compound having 2 to 5 condensed rings, capable of delocalizing positive charge on the group. Examples include univalent groups derived from benzene, naphthalene, anthracene, phenanthrene, perylene, tetracene, pyrene, benzpyrene, chrysene, triphenylene, acenaphthene and fluorene.

The aromatic heterocyclic group includes a univalent group derived from a 5- or 6-membered monocyclic ring or from a compound having 2 to 4 condensed rings, capable of delocalizing positive charge on the group. Concrete examples of the ring structure include univalent groups derived from furan, benzofuran, thiophen, benzothiophen, pyrrole, pyrazole, triazole, imidazole, oxadiazole, indole, carbazole, pyrroloimidazole, pyrrolopyrazole, pyrrolopyrrole, thienopyrrole, thienothiophen, furopyrrole, furofuran, thienofuran, benzoisoxazole, benzoisothiazole, benzimidazole, pyridine, pyrazine, pyridazine, pyrimidine, triazine, quinoline, isoquinoline, cinnnoline, quinoxaline, phenanthridine, perimidine, quinazoline, quinazolinon and azulene.

Alkyl group includes a straight-chain, branched-chain or cyclic alkyl group whose carbon number is usually one or more, and usually 12 or less, preferably 6 or less. Examples include methyl group, ethyl group, n-propyl group, 2-propyl group, n-butyl group, isobutyl group, tert-butyl group and cyclohexyl group.

Alkenyl group includes a group whose carbon number is usually 2 or more, and usually 12 or less, preferably 6 or less. Examples include vinyl group, allyl group and 1-butenyl group.

Alkinyl group includes a group whose carbon number is usually 2 or more, and usually 12 or less, preferably 6 or less. Examples include ethynyl group and propargyl group.

There is no special limitation on the kind of $R^{12}$, $R^{22}$, $R^{23}$ and $R^{32}$ to $R^{34}$ insofar as it does not depart from the scope of the present invention. The molecular weights of $R^{12}$, $R^{22}$, $R^{23}$ and $R^{32}$ to $R^{34}$, including their substituents, are each usually in the range of 1000 or lower and preferably 500 or lower. Examples of $R^{12}$, $R^{22}$, $R^{23}$ and $R^{32}$ to $R^{34}$ include: alkyl, alkenyl, alkinyl, aromatic hydrocarbon, aromatic heterocyclic, amino, alkoxy, aryloxy, acyl, alkoxycarbonyl, aryloxycarbonyl, alkylcarbonyloxy, alkylthio, arylthio, sulfonyl, alkylsulfonyl, arylsulfonyl, cyano, hydroxyl, thiol and silyl groups. Of these, organic groups having a carbon atom which binds them to $A^1$ to $A^3$ is preferable because of their strong electron-accepting property similarly to the case of $R^{11}$, $R^{21}$ and $R^{31}$. Preferable examples of them include alkyl group, alkenyl group, alkynyl group, aromatic hydrocarbon group and aromatic heterocyclic group. Particularly preferable is an aromatic hydrocarbon group or aromatic heterocyclic group because of their heat stability in addition to its strong electron-accepting property.

As alkyl group, alkenyl group, alkinyl group, aromatic hydrocarbon group and aromatic heterocyclic group include the same groups as described previously for $R^{11}$, $R^{21}$ and $R^{31}$.

Examples of the amino group include alkylamino group, arylamino group and acylamino group.

Alkylamino group includes an alkylamino group having one or more alkyl groups whose carbon number is usually one or more, usually 12 or less and preferably 6 or less. Examples include methylamino, dimethylamino, diethylamino and dibenzylamino groups.

Arylamino group includes an arylamino group having one or more aromatic hydrocarbon groups or aromatic heterocyclic groups whose carbon number is usually 3 or more, preferably 4 or more and usually 25 or less, preferably 15 or less. Examples include phenylamino, diphenylamino, tolylamino, pyridylamino and thienylamino groups.

Acylamino group includes an acylamino group having one or more acyl groups whose carbon number is usually 2 or more and usually 25 or less, preferably 15 or less. Examples include acetylamino and benzoylamino groups.

Alkoxy group includes an alkoxy group whose carbon number is usually one or more and usually 12 or less, preferably 6 or less. Examples include methoxy, ethoxy, and butoxy groups.

Aryloxy group includes an aryloxy group having an aromatic hydrocarbon group or aromatic heterocyclic group whose carbon number is usually 3 or more, preferably 4 or more and usually 25 or less, preferably 15 or less. Examples include phenyloxy, naphthyloxy, pyridyloxy, and thienyloxy groups.

Acyl group includes an acyl group whose carbon number is usually one or more, and usually 25 or less, preferably 15 or less. Examples include formyl, acetyl, and benzoyl groups.

Alkoxycarbonyl group includes an alkoxycarbonyl group whose carbon number is usually 2 or more, and usually 10 or less, preferably 7 or less. Examples include methoxycarbonyl and ethoxycarbonyl groups.

Aryloxycarbonyl group includes an aryloxycarbonyl group having an aromatic hydrocarbon group or aromatic heterocyclic group whose carbon number is usually 3 or more, preferably 4 or more, and usually 25 or less, preferably 15 or less. Examples include phenoxycarbonyl and pyridyloxycarbonyl groups.

Alkylcarbonyloxy group includes an alkylcarbonyloxy group whose carbon number is usually 2 or more, and usually 10 or less, preferably 7 or less. Examples include acetoxy and trifluoroacetoxy groups.

Alkylthio group includes an alkylthio group whose carbon number is usually one or more, and usually 12 or less, preferably 6 or less. Examples include methylthio and ethylthio groups.

Arylthio group includes an arylthio group whose carbon number is usually 3 or more, preferably 4 or more, and usually 25 or less, preferably 14 or less. Examples include phenylthio, naphthylthio, and pyridylthio groups.

Examples of alkylsulfonyl and arylsulfonyl groups include mesyl and tosyl groups.

Examples of sulfonyloxy group include mesyloxy and tosyloxy groups.

Examples of silyl group include trimethylsilyl and triphenylsilyl groups.

Groups exemplified above as $R^{11}$, $R^{21}$, $R^{31}$ and $R^{12}$, $R^{22}$, $R^{23}$, $R^{32}$ to $R^{34}$ may have additional substituents on them unless they depart from the scope of the present invention. There is no special limitation on the kind of the substituent. Examples include halogen atom, cyano group, thiocyano group and nitro group, in addition to those exemplified above for $R^{11}$, $R^{21}$, $R^{31}$ and $R^{12}$, $R^{22}$, $R^{32}$ to $R^{34}$. Preferable groups include alkyl group, alkenyl group, alkynyl group, alkoxy group, aryloxy group, aromatic hydrocarbon group and aromatic heterocyclic group because they do not hinder the heat stability and electron-accepting property.

In the formulae (I-1) to (I-3), $A^1$ to $A^3$ all represent an element belonging to the third and subsequent periods in the periodic table (3rd to 6th period). $A^1$ represents an element belonging to group 17 of the long form periodic table. $A^2$ represents an element belonging to group 16 of the long form periodic table. $A^3$ represents an element belonging to group 15 of the long form periodic table.

Of these, preferable is an element belonging to the fifth period or its preceding period of the periodic table (3rd to 5th period) from the standpoint of electron-accepting property and ease of availability. Namely, the preferable element for $A^1$ is one of iodine atom, bromine atom and chlorine atom. The preferable element for $A^2$ is one of tellurium atom, selenium atom and sulfur atom. The preferable element for $A^3$ is one of antimony atom, arsenic atom and phosphorus atom.

From the standpoint of electron-accepting property and chemical stability, particularly preferable is a compound in which $A^1$ in the formula (I-1) is bromine atom or iodine atom, and $A^2$ in the formula (I-2) is selenium atom or sulfur atom. Most preferable is a compound in which $A^1$ in the formula (I-1) is iodine atom.

In the formulae (I-1) to (I-3), $Z_1^{n1-}$ to $Z_3^{n3-}$ represent, independently of each other, a counter anion. There is no special limitation on the kind of the counter anion. It may be a single atom ion or a complex ion. However, a complex ion is more preferable than a single atom ion, because, as the size of a counter ion increases, negative charge is more delocalized and positive charge is delocalized accordingly, leading to greater electron-accepting property.

Also, n1 to n3 represent, independently of each other, a positive integer corresponding to the ionic valency of a counter anion $Z_1^{n1-}$ to $Z_3^{n3-}$. There is no special limitation on the value of n1 to n3. However, the value of 1 or 2 is preferable for all of them and the value of 1 is particularly preferable.

Examples of $Z_1^{n1-}$ to $Z_3^{n3-}$ include hydroxide ion, fluoride ion, chloride ion, bromide ion, iodide ion, cyanide ion, nitrate ion, nitrite ion, sulfate ion, sulfite ion, perchlorate ion, perbromate ion, periodate ion, chlorate ion, chlorite ion, hypochlorite ion, phosphate ion, phosphite ion, hypophosphite ion, borate ion, isocyanate ion, hydrosulfide ion, tetrafluoroborate ion, hexafluorophosphate ion, hexachloroantimonate ion; carboxylate ion such as acetate ion, trifluoroacetate ion and benzoate ion; sulfonate ion such as methane sulfonate ion and trifluoromethane sulfonate ion; and alkoxy ion such as methoxy ion and t-butoxy ion.

As counter anions $Z_1^{n1-}$ to $Z_3^{n3-}$, a complex ion, expressed by the formulae (I-4) to (I-6) below, is preferable, from the standpoint of chemical stability and solubility in solvents. A complex ion expressed by the formula (I-6) below is particularly preferable because it is large in size and, therefore, negative charge, and subsequently positive charge also, is delocalized, leading to large electron-accepting capacity.

[Chemical Formula 11]

(I-4)

[Chemical Formula 12]

(I-5)

[Chemical Formula 13]

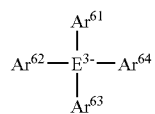
(I-6)

$E^1$ and $E^3$ in the formula (I-4) and (I-6) represent, independently of each other, an element belonging to group 13 of the long form periodic table. Of those elements, boron atom, aluminium atom and gallium atom are preferable. Particularly preferable is a boron atom from the standpoint of chemical stability and ease of synthesis and purification.

$E^2$ in the formula (I-5) represents an element belonging to group 15 of the long form periodic table. Of those elements, phosphorus atom, arsenic atom and antimony atom are preferable. Particularly preferable is a phosphorus atom from the standpoint of chemical stability, ease of synthesis and purification, and toxicity.

In the formulae (I-4) and (I-5), X represents a halogen atom such as fluorine atom, chlorine atom and bromine atom. Fluorine atom and chlorine atom are preferable from the standpoint of chemical stability and ease of synthesis and purification. Most preferable is fluorine atom.

$Ar^{61}$ to $Ar^{64}$ in the general formula (I-6) represent, independently of each other, an aromatic hydrocarbon group or an aromatic heterocyclic group. Examples of an aromatic hydrocarbon group and aromatic heterocyclic group include the same univalent groups derived from a 5- or 6-membered monocyclic ring or from a compound having 2 to 4 condensed rings as cited previously for $R^{11}$, $R^{21}$, and $R^{31}$. Preferable among them, from the standpoint of chemical stability and heat resistance, is a univalent group derived from a ring structure of benzene, naphthalene, pyridine, pyrazine, pyridazine, pyrimidine, triazine, quinoline, or isoquinoline.

Aromatic hydrocarbon groups and aromatic heterocyclic groups, exemplified as $Ar^{61}$ to $Ar^{64}$, may carry an additional substituent unless they depart from the scope of the present invention. There is no special limitation on the kind of the substituent and any substituent is possible. However, it is preferably an electron-accepting group.

Examples of the electron-accepting group preferable as substituent of $Ar^{61}$ to $Ar^{64}$ include: halogen atom such as fluorine atom, chlorine atom and bromine atom; cyano group; thiocyano group; nitro group; alkylsulfonyl group such as mesyl group; arylsulfonyl group such as tosyl group; acyl group whose carbon number is usually one or more and usually 12 or less, preferably 6 or less such as formyl group, acetyl group and benzoyl group; alkoxycarbonyl group whose carbon number is usually 2 or more and usually 10 or less, preferably 7 or less carbon atoms such as methoxycarbonyl group and ethoxycarbonyl group; aryloxycarbonyl group containing aromatic hydrocarbon group or aromatic heterocyclic group whose carbon number is usually 3 or more, preferably 4 or more and usually 25 or less, preferably 15 or less, such as phenoxycarbonyl group and pyridyloxycarbonyl group; aminocarbonyl group; aminosulfonyl group; haloalkyl group with straight-chain, branched-chain or cyclic alkyl group containing usually one or more, and usually 10 or less, preferably 6 or less carbon atoms and having a halogen substituent like fluorine or chlorine atom, such as trifluoromethyl group and pentafluoroethyl group.

Among them, it is preferable that at least one group of $Ar^{61}$ to $Ar^{64}$ has one or more fluorine or chlorine atoms as substituent. It is particularly preferable that all the hydrogen atoms of $Ar^{61}$ to $Ar^{64}$ are replaced with fluorine atoms giving a perfluoroaryl group, from the standpoint of efficient delocalization of negative charge and suitable sublimation property. Examples of perfluoroaryl group include pentafluorophenyl group, heptafluoro-2-naphthyl group and tetrafluoro-4-pyridyl group.

The molecular weight of the complex ion represented by the formulae (I-4) to (I-6) is usually 100 or larger, preferably 300 or larger, and more preferably 400 or larger. It is usually 5000 or smaller, preferably 3000 or smaller, and more preferably 2000 or smaller. If the molecular weight of the compound is too small, delocalization of negative and positive charge may be insufficient, leading possibly to lower electron-accepting capacity. If the molecular weight of the compound is too large, the compound itself may hinder charge transport.

Examples of the complex ion represented by the formulae (I-4) to (I-6) will be cited below. However, the present invention is not limited to the examples.

[Chemical Formula 14]

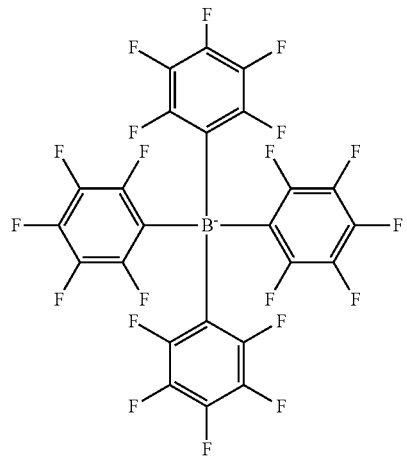

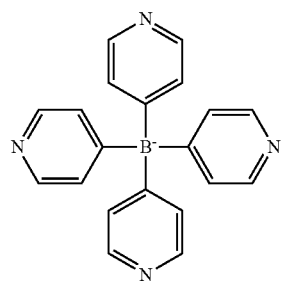

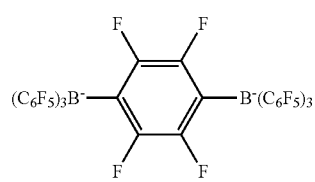

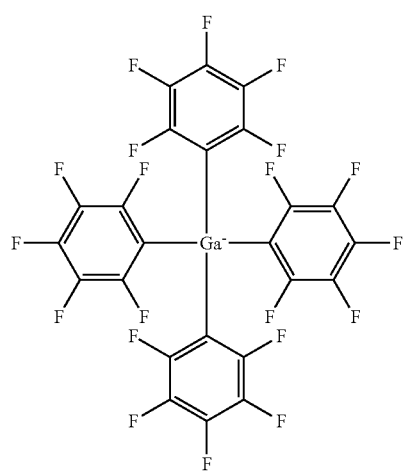

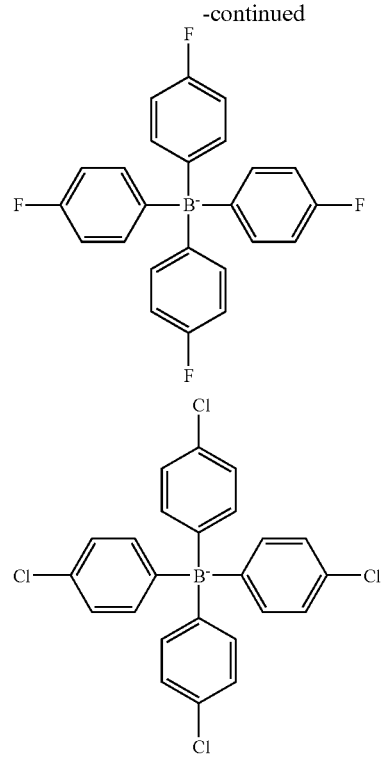
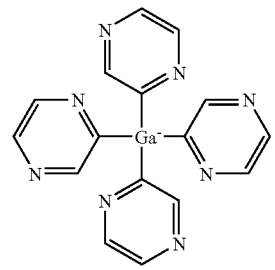
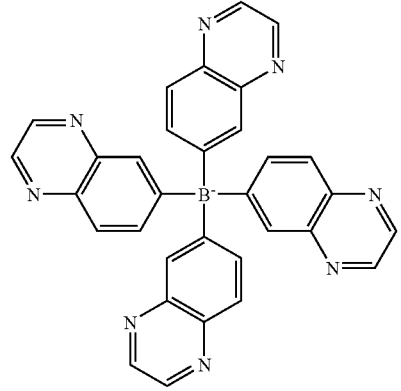
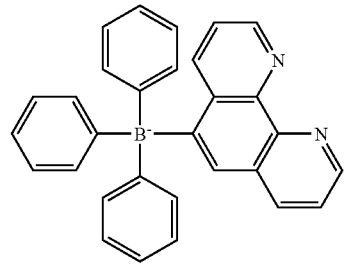
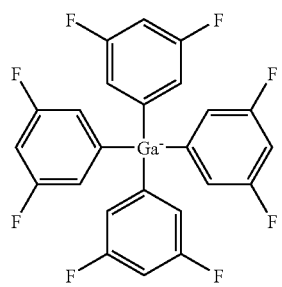
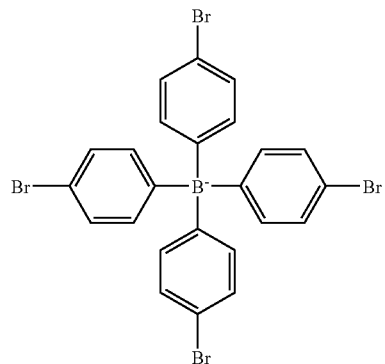
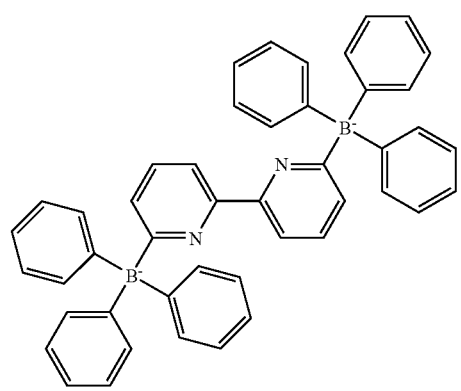

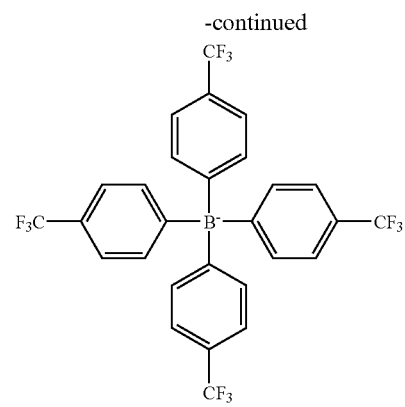
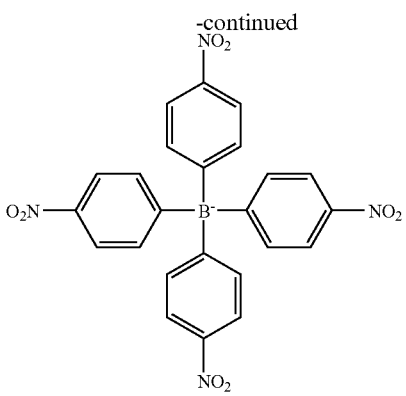
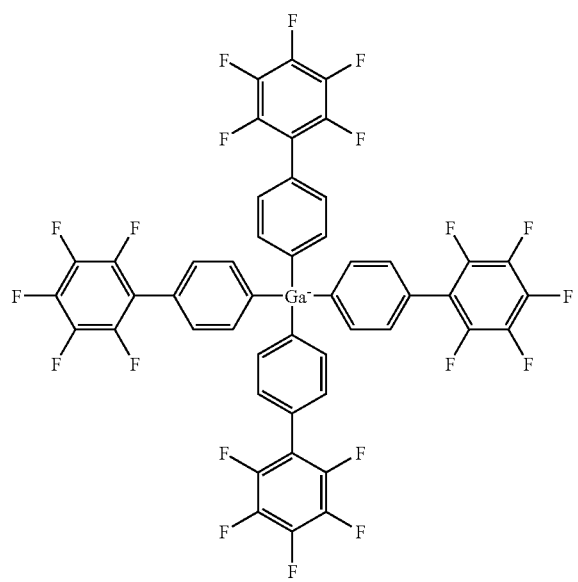
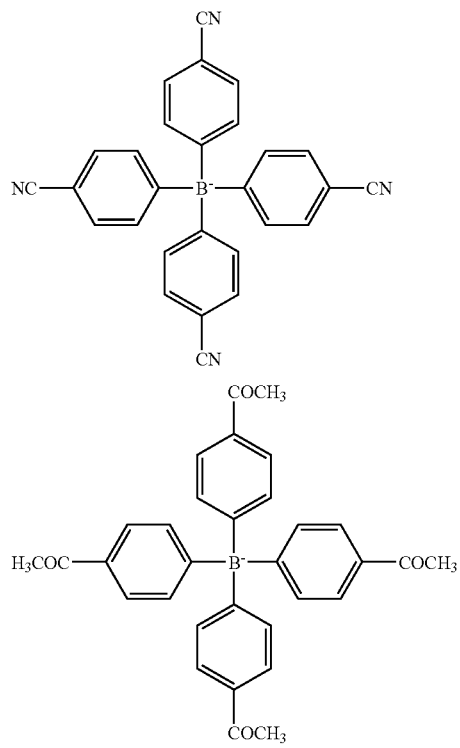

The polymerization initiator can be used either as a single kind thereof or as a mixture of two or more kinds in any combination and in any ratio.

The molecular weight of the polymerization initiator is usually 100 or larger, preferably 200 or larger, and usually 10000 or smaller, preferably 3000 or smaller. If the molecular weight of the polymerization initiator is too small, the volatility at the time of coated film formation may be too high. If it is too large, the solubility in solvents may decrease.

[I-3. Organic Layer]

In the present invention, an "organic layer" means a layer that contains an organic compound.

In the organic electroluminescence device of the present invention, an organic layer means each of the layers disposed between the anode and the cathode.

As examples of the organic layer of the organic electroluminescence device of the present invention include a hole-injection layer, hole-transport layer, emitting layer, hole-inhibition layer, electron-transport layer, electron-injection layer and so on.

There is no limitation on which layers, of these organic layers, are the layer formed by polymerizing a polymerizable compound (the first layer, which corresponds to the polymerized layer) and the layer comprising a polymerization initiator (the second layer), and any of adjacent two layers may be these first and second layers.

By forming respective two adjacent layers of these organic layers into the first layer and the second layer, an organic electroluminescence device that can suppress rise in the driving voltage at the time of constant-current energization and degradation in brightness at the time of energization and thus excels in its driving lifetime can be provided.

It is preferable for the first layer not to contain a polymerization initiator. This is because the above-mentioned advantageous effects of the present invention can be realized more stably then. In this regard, it should be understood that, when the composition used for forming the first layer does not contain a polymerization initiator, the first layer does not contain a polymerization initiator either (see the description on the film formation process of the composition for a hole-transport layer to be described later).

It is preferable for the second layer to be located as far from the emitting layer as possible, for the sake of less influence of the polymerization initiator on the emitting layer, which can achieve various remarkable effects such as the above-mentioned inhibition of rise in the driving voltage at the time of constant-current energization and degradation in brightness at the time of energization, and prolonged driving lifetime of the device.

Figure 2:
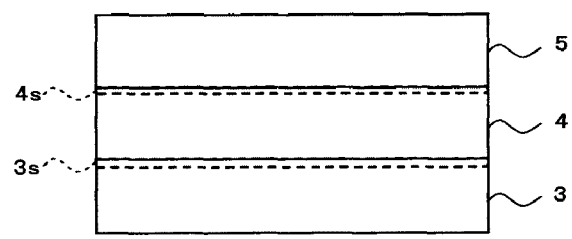
FIG. 2 is a schematic cross-sectional view partially illustrating the layered structure of the organic electroluminescence device for describing a preferable aspect of the present invention.

More specifically, it is preferable that, as shown in FIG. 2 schematically, the second layer 3 is located on the opposite side of the first layer 4 from the emitting layer 5, namely, the emitting layer 5, the first layer 4 and the second layer 3 are arranged in the listed order. In this case, the emitting layer 5 and the first layer 4 may either be adjacent to each other or have any one or more layers (not shown in the figure) in between.

It is particularly preferable that the first layer 4 is a hole-transport layer and the second layer 3 is a hole-injection layer.

When the second layer 3 is a layer (hereinafter referred to as "adjacent layer" as appropriate) that neighbors the first layer (polymerized layer) 4 at the opposite side to the emitting layer 5, as is the case with above, the ratio of QB/QA, which will be defined later, is preferably smaller than 0.5, and more preferably 0.2 or smaller. This is because, when the above upper limit is exceeded, the polymerization initiator that transmits from the second layer 3 into the first layer 4 by the polymerization reaction that proceeds when forming the first layer 4 or by the bake performed at the time of film formation of the first layer may affect the characteristics of the organic electroluminescence device considerably to an unignorable extent. The lower limit of the above-mentioned ratio QB/QA is ideally 0.

In this context, QA is defined as the ratio (%) of the number of molecules of the polymerization initiator contained in the surface part 3s of the second layer 3 at the side of the first layer, measured by means of XPS method, to the number of molecules of the component other than the polymerization initiator, contained in the surface part 3s of the second layer 3 at the side of the first layer, measured by means of XPS method. In addition, QB is defined as the ratio (%) of the number of molecules of the polymerization initiator contained in the surface part 4s of the first layer 4 at the side of the emitting layer, measured by means of XPS method, to the number of molecules of the component other than the polymerization initiator, contained in the surface part 4s of the first layer 4 at the side of the emitting layer, measured by means of XPS method. Therefore, the above-mentioned ratio QB/QA is defined as the proportion of the above-mentioned ratio QB relative to the above-mentioned ratio QA.

The above-mentioned QA and QB can be measured by the following method.

[Method for Measuring QA and QB]

Preparation of Samples

The sample used for measuring QA is prepared as follows. A film of a material from which the adjacent layer of the organic electroluminescence device to be measured is formed (it is usually a composition, which is also referred to as a "coating liquid" in a wet coating method) is formed in the same way as the production method of an organic electroluminescence device (for example, it is formed on an ITO substrate measuring 25 mm×37.5 mm in 30-nm thickness). The obtained layer is used as the sample for measuring QA.

The sample used for measuring QB is prepared as follows. A film of a material from which the polymerized layer of the organic electroluminescence device to be measured is formed (it is usually a composition, which is also referred to as a "coating liquid" in a wet coating method) is formed in the same way as the production method of an organic electroluminescence device (for example, in 20-nm thickness). The obtained layer is used as the sample for measuring QB.

Measurement by XPS Method

The XPS measurement can be performed for example with a scanning X-ray photoelectron spectrometer, QUANTUM2000, manufactured by ULVAC-PHI, INCORPORATED. As X-ray source for the measurement, Al—K$\alpha$ line that was passed through a monochromator (energy: 1486.6 eV) can be used. In QUANTUM2000, as the direction of the detector with respect to the incident direction of the X line is 45°, the takeoff angle of the photoelectrons from the sample surface comes to be 45°. In order to set the sample on the sample holder of the XPS measurement equipment, the central part of the sample substrate was cut out in about 10 mm square. When the sample is set on the sample holder, a molybdenum mask with a hole of 1~2 mm $\phi$ is used to hold it, for the sake of reducing electrification. The measurement is performed for the central part of the above-mentioned hole of 300 µm square.

The analysis can be performed with an analyzer, multipak ver. 8.0, manufactured by ULVAC-PHI, INCORPORATED. By dividing the peak area of each element's most intensive peak by the sensitivity correction coefficient, the quantity that is proportional to the number of atom of each element is decided. Using these quantities, QA and QB can be calculated. QA and QB represent (the number of molecules of the polymerization initiator contained in the surface part of each layer)/(the number of molecules of the component other than the polymerization initiator contained in the surface part of each layer). QA and QB can be calculated from the peak areas originating from two or more kinds of atoms, which are measured by XPS method for the surface of each layer, according to the same procedure as the example to be described later. As atoms to be used for calculating QA and QB by an ordinary method, one should be selected at least from the atoms contained in the polymerization initiator, and another should be selected at least from the atoms contained in the component other than the polymerization initiator (namely, base material). At this point, when the component other than the polymerization initiator (base material) comprises a repetitive unit, the molecular weight of the repetitive unit (when two or more kinds of repetitive units are contained, their mean molecular weight) is used as the molecular weight of the base material for the calculation. This is because the numerical value corresponding to the number of molecules of the component other than the polymerization initiator contained in the surface part of each layer associated with the number of polymerizable groups of the component other than the polymerization initiator contained in the surface part of each layer can be expressed then.

The ratio Q between the numbers of atoms of carbon and fluorine can be calculated as follows:

$$Q=(IC/SC)/(IF/SF)$$

where IC and IF are the intensities of the most intensive photoelectron peaks of carbon and fluorine, respectively, and SC and SF are the respective sensitivity coefficients. Then the ratio between the numbers of molecules of the polymerization initiator and the base material that are contained in the surface of each corresponding layer can be decided from the above calculated ratio of the numbers of atoms and the molecular structures of the polymerization initiator and the base material.

Specific Example of Measurement

In the following, an example of measurement of a polymerization initiator by means of XPS method will be described, taking a film that is formed from the following compounds CBP and F4TCNQ for instance. If the ratio of the peak intensities of carbon atom and fluorine atom, measured by XPS method in the way described earlier, is such that C:F=12:1, the ratio between the compounds CBP and F4TCNQ that are present at the surface of the film comes to be 1:1. The abundance ratio of the compound F4TCNQ in this case is defined as 100%. When the ratio of C:F is 21:1, the ratio of (compound F4TCNQ:compound CBP) comes to be 1:2, and the abundance ratio of the compound F4TCNQ comes to be 50% then.

[Chemical Formula 15]

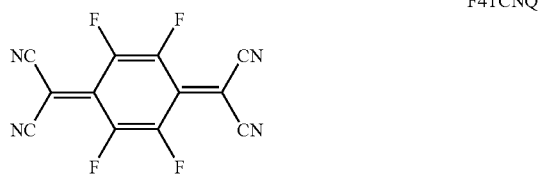

F4TCNQ

Chemical Formula: $C_{12}F_4N_4$
Molecular Weight: 276.15

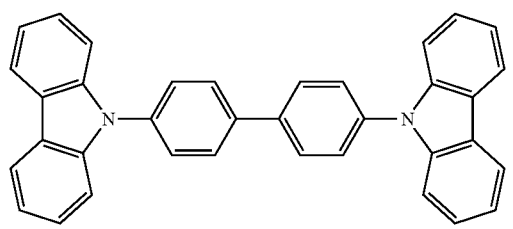

CBP

Chemical Formula: $C_{36}H_{24}N_2$
Molecular Weight: 484.59

The first layer may contain other component than the component originating from the polymerizable compound (which indicates a compound formed by polymerization of the polymerizable compound, for example a polymer formed by polymerization of the polymerizable compound). There is no limitation on the kind of the other component, and it may be usually selected appropriately according to the function of the first layer. The first layer may include the other component as a single kind thereof or two or more kinds of them in any combination and in any ratio.

When the first layer contains one or more of the other components in addition to the component originating from the polymerizable compound, the content of the other component in the first layer is, though it differs depending on the function of the first layer, generally in the range of usually 0.001 weight % or more, preferably 0.01 weight % or more, and usually 50 weight % or less, preferably 10 weight % or less. When the content of the other component is too small, the effect of the use of the other component may not be exerted. When it is too large, the function of the component originating from the polymerizable compound may be hindered.

The second layer may also contain other component than the polymerization initiator. There is no limitation on the kind of the other component, and it may be usually selected appropriately according to the function of the second layer. The second layer may include the other component as a single kind thereof or two or more kinds of them in any combination and in any ratio.

The content of the polymerization initiator in the second layer is, though it differs depending on the function of the second layer, generally in the range of usually 0.1 weight % or more, preferably 1 weight % or more, and usually 50 weight % or less, preferably 30 weight % or less. When the content of the polymerization initiator is too small, the polymerization reaction at the time of formation of the first layer may not proceed enough. When it is too large, the original function of the second layer may be hindered.

The detail of the components of the organic electroluminescence device of the present invention, including substrate, anode, cathode and respective organic layers (hole-injection layer, hole-transport layer, emitting layer, hole-inhibition layer, electron-transport layer, electron-injection layer and so on), will be described later.

[I-4. Reason for Advantageous Effect of the Present Invention]

The reason for the above-mentioned advantageous effect of the organic electroluminescence device of the present invention has not been clarified. However, the following facts can be inferred.

Regarding the above-mentioned conventional technique documents, in Patent Document 1, a secondary amine is used as curing agent for the epoxy resin, and in Non-Patent Document 1, an organic iodonium salt is used as polymerization initiator for the oxetane group. In the organic electroluminescence devices produced by the methods described in these documents, the curing agent or the polymerization initiator remains in the organic layer, especially in the emitting layer and/or the layer adjacent to the emitting layer. These remaining curing agent and polymerization initiator or products generated by decompositions of these curing agent and polymerization initiator at the time of energization react with a main component compound of the emitting layer, which probably leads to the quenching of the organic electroluminescence. In the result, the device comes to be low in brightness stability at the time of energization, namely, so-called, short in driving lifetime.

In contrast, in the organic electroluminescence device of the present invention, the polymerization initiator is contained not in the layer formed by means of polymerization of a polymerizable compound (namely, first layer) but in the layer adjacent to the first layer (namely, second layer). It is probable that such a construction can exert an effect similar to that in the case of containing the polymerization initiator in the layer formed by polymerizing a polymerizable compound. In the result, an organic electroluminescence device that can suppress rise in the driving voltage at the time of constant-current energization and degradation in brightness at the time of energization and thus excels in its driving lifetime can be provided.

Moreover, in the preferable construction of the organic electroluminescence device of the present invention, the polymerization initiator is contained not in the layer close to the emitting layer (namely, first layer, hole-transport layer) but in the layer apart from the emitting layer (namely, second layer, hole-injection layer). Therefore, it is probable that generation of an active species (for example, a radical species) or the like, which may affect the characteristic or lifetime of the organic electroluminescence device adversely through dissolution or material transfer of the polymerization initiator in or into the emitting layer, can be prevented. In the result, an organic electroluminescence device more remarkably exhibiting such effects as suppressing rise in the driving voltage at the time of constant-current energization, suppressing degradation in brightness at the time of energization and prolonging its driving lifetime can be provided.

[I-5. Organic Device]

The above-mentioned structure of the organic electroluminescence device of the present invention can also be applied to organic devices other than organic electroluminescence device.

In the present invention, an "organic device" means a structure that functions to convert the energy supplied from outside to another kind of energy and/or an effective work and of which portion performing its major function is formed from an organic substance.

Examples of such an organic device include organic electroluminescence device, organic transistor, organic solar battery, organic light-emitting transistor, organic magnetic device, organic diode, organic actuator (such as a motor), and organic sensor (such as pressure sensor, temperature sensor, and humidity sensor).

Hereinafter, an organic device to which the above-mentioned structure of the organic electroluminescence device of the present invention is applied, namely, an organic device comprising a plurality of organic layers, one of which is a layer formed by polymerizing a polymerizable compound (first layer) and another is a layer containing a polymerization initiator (second layer) and neighboring the first layer, will be referred to as an "organic device of the present invention".

The organic device of the present invention usually comprises, in addition to the above-mentioned plurality of organic layers, a substrate, an anode and a cathode overlying the substrate, in the same way as the above-mentioned organic electroluminescence device of the present invention. The plurality of organic layers thereof are disposed between the anode and the cathode.

[I-6. Production Method of Organic Device]

The production method of the organic device of the present invention is not particularly limited. However, it is preferably produced by a method comprising at least the following (1) to (3) steps (this method will be hereinafter referred to as the "production method of the present invention").

(1) Film formation step of the second layer using a composition containing the polymerization initiator (hereinafter referred to as "film formation step using a composition for hole-injection layer", as appropriate)
(2) Film formation step of a layer containing the polymerizable compound using a composition containing the polymerizable compound (hereinafter referred to as "film formation step using a composition for hole-transport layer", as appropriate)
(3) Film formation step of the first layer polymerizing the polymerizable compound (hereinafter referred to as "polymerization step", as appropriate)

There is no limitation on the detail of the above-mentioned steps (1) to (3) (for example, (1): specific composition of the composition containing the polymerization initiator or method of film formation, in the film formation step using a composition for hole-injection layer, (2): specific composition of the composition containing the polymerizable compound or method of film formation, in the film formation step using a composition for hole-transport layer, and (3): method of polymerization of the polymerizable compound in the polymerization step) of the production method of the present invention.

The production method of the present invention may include one or more of additional steps, in addition to the above-mentioned steps (1) to (3). The timing of performing the additional steps is arbitrary.

The detail of the above-mentioned steps (1) to (3) and the additional steps, including whether the additional steps are performed or not, of the production method of the present invention can be decided as appropriate, depending on the kind of organic device of the present invention to be produced.

By applying the production method of the present invention to the production of an organic device, an organic device of which layers performing major functions (the first layer and/or the second layer) have an improved chemical stability can be produced easily and efficiently.

However, it is particularly preferable that the production method of the present invention is applied to the production of an organic electroluminescence device, among various kinds of organic devices. Specifically, it is particularly preferable that the first layer is a hole-transport layer and the second layer is a hole-injection layer. Thereby, an organic electroluminescence device that can suppress rise in the driving voltage at the time of constant-current energization and degradation in brightness at the time of energization and thus excels in its driving lifetime can be provided.

II. Embodiments

In the following, the organic device of the present invention and the production method of the present invention will be described in detail, taking an organic electroluminescence device as an example.

[II-1. Structure of Organic Electroluminescence Device]

FIG. 1 is a cross-sectional view schematically illustrating the layered structure of the organic electroluminescence device of one embodiment of the present invention. The organic electroluminescence device 100 is constructed so that an anode 2, a hole-injection layer 3, a hole-transport layer 4, an organic emitting layer 5, a hole-inhibition layer 6, an electron-injection layer 7 and a cathode 8 are overlying a substrate 1 in this order.

In the present embodiment, the hole-transport layer 4 corresponds to the layer formed by means of polymerization of a polymerizable compound (the first layer, the polymerized layer), and the hole-injection layer 3 corresponds to the layer containing a polymerization initiator (the second layer, the adjacent layer).

[II-2. Substrate]

The substrate 1 is a support of the organic electroluminescence device 100.

There is no limitation on the material of the substrate 1. The examples include quartz, glass, metal, and plastic. These materials can be used either as a single kind or as a mixture of two or more kinds in any combination and in any ratio.

There is no limitation on the shape of the substrate 1, either. The examples include plate, sheet, film, foil, and a combination of any two or more of them.

Of these, preferable as substrate 1 are glass plate and transparent plastic sheet such as polyester, polymethacrylate, polycarbonate, polysulphone or the like.

In the case where plastics are used for forming the substrate 1, it is preferable that particular attention should be paid on gas barrier property. When the gas barrier property of the substrate 1 is too low, the organic electroluminescence device 100 may deteriorate due to air passing through the substrate 1 from outside. Therefore, it is preferable to take some measures such as providing a dense-textured film, like a silicon dioxide film, on at least one side of the substrate 1, which is formed of plastic, for the sake of securing the gas barrier property.

There is no limitation on the thickness of the substrate 1. However, it is desirably in the range of usually 1 μm or larger, preferably 50 μm or larger, and usually 50 mm or smaller, preferably 3 mm or smaller. When the substrate 1 is too thin, the mechanical strength may be lowered. When it is too thick, the weight of the device may be too high.

The substrate 1 may be comprised either of a single layer, or of laminated two or more of layers. When it is comprised of laminated layers, the layers may be formed from either the same or different materials.

[II-3. Anode]

An anode 2 is formed on the substrate 1.

The anode 2 performs a function of hole injection into the layers at the side of the organic emitting layer 5, to be described later (namely, hole-injection layer 3, organic emitting layer 5 and the like).

The material of the anode 2 is arbitrary insofar as it has electrical conductivity. The examples include: metals such as aluminium, gold, silver, nickel, palladium, and platinum; metal oxides such as oxides of indium and/or tin; halogenated metals such as copper iodide; carbon black; and electroconductive polymers such as poly(3-methylthiophene), polypyrrole, and polyaniline.

These materials of anode 2 can be used either as a single kind or as a mixture of two or more kinds in any combination and in any ratio.

There is no limitation on the production method of the anode 2. However, it is usually formed by sputtering, vacuum deposition or the like. When using a material such as metal particulate like silver, metal halide particulate like copper iodide, carbon material particulate like carbon black, particulate of electroconductive metal oxide, or micropowder of electroconductive polymer, the material can be dispersed in an appropriate binder resin solution and then applied on the substrate 1 to form the anode 2.

Furthermore, when using an electroconductive polymer as the material, the anode 2 can be formed by a method such as forming a thin film of the electroconductive polymer directly on the substrate 1 by the electrolytic polymerization or applying the electroconductive polymer on the substrate 1 (refer to Applied Physics Letters, 1992, Vol. 60, pp. 2711).

The thickness of the anode 2 depends on the transparency required for the anode 2.

When transparency is required for the anode 2, it is preferable that the transmittance with respect to visible light of the anode 2 is usually 60% or higher, preferably 80% or higher. In this case, the thickness of the anode 2 is preferably in the range of usually 5 nm or larger, preferably 10 nm or larger, and usually 1000 nm or smaller, preferably 500 nm or smaller. When the anode 2 is too thin, the electrical resistance may be too large. When it is too thick, the transparency may decrease.

On the other hand, in the case where the anode 2 can be opaque, for example when the anode 2 serves also as substrate 1, the thickness of the anode 2 is desirably in the range of usually 1 µm or larger, preferably 50 µm or larger, and usually 50 mm or smaller, preferably 30 mm or smaller, in the same way as the substrate 1. When the anode 2 is too thin, the mechanical strength may be lowered. When it is too thick, the weight of the device may be too high.

The anode 2 may be formed of a single layer, or of laminated two or more of layers. When it is comprised of laminated layers, the layers may be formed from either the same or different materials.

Moreover, the anode 2 can be formed integrally with and serve also as the above-mentioned substrate 1.

After formation of the anode 2, it is preferable that the surface of the anode 2 is subjected to such treatments as ultraviolet (UV) treatment, ozone treatment, and plasma treatment (for example, oxygen plasma treatment or argon plasma treatment), for the purpose of removing impurities attached to the anode and adjusting ionization potential so as to enhance the hole injection capability.

[II-4. Hole-Injection Layer]

A hole-injection layer 3 is formed on the anode 2.

The hole-injection layer 3 is a layer that transports hole from the anode 2 to the organic emitting layer 5. In the present embodiment, the hole-injection layer 3 corresponds to the layer containing a polymerization initiator (the second layer, the adjacent layer).

The hole-injection layer 3 usually contains an electron-accepting compound and a hole-transport agent, as well as the above-mentioned polymerization initiator.

The hole-transport agent (hereinafter referred to as "hole transporting compound" as appropriate) can be selected appropriately from various compounds that are utilized as materials for forming hole-injecting/transporting thin films of organic EL devices conventionally. Of such compounds, those which are high in solvent solubility are preferable.

The hole-transporting compound is preferably a compound having an ionization potential of 4.5 eV or higher and 5.5 eV or lower. Incidentally, ionization potential is defined as energy required for removing an electron from HOMO (highest occupied molecular orbital) level of the material to the vacuum level. It can be measured directly by photoelectric spectroscopy, or can be decided by correcting the oxidation potential measured electrochemically with respect to the reference electrode. In the latter method, ionization potential is expressed, for example, by the following formula when using a saturated calomel electrode (SCE) as the reference electrode (see "Molecular Semiconductors", Springer-Verlag, 1985, pp. 98).

Ionization Potential=Oxidation Potential(vs. *SCE*)+ 4.3 eV

The hole transporting compound may be a low-molecular compound or a polymer compound. However, it is preferably a polymer compound.

The examples of the hole-transporting compound include aromatic amine compounds, phthalocyanine derivatives, porphyrine derivatives and oligothiophene derivatives. Particularly preferable are aromatic amine compounds, from the standpoint of amorphous nature, solvent solubility and transmittance with respect to visible light.

Of aromatic amine compounds, aromatic tertiary amine compounds are particularly preferable for the hole-transporting compound. Aromatic tertiary amine compounds in this context mean compounds possessing an aromatic tertiary amine structure and include compounds possessing a group derived from aromatic tertiary amines.

There is no special limitation on the kind of the aromatic amine compound, and it may be a low-molecular compound or a polymer compound. However, from the standpoint of the surface-smoothing effect, polymer compounds having a weight-average molecular weight of 1000 or higher and 1000000 or lower are preferable.

Preferable aromatic amine compound of polymer (hereinafter referred to as "aromatic-amine polymer compound" as appropriate) includes aromatic-tertiary-amine polymer compounds possessing a repetitive unit represented by the following formula (I).

[Chemical Formula 16]

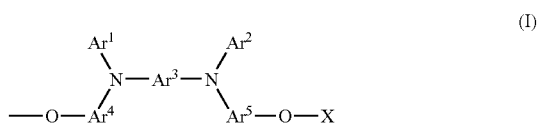

($Ar^1$ and $Ar^2$ in the formula (I) represent, independently of each other, an aromatic hydrocarbon group that may have a substituent or an aromatic heterocyclic group that may have a substituent. ($Ar^3$ to $Ar^5$ represent, independently of each other, a bivalent aromatic hydrocarbon group that may have a substituent or a bivalent aromatic heterocyclic group that may have a substituent. X represents a connecting group selected from the following group X1 of connecting groups.)

Group X1 of Connecting Groups:

[Chemical Formula 17]

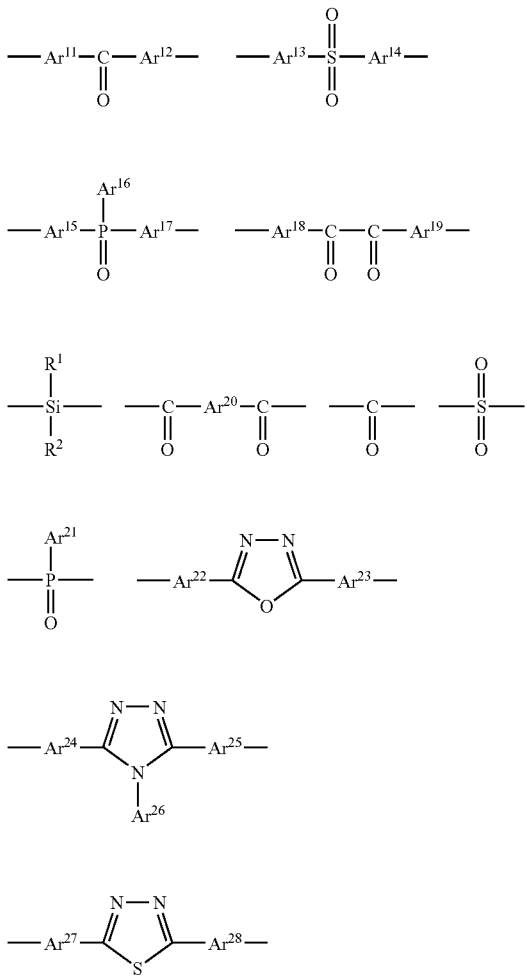

($Ar^{11}$ to $Ar^{28}$ in the formula represent, independently of each other, an aromatic hydrocarbon group that may have a substituent or an aromatic heterocyclic group that may have a substituent. $R^1$ and $R^2$ represent, independently of each other, a hydrogen atom or an arbitrary substituent.)

As $Ar^1$ to $Ar^5$ and $Ar^1$ to $Ar^{28}$ in the above-mentioned formula (I), a univalent or bivalent group derived from an arbitrary aromatic hydrocarbon ring or aromatic heterocyclic ring can be applied. In other words, as respective $Ar^1$, $Ar^2$, $Ar^{16}$, $Ar^{21}$ and $Ar^{26}$, a univalent group can be applied, and as respective $Ar^3$ to $Ar^5$, $Ar^{11}$ to $Ar^{15}$, $Ar^{17}$ to $Ar^{20}$, $Ar^{22}$ to $Ar^{25}$, $Ar^{27}$ and $Ar^{28}$, a bivalent group can be applied. They may be one and the same group or may be different from one another. Furthermore, they may carry an arbitrary substituent.

Examples of the above-mentioned aromatic hydrocarbon ring include a 5- or 6-membered monocyclic ring and a ring structure having 2 to 5 condensed rings. Examples include various ring structures such as benzene, naphthalene, anthracene, phenanthrene, perylene, tetracene, pyrene, benzpyrene, chrysene, triphenylene, acenaphthene, fluoranthene, and fluorene rings.

Examples of the above-mentioned aromatic heterocyclic ring include a 5- or 6-membered monocyclic ring or a ring structure having 2 to 4 condensed rings. Examples of the ring structure include furan, benzofuran, thiophen, benzothiophen, pyrrole, pyrazole, imidazole, oxadiazole, indole, carbazole, pyrroloimidazole, pyrrolopyrazole, pyrrolopyrrole, thienopyrrole, thienothiophen, furopyrrole, furofuran, thienofuran, benzoisoxazole, benzoisothiazole, benzimidazole, pyridine, pyrazine, pyridazine, pyrimidine, triazine, quinoline, isoquinoline, cinnnoline, quinoxaline, phenanthridine, perimidine, quinazoline, quinazolinone, and azulene rings.

Furthermore, as $Ar^3$ to $Ar^5$, $Ar^{11}$ to $Ar^{15}$, $Ar^{17}$ to $Ar^{20}$, $Ar^{22}$ to $Ar^{25}$, $Ar^{27}$ and $Ar^{28}$ can be used a group formed by linking two or more bivalent groups derived from one kind or more than one kind of aromatic hydrocarbon ring and/or aromatic heterocyclic ring.

The group derived from aromatic hydrocarbon ring and/or aromatic heterocyclic ring, of $Ar^1$ to $Ar^5$ and $Ar^{11}$ to $Ar^{28}$, may have an additional substituent, insofar as it does not deviate from the scope of the present invention. The molecular weight of the substituent is of the order of usually 400 or lower, preferably 250 or lower. There is no special limitation on the kind of the substituent. Examples include one or more substituents selected from the following group W of substituents. The substituent may be present either as a single substituent or as two or more substituents in any combination and in any ratio.

[Group W of Substituents]

Alkyl group having usually one or more, and usually 10 or less, preferably 8 or less carbon atoms such as methyl group and ethyl group; alkenyl group having usually 2 or more, and usually 11 or less, preferably 5 or less carbon atoms such as vinyl group; alkynyl group having usually 2 or more, and usually 11 or less, preferably 5 or less carbon atoms such as ethynyl group; alkoxy group having usually one or more, and usually 10 or less, preferably 6 or less carbon atoms such as methoxy group and ethoxy group; aryloxy group having usually 4 or more, preferably 5 or more, and usually 25 or less, preferably 14 or less carbon atoms such as phenoxy group, naphthoxy group, and pyridyloxy group; alkoxycarbonyl group having usually 2 or more, and usually 11 or less, preferably 7 or less carbon atoms such as methoxycarbonyl group and ethoxycarbonyl group; dialkylamino group having usually 2 or more, and usually 20 or less, preferably 12 or less carbon atoms such as dimethylamino group and diethylamino group; diarylamino group having usually 10 or more, preferably 12 or more, and usually 30 or less, preferably 22 or less carbon atoms such as diphenylamino group, ditolylamino group and N-carbazolyl group; arylalkylamino group having usually or more, preferably 7 or more, and usually 25 or less, preferably 17 or less carbon atoms such as phenylmethylamino group; acyl group having usually 2 or more, and usually 10 or less, preferably 7 or less carbon atoms such as acetyl group and benzoyl group; halogen atom such as fluorine atom and chlorine atom; haloalkyl group having usually one or more, and usually 8 or less, preferably 4 or less carbon atoms such as trifluoromethyl group; alkylthio group having usually one or more, and usually 10 or less, preferably 6 or less carbon atoms such as methylthio group and ethylthio group; arylthio group having usually 4 or more, preferably 5 or more, and usually or less, preferably 14 or less carbon atoms such as phenylthio group, naphthylthio group and pyridylthio group; silyl group having usually 2 or more, preferably 3 or more, and usually 33 or less, preferably 26 or less carbon atoms such as trimethylsilyl group and triphenylsilyl group; siloxy group having usually 2 or more, preferably 3 or more, and usually 33 or less, preferably 26 or less carbon atoms such as trimethylsiloxy group and triphenylsiloxy group; cyano group; aromatic hydrocarbon group having usually 6 or more, and usually 30 or less, preferably 18 or less carbon atoms such as phenyl group and naphthyl group; and aromatic heterocyclic group having usually 3 or more, preferably 4 or more, and usually 28 or less, preferably 17 or less carbon atoms such as thienyl group and pyridyl group.

Of the above-mentioned groups, preferable as $Ar^1$ and $Ar^2$, from the standpoint of solubility, heat stability, and hole injection/transport property of the polymer compound, is a univalent group derived from a ring structure of benzene, naphthalene, phenanthrene, thiophene, and pyridine. Particularly preferable is phenyl group and naphthyl group.

In addition, of the above-mentioned groups, preferable as $Ar^3$ to $Ar^5$, from the standpoint of heat stability and hole injection/transport property including oxidation/reduction potential, is a bivalent group derived from a ring structure of benzene, naphthalene, anthracene and phenanthrene. Particularly preferable is phenylene group, biphenylene group and naphthylene group.

A hydrogen atom or an arbitrary substituent can be applicable as $R^1$ and $R^2$ in the above-mentioned formula (I). They can be one and the same substituent or can be different substituents. No particular limitation is imposed on the kind of the substituent insofar as it does not depart from the scope of the present invention. Examples of applicable substituent include alkyl group, alkenyl group, alkynyl group, alkoxy group, silyl group, siloxy group, aromatic hydrocarbon group and aromatic heterocyclic group. Examples are the substituents exemplified in [Group W of substituents].

No particular limitation is imposed on the weight-average molecular weight of the aromatic-tertiary-amine polymer compound used as material for the hole-injection layer, insofar as the advantage of the present invention is not significantly impaired. However, it is usually 1000 or higher, preferably 2000 or higher, more preferably 3000 or higher, and usually 500000 or lower, preferably 200000 or lower, more preferably 100000 or lower.

No particular limitation is imposed on the ratio of the aromatic-tertiary-amine polymer compound in the hole-injection layer 3, insofar as the advantage of the present invention is not significantly impaired. However, its weight ratio in the whole hole-injection layer 3 is usually 10 weight % or higher, preferably 30 weight % or higher, and usually 99.9 weight % or lower, preferably 99 weight % or lower. When two or more kinds of polymers are used in combination, it is preferable that their total content falls within the above-mentioned range.

On the other hand, Preferable examples of a low-molecular aromatic tertiary amine compound (hereinafter referred to as "aromatic-tertiary-amine low-molecular compound" as appropriate) for the hole-transporting compound include binaphthyl compounds represented by the following formula (III).

[Chemical Formula 18]

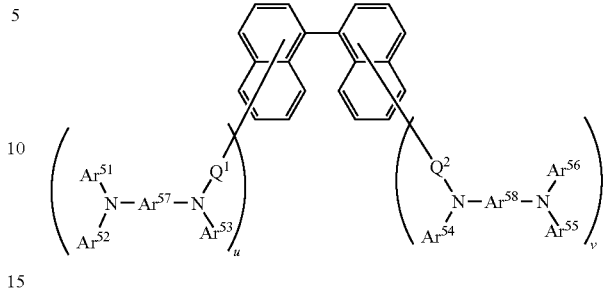

(III)

$Ar^{51}$ to $Ar^{58}$ in the formula (III) represent, independently of each other, an aromatic hydrocarbon group that may have a substituent or an aromatic heterocyclic group that may have a substituent. $Ar^{51}$ and $Ar^{52}$, as well as $Ar^{55}$ and $Ar^{56}$, may combine together to form a ring, respectively. Concrete examples, preferable examples, examples of substituents which can be introduced and examples of preferable substituents of $Ar^{51}$ to $Ar^{58}$ are the same as those described earlier for $Ar^1$ to $Ar^5$.

Also, u and v represent, independently of each other, an integer which is 0 or larger and 4 or smaller. They should satisfy the relation u+v>1. Particularly preferable combination is u=1 and v=1.

$Q^1$ and $Q^2$ represent, independently of each other, direct binding or bivalent connecting moiety.

The naphthalene ring in the general formula (III) may have an arbitrary substituent in addition to the substituents $-(Q^1NAr^{53}Ar^{57}$ $(NAr^{51}Ar^{52}))$ and $-(Q^2NAr^{54}Ar^{58}$ $(NAr^{55}Ar^{56}))$. Further, the substituents $-(Q^1NAr^{53}Ar^{57}$ $(NAr^{51}Ar^{52}))$ and $-(Q^2NAr^{54}Ar^{58}$ $(NAr^{55}Ar^{56}))$ may be at any position of the naphthalene ring. In particular, binaphthyl compounds having the substituents at positions C-4 and C-4' of the naphthalene rings in the formula (III) are more preferable.

It is preferable that the binaphthylene structure of the compound represented by the formula (III) has substituents at C-2 and C-2'. Substituents at C-2 and C-2' include an alkyl group that may have a substituent, alkoxy group that may have a substituent alkenyl group that may have a substituent and alkoxycarbonyl group that may have a substituent.

The binaphthylene structure of the compound represented by the formula (III) may have an arbitrary substituent at positions other than C-2 and C-2'. Examples of such a substituent include the same substituents described above for C-2 and C-2'. It is likely that the two naphthalene rings in the compound represented by the formula (III) assume a distorted configuration due to the substituents at positions C-2 and C-2', which will lead to increased solubility of the compound.

The molecular weight of the binaphthyl compound, represented by the formula (III), is in the range of usually 500 or higher, preferably 700 or higher, and usually 2000 or lower, preferably 1200 or lower.

Preferable examples of the binaphthyl compound that is represented by the formula (III) and can be applied to the hole-transporting compound in the present invention, will be listed below. The binaphthyl compounds that can be applied to the present invention is, though, not limited to these.

[Chemical Formula 19]

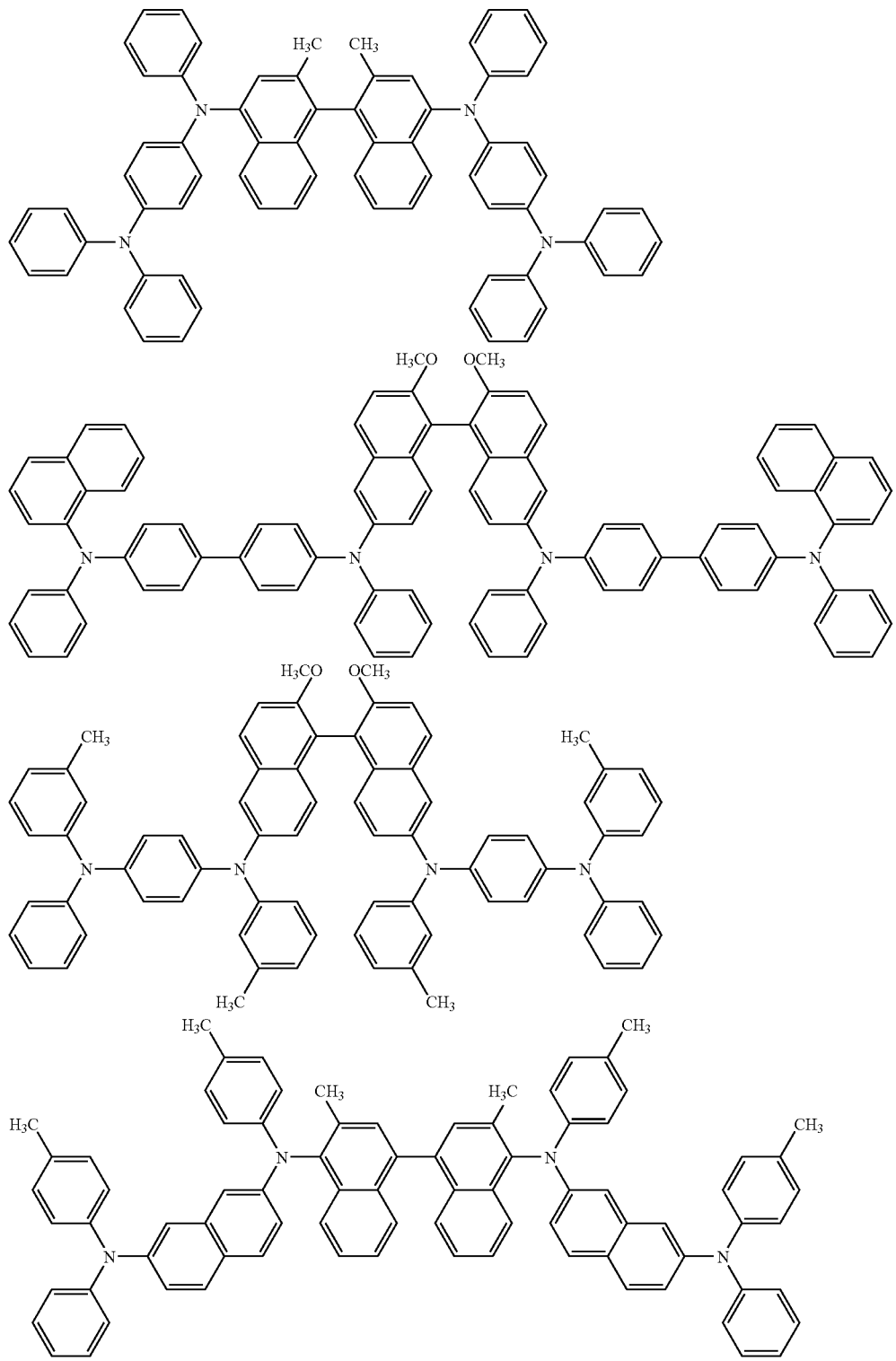

Other aromatic amine compounds applicable as hole-transporting compound of the present invention include previously known compounds which have been used as hole injection/transporting layer formation material of an organic electroluminescence device. Examples include: aromatic diamine compounds in which tertiary aromatic amine unit such as 1,1-bis(4-di-p-tolylaminophenyl)cyclohexane is linked (Japanese Patent Laid-Open Publication No. SHO 59-194393); aromatic amines in which two or more tertiary amines, represented by 4,4'-bis[N-(1-naphthyl)-N-phenylamino]biphenyl, are contained and in which two or more condensed aromatic rings are substituted for the nitrogen atoms (Japanese Patent Laid-Open Publication No. HEI 5-234681); aromatic triamines of triphenylbenzene derivatives possessing a star-burst structure (Specification of U.S. Pat. No. 4,923,774); aromatic diamines such as N,N'-diphenyl-N,N'-bis(3-methylphenyl)biphenyl-4,4'-diamine (Specification of U.S. Pat. No. 4,764,625); α,α,α',α'-tetramethyl-α,α'-bis(4-di-p-tolylaminophenyl)-p-xylene (Japanese Patent Laid-Open Publication No. HEI 3-269084); triphenylamine derivatives each of which is sterically asymmetric as a whole molecule (Japanese Patent Laid-Open Publication No. HEI 4-129271); compounds in which a pyrenyl group has more than one aromatic diamino groups (Japanese Patent Laid-Open Publication No. HEI 4-175395); aromatic diamines in which tertiary aromatic amine units are linked by an ethylene group (Japanese Patent Laid-Open Publication No. HEI 4-264189); aromatic diamines possessing styryl structure (Japanese Patent Laid-Open Publication No. HEI 4-290851); compounds in which aromatic tertiary amine units are linked by thiophene group (Japanese Patent Laid-Open Publication No. HEI 4-304466); aromatic triamines of star-burst structure (Japanese Patent Laid-Open Publication No. HEI 4-308688); benzylphenyl compounds (Japanese Patent Laid-Open Publication No. HEI 4-364153); compounds in which tertiary amines are linked by fluorene group (Japanese Patent Laid-Open Publication No. HEI 5-25473); triamine compounds (Japanese Patent Laid-Open Publication No. HEI 5-239455); bis-dipyridylamino-biphenyl (Japanese Patent Laid-Open Publication No. HEI 5-320634); N,N,N-triphenylamine derivatives (Japanese Patent Laid-Open Publication No. HEI 6-1972); aromatic diamines possessing phenoxazine structure (Japanese Patent Laid-Open Publication No. HEI 7-138562); diaminophenyl phenanthridine derivatives (Japanese Patent Laid-Open Publication No. HEI 7-252474); hydrazone compounds (Japanese Patent Laid-Open Publication No. HEI 2-311591); silazane compounds (Specification of U.S. Pat. No. 4,950,950); silanamine derivatives (Japanese Patent Laid-Open Publication No. HEI 6-49079); phosphamine derivatives (Japanese Patent Laid-Open Publication No. HEI 6-25659); and quinacridone compounds. These aromatic amine compounds may be used as a mixture of more than one compound, if necessary.

Another examples of aromatic amine compounds applicable as hole-transporting compound of the present invention include a metal complex of 8-hydroxyquinoline derivative containing diarylamino group. The above metal complex contains a central metal atom selected from the group consisting of alkali metal, alkali earth metal, Sc, Y, V, Cr, Mn, Fe, Co, Ni, Cu, Zn, Cd, Al, Ga, In, Si, Ge, Sn, Sm, Eu and Tb. The ligand 8-hydroxyquinoline carries one or more diarylamino groups as substituent and may carry another arbitrary substituent other than diarylamino group.

Preferable examples of phthalocyanine derivatives or porphyrine derivatives applicable as hole-transporting compound of the present invention includes: porphyrine, 5,10,15,20-tetraphenyl-21H,23H-porphyrine, 5,10,15,20-tetraphenyl-21H,23H-porphyrine cobalt(II), 5,10,15,20-tetraphenyl-21H,23H-porphyrine copper(II), 5,10,15,20-tetraphenyl-21H,23H-porphyrine zinc(II), 5,10,15,20-tetraphenyl-21H,23H-porphyrine vanadium (IV) oxide, 5,10,15,20-tetra(4-pyridyl)-21H,23H-porphyrine, 29H,31H-phthalocyanine copper (II), phthalocyanine zinc (II), phthalocyanine titanium, phthalocyanine oxide magnesium, phthalocyanine lead, phthalocyanine copper (II), and 4,4',4'',4'''-tetraaza-29H,31H-phthalocyanine.

Preferable examples of oligothiophene derivatives applicable as hole-transporting compound of the present invention include α-sexithiophen and the like.

The molecular weight of the aromatic amine compounds (except the above-mentioned aromatic-tertiary-amine polymer compounds and binaphthyl compounds represented by the formula (III)), phthalocyanine derivatives, porphyrine derivatives, and oligothiophene derivatives that are applicable as the hole-transporting compound is usually 200 or higher, preferably 400 or higher, more preferably 600 or higher, and usually 5000 or lower, preferably 3000 or lower, more preferably 2000 or lower, still more preferably 1700 or lower, most preferably 1400 or lower. When the molecular weight is too low, the heat resistance tends to be lowered. On the other hand, when the molecular weight of the hole-transporting compound is too high, its synthesis and purification tends to be difficult, which is not desirable.

The hole-injection layer 3 can include any one kind of the above-mentioned hole-transporting compounds (hole-transport agents) singly or two or more kinds of them in any combination and in any ratio.

The content of the hole-transport agent in the hole-injection layer 3 is in the range of usually 0.1 weight % or higher, preferably 1 weight % or higher, and usually 99.9 weight % or lower, preferably 90 weight % or lower.

The detail, concrete examples, preferable examples and the like, of the polymerization initiator, are as mentioned earlier.

The polymerization initiator can be used either as a single kind thereof or as a mixture of two or more kinds in any combination and in any ratio.

The content of the polymerization initiator in the hole-injection layer 3 is in the range of usually 0.1 weight % or higher, preferably 1 weight % or higher, and usually 50 weight % or lower, preferably 30 weight % or lower. When the content of the polymerization initiator is too low, the polymerization reaction at the adjacent layer (usually, hole-transport layer 4) may not proceed enough. When it is too high, the hole-transporting capability of the hole-transporting compound may be hindered.

In addition, the ratio of the polymerization initiator relative to the hole-transport agent is preferably in the range of usually 0.01 weight % or more, preferably 0.1 weight % or more, and usually 100 weight % or less, preferably 60 weight % or less.

Examples of the electron-accepting compound include: onium salt, triaryl boron compound, metal halide, Lewis acid, organic acid, salt of arylamine and metal halide, and salt of arylamine and Lewis acid. These electron-accepting compounds can enhance the electric conductivity of the hole-injection layer by oxidizing the hole-injecting material, when they are mixed with the hole-injecting material.

Examples of the onium salt include various kinds of organic onium salts listed earlier as examples of the polymerization initiator.

Examples of the triaryl boron compound include boron compounds represented by the following general formula (IV). It is preferable that the boron compound represented by the general formula (IV) below is Lewis acid. The electron affinity of the boron compound is usually 4 eV or higher, and preferably 5 eV or higher.

[Chemical Formula 20]

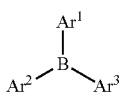
(IV)

In the general formula (IV), $Ar^1$ to $Ar^3$ represent, independently of each other, 5- or 6-membered monocyclic ring such as phenyl group, naphthyl group, anthryl group, or biphenyl group that may have a substituent or aromatic hydrocarbon group formed through condensation reaction and/or direct binding of two or three of these groups; or 5- or 6-membered monocyclic ring such as thienyl group, pyridyl group, triazyl group, pyrazyl group, or quinoxalyl group that may have a substituent or aromatic heterocyclic group formed through condensation reaction and/or direct binding of two or three of these groups.

Examples of the substituents that $Ar^1$ to $Ar^3$ may carry include: halogen atom; alkyl group; alkenyl group; alkoxycarbonyl group; alkoxy group; aryloxy group; acyl group; haloalkyl group; and cyano group.

It is preferable that at least one of $Ar^1$ to $Ar^3$ is a substituent of which Hammett constant ($\sigma_m$ and/or $\sigma_p$) takes a positive value. It is particularly preferable that all of $Ar^1$ to $Ar^3$ are a substituent of which Hammett constant ($\sigma_m$ and/or $\sigma_p$) takes a positive value. When possessing such an electron-accepting substituent, the electron-accepting properties of the compounds can be enhanced. Moreover, it is more preferable that all of $Ar^1$ to $Ar^3$ are aromatic hydrocarbon group or aromatic heterocyclic group that is substituted with a halogen atom.

Preferable examples of the boron compound represented by the general formula (IV) include compounds represented by the following formulae 6-1 to 6-17. However, the boron compound represented by the general formula (IV) is by no means limited to the compounds represented by the following formulae 6-1 to 6-17.

[Chemical Formula 21]

6-1
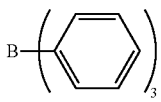

6-2
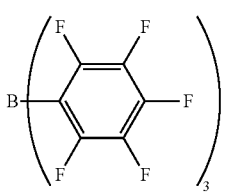

6-3
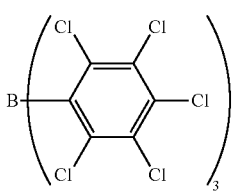

6-4
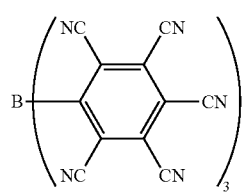

6-5
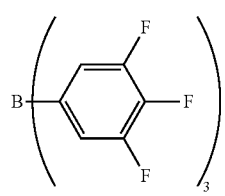

6-6
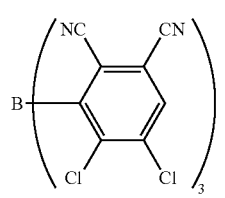

6-7
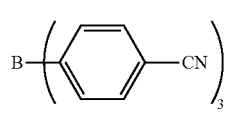

6-8
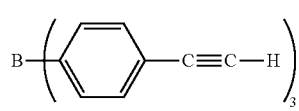

6-9
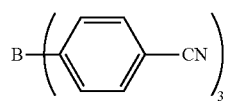

6-10
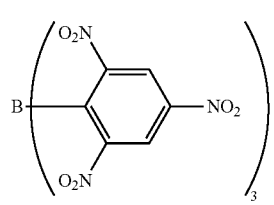

6-11
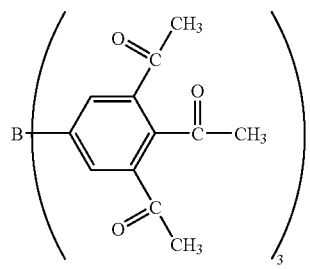

-continued 6-12
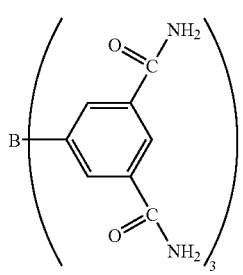

6-13
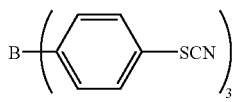

6-14
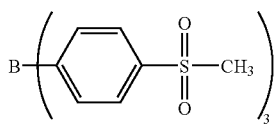

6-15
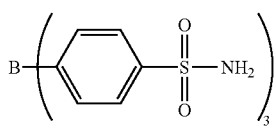

[Chemical Formula 22]

6-16
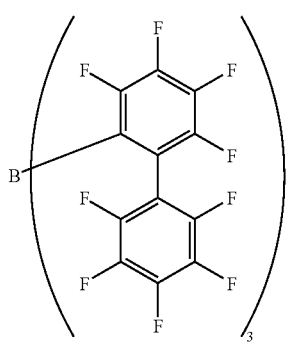

6-17
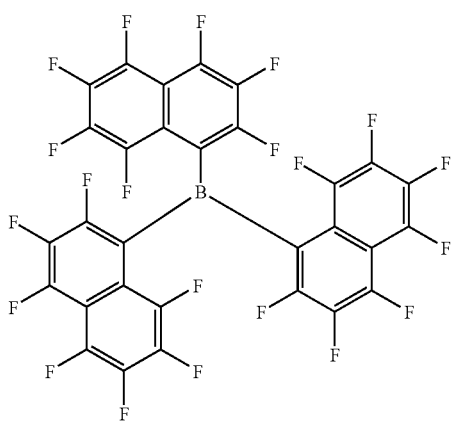

Of these, the following compounds are particularly preferable.

[Chemical Formula 22]

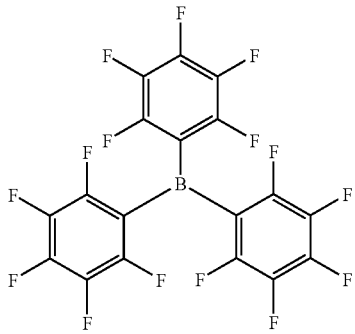

PPB

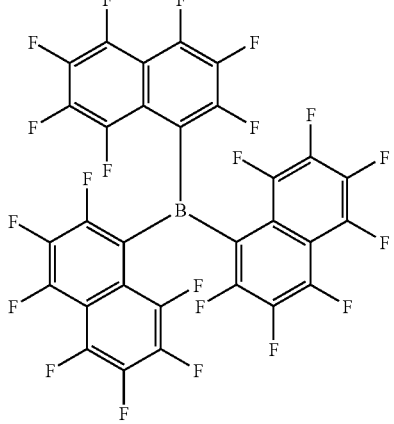

PNB

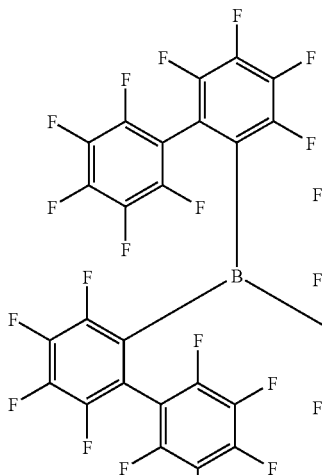

PBB

The above-mentioned electron-accepting compound can be used either as a single kind thereof or as a mixture of two or more kinds in any combination and in any ratio.

The ratio of the electron-accepting compound relative to the hole-transport agent is preferably in the range of usually 0.1 weight % or more, preferably 1 weight % or more, and usually 100 weight % or less, preferably 60 weight % or less.

Different compounds can be used as the polymerization initiator and the electron-accepting compound, respectively.

However, a compound functioning both as polymerization initiator and as electron-accepting compound can be used instead.

By using a compound functioning both as polymerization initiator and as electron-accepting compound, ratio of the polymerization initiator and the electron-accepting compound relative to the hole-transport agent can be increased, compared to when using different compounds as the polymerization initiator and the electron-accepting compound, respectively.

In addition, even when the hole-injection layer 3 is formed using a solvent, as described later, it is easy to select the solvent. This is because there is no need to consider the solubilities of both polymerization initiator and electron-accepting compound separately then.

Examples of the compound that can function both as polymerization initiator and as electron-accepting compound include organic onium salt. Such compounds can be used either as a single kind or as a mixture of two or more kinds in any combination and in any ratio.

It is possible to use, in combination, one or more kinds of compounds functioning both as polymerization initiator and electron-accepting compound, one or more kinds of polymerization initiators, and/or one or more kinds of electron-accepting compounds.

The hole-injection layer 3 is prepared by forming a composition (hereinafter referred to as a "composition for hole-injection layer" as appropriate) containing ingredients that constitute the hole-injection layer 3 (polymerization initiator, electron-accepting compound, hole-transport agent, and the like) into a film.

Namely, the step in which the hole-injection layer 3 is formed corresponds to the above-mentioned (1) film formation step using a composition for hole-injection layer.

The composition for hole-injection layer usually contains a solvent, in addition to a polymerization initiator, an electron-accepting compound and a hole-transport agent, which are constituents of the hole-injection layer 3.

There is no limitation on the kind of the solvent, insofar as it can suitably dissolve each ingredient in the composition for hole-injection layer and causes no unfavorable chemical reaction with these ingredients. Among them, it is preferable to use those solvents which do not contain compounds which are likely to inactivate free carriers (cation radical) arising from the polymerization initiator, or those solvents which do not contain compounds likely to produce inactivating compounds.

Preferable solvent includes, for example, ether type solvents and ester type solvents.

Examples of ether type solvent include: aliphatic ethers such as ethylene glycol dimethylether, ethylene glycol diethylether, propylene glycol-1-monomethylether acetate (hereinafter abbreviated as "PGMEA" as appropriate); and aromatic ethers such as 1,2-dimethoxybenzene, 1,3-dimethoxybenzene, anisole, phenethol, 2-methoxytoluene, 3-methoxytoluene, 4-methoxytoluene, 2,3-dimethylanisole, 2,4-dimethylanisole. These ether type solvents can be used either as a single one or as a mixture of two or more kinds in any combination and in any ratio.

Examples of ester type solvent include: aliphatic esters such as ethyl acetate, n-butyl acetate, ethyl lactate, n-butyl lactate; and aromatic esters such as phenyl acetate, phenyl propionate, methyl benzoate, ethyl benzoate, propyl benzoate, and n-butyl benzoate. These ester type solvents can be used either as a single kind or as a mixture of two or more kinds in any combination and in any ratio.

In addition, one or more kinds of the ether type solvents and one or more kinds of the ester type solvents can be used in combination in any ratio.

Applicable solvent other than the above-mentioned ether type solvent and ester type solvent includes, for example, aromatic hydrocarbon solvent such as benzene, toluene and xylene; amide type solvent such as N,N-dimethylformamide and N,N-dimethylacetamide; and dimethylsulfoxide. These solvents can be used either as a single kind or as a mixture of two or more kinds in any combination and in any ratio. It is also possible that one or more kinds of these solvents are used in combination with one or more kinds of the above-mentioned ether type solvents and ester type solvents. Among them, aromatic hydrocarbon solvents such as benzene, toluene and xylene are poor in their capability to dissolve oxidants and polymers, it is preferable to combine them with an ether type solvent and ester type solvent.

It is preferable that the content of the solvent in the composition for hole-injection layer is in the range of usually 1 weight % or higher, preferably 70 weight % or higher, and usually 99.999 weight % or lower, preferably 99 weight % or lower.

It is preferable that the content of the hole-transport agent in the composition for hole-injection layer is in the range of usually 0.001 weight % or higher, preferably 0.1 weight % or higher, and usually 99 weight % or lower, preferably 20 weight % or lower.

It is preferable that the content of the polymerization initiator in the composition for hole-injection layer is in the range of usually 0.00001 weight % or higher, preferably 0.01 weight % or higher, more preferably 0.1 weight % or higher, and usually 50 weight % or lower, preferably 5 weight % or lower, more preferably 1 weight % or lower.

It is preferable that the content of the electron-accepting compound in the composition for hole-injection layer is in the range of usually 0.00001 weight % or higher, preferably 0.01 weight % or higher, more preferably 0.1 weight % or higher, and usually 50 weight % or lower, preferably 5 weight % or lower, more preferably 1 weight % or lower.

Furthermore, the composition for hole-injection layer may comprise other ingredient. Examples of the other ingredient include leveling agent and antifoaming agent.

Examples of the leveling agent include silicone surfactant and fluorinated surfactant. The leveling agent can be used either as a single kind thereof or as a mixture of two or more kinds in any combination and in any ratio.

The content of the leveling agent in the composition for hole-injection layer is in the range of usually 0.0001 weight % or higher, preferably 0.001 weight % or higher, and usually 1 weight % or lower, preferably 0.1 weight % or lower. When the content of the leveling agent is too low, the leveling failure may be caused. When it is too high, the electrical properties of the film may be hindered.

Examples of the antifoaming agent include silicone oil, fatty acid ester and phosphoric acid ester. The antifoaming agent can be used either as a single kind thereof or as a mixture of two or more kinds in any combination and in any ratio.

The content of the antifoaming agent in the composition for hole-injection layer is in the range of usually 0.0001 weight % or higher, preferably 0.001 weight % or higher, and usually 1 weight % or lower, preferably 0.1 weight % or lower. When the content of the antifoaming agent is too low, the antifoaming effect may be lost. When it is too high, the electrical properties of the film may be hindered.

After preparation of the composition for hole-injection layer by mixing the above-mentioned ingredients, a film is formed on the above-mentioned anode 2 using the composition.

There is no limitation on the method of film formation. However, wet coating method is usually adopted. There is no limitation on the kind of the wet coating method, and any appropriate method can be selected, such as coating method like spin coating or spraying, or printing method like ink jet printing or screen printing, depending on the ingredients of the composition for hole-injection layer, the characteristic of the anode 2, which is the foundation of the film, or the like.

In wet coating method, post-treatments such as drying are performed after the film formation.

The method of drying is not particularly limited. Examples thereof include air drying, heated drying, and reduced pressure-drying. It is also possible that both heated drying and reduced pressure-drying are performed.

Examples of the heated drying include drying with a hot plate, with an oven, with infrared irradiation, or with radio wave irradiation.

When performing heated drying, it is preferable that the heating temperature is in the range of usually room temperature or higher, preferably 50° C. or higher, and usually 300° C. or lower, preferably 260° C. or lower. The temperature while the heated drying can be either held constant or changed.

When performing reduced pressure-drying, it is preferable that the pressure while drying is in the range of usually normal pressure or lower, preferably kPa or lower, more preferably 1 kPa or lower.

It is preferable that the length of time of the drying is in the range of usually 1 second or longer, preferably 10 seconds or longer, more preferably 30 seconds or longer, and usually 100 hours or shorter, preferably 24 hours or shorter, more preferably 3 hours or shorter.

There is no limitation on the thickness of the hole-injection layer 3. However, it is preferably in the range of usually 1 nm or larger, preferably 10 nm or larger, and usually 1000 nm or smaller, preferably 500 nm or smaller. When the hole-injection layer 3 is too thin, the hole injection capability may be insufficient. When it is too thick, the resistance may be too high.

The hole-injection layer 3 may be comprised either of a single layer, or of laminated, two or more of layers. When it is comprised of laminated layers, the layers may be formed from either the same or different materials.

[II-5. Hole-Transport Layer]

A hole-transport layer 4 is formed on the hole-injection layer 3.

The hole-transport layer 4 performs functions of injecting holes, which come from the anode 2 through the hole-injection layer 3, into the organic emitting layer 5 and inhibiting decrease in the luminous efficiency caused by electrons injected from the emitting layer 5 toward the side of the anode 2. In the present embodiment, the hole-transport layer 4 corresponds to the layer formed by means of polymerization of a polymerizable compound (the first layer, the polymerized layer).

The hole-transport layer 4 is prepared by forming a composition (hereinafter referred to as a "composition for hole-transport layer" as appropriate) containing a polymerizable compound, which is a material of the hole-transport layer 4, into a film and by polymerizing the polymerizable compound.

Namely, the step in which the hole-transport layer 4 is formed corresponds to the above-mentioned (2) film formation step using a composition for hole-transport layer and (3) polymerization step.

The composition for hole-transport layer usually contains a solvent, in addition to a polymerizable compound, which is a material component of the hole-transport layer 4.

The detail, concrete examples, preferable examples and the like, of the polymerizable compound, are as mentioned earlier.

The polymerizable compound can be used either as a single kind thereof or as a mixture of two or more kinds in any combination and in any ratio.

There is no limitation on the kind of the solvent, insofar as it can suitably dissolve each ingredient in the composition for hole-transport layer and causes no unfavorable chemical reaction with these ingredients. Examples include the following organic solvents. Namely, aromatic compounds such as toluene, xylene, methysilene, and cyclohexylbenzene; halogen solvents such as 1,2-dichloroethane, chlorobenzene, and o-dichlorobenzene; ether type solvents such as aliphatic ethers like ethylene glycol dimethylether, ethylene glycol diethylether, propylene glycol-1-monomethylether acetate (PGMEA) and aromatic ethers like 1,2-dimethoxybenzene, 1,3-dimethoxybenzene, anisole, phenethol, 2-methoxytoluene, 3-methoxytoluene, 4-methoxytoluene, 2,3-dimethylanisole, 2,4-dimethylanisole; ester type solvents such as aliphatic esters like ethyl acetate, n-butyl acetate, ethyl lactate, n-butyl lactate and aromatic esters like phenyl acetate, phenyl propionate, methyl benzoate, ethyl benzoate, isopropyl benzoate, propyl benzoate, and n-butyl benzoate. Of these solvents, toluene, xylene, methysilene and cyclohexylbenzene are preferable.

These solvents can be used either as a single kind thereof or as a mixture of two or more kinds in any combination and in any ratio.

It is preferable that the content of the solvent in the composition for hole-transport layer is in the range of usually 1 weight % or higher, preferably 20 weight % or higher, and usually 99.999 weight % or lower, preferably 70 weight % or lower.

It is preferable that the content of the hole-transport agent in the composition for hole-transport layer is in the range of usually 0.01 weight % or higher, preferably 0.05 weight % or higher, more preferably 0.1 weight % or higher, and usually 50 weight % or lower, preferably 20 weight % or lower, more preferably 10 weight % or lower.

Furthermore, the composition for hole-transport layer may comprise other ingredient.

Examples of the other ingredient include an additive for promoting polymerization reaction, which can suppress the solubility of the electron-accepting compound and hole-transport layer 4, making it possible for the hole-transport layer 4 to be coated with another layer thereon.

Examples of the additive promoting polymerization reaction include: polymerization initiators such as alkylphenone compounds, acylphosphine oxide compounds, metallocene compounds, oxime ester compounds, azo compounds, and onium salts; polymerization accelerator; and photosensitizers such as condensed polycyclic hydrocarbons, porphyrine compounds, and diarylketone compounds.

These additives can be used either as a single kind thereof or as a mixture of two or more kinds in any combination and in any ratio.

However, when an organic electroluminescence device is produced in which the hole-transport layer corresponds to the first layer, it is preferable that any polymerization initiators are not contained in the composition for hole-transport layer, from the standpoint of suppressing rise in the driving voltage at the time of constant-current energization and degradation in brightness at the time of energization, as well as realizing an excellent driving lifetime.

After preparation of the composition for hole-transport layer by mixing the above-mentioned ingredients, a film is formed on the above-mentioned hole-injection layer 3 using the composition.

There is no limitation on the method of film formation. However, wet coating method is usually adopted. There is no limitation on the kind of the wet coating method, and any appropriate method can be selected, such as coating method like spin coating or spraying, or printing method like ink jet printing or screen printing, depending on the ingredients of the composition for hole-transport layer, the characteristic of the hole-injection layer 3, which is the foundation of the film, or the like.

After forming the composition for hole-transport layer into a film on the hole-injection layer 3, the polymerizable compound is polymerized. Thereby the hole-transport layer 4 is formed. The polymerizable compound that is polymerized through polymerization reaction reduces the solubility of the reacted film (hole-transport layer 4). In this way, the hole-transport layer 4 comes to be insoluble in the composition for organic emitting layer (to be described later), even when forming the organic emitting layer 5 on the hole-transport layer 4 subsequently.

Methods of polymerizing the polymerizable compound include a method in which the composition for hole-transport layer formed into a film (this will be hereinafter referred to as "film of composition for hole-transport layer") is heated, and a method in which the film of composition for hole-transport layer is irradiated with an activating energy line.

When the polymerization is conducted by heating, there is no limitation on the heating method. Examples of the heating method include hot plate, oven, infrared irradiation, and microwave irradiation. These methods can be used either as a single kind or as a mixture of two or more kinds in any combination and in any ratio.

It is preferable that the heating temperature is in the range of usually room temperature or higher, preferably 50° C. or higher, and usually 300° C. or lower, preferably 260° C. or lower. The temperature while heating can be either held constant or changed. It is preferable that the length of time of the heating is in the range of usually 1 second or longer, preferably 10 seconds or longer, more preferably 30 seconds or longer, and usually 100 hours or shorter, preferably 24 hours or shorter, more preferably 3 hours or shorter.

On the other hand, when the polymerization is conducted by irradiation of an activating energy line, activating energy lines include ultraviolet, electron beam (this decomposes the polymerization initiator mainly by light excitation and induces the polymerization reaction), infrared radiation, microwave (this decomposes the polymerization initiator mainly by heat and increases the reaction velocity of the polymerization), and the like. These activating energy lines can be used either as a single kind or as a mixture of two or more kinds in any combination and in any ratio.

Methods of irradiation of such activating energy lines include: direct irradiation using a light source of ultraviolet, visible or infrared light, such as ultrahigh-pressure mercury lamp, high-pressure mercury lamp, halogen lamp, or infrared lamp; irradiation using a mask aligner or a conveyor-type irradiation apparatus which has the aforementioned light source built-in; and irradiation using an apparatus radiating microwave generated from a magnetron, namely, so-called a microwave oven.

It is desirable that the irradiance amount of the activating energy line is in the range of usually 1 mJ/cm$^2$ or higher, preferably 10 mJ/cm$^2$ or higher, and usually 100 J/cm$^2$ or lower, preferably 30 J/cm$^2$ or lower, in terms of accumulated energy on the surface of the film of composition for hole-transport layer.

The irradiation time of the activating energy line can be set appropriately so that it comes to be the above-mentioned irradiance amount. However, it is desirably in the range of usually 0.1 second or longer, preferably 1 second or longer, and usually 10 hours or shorter, preferably 1 hour or shorter.

The kind of polymerization method can be selected appropriately from the above-mentioned heating methods and activating-energy-line irradiation methods, depending on the kinds of the polymerization initiator contained in the hole-injection layer 3 and the polymerizable compound contained in the composition for hole-transport layer.

Either the heating or the irradiation of activating energy line can be performed singly, or both of them can be performed in combination.

When irradiation of an activating energy line is performed, just one kind of the activating energy line can be used singly, or two or more kinds of them can be used at the same time or separately.

There is no limitation on the pressure at the polymerization step. However, it is usually performed under normal pressure or a reduced pressure.

There is no limitation on the atmosphere at the polymerization step, either. However, it is usually performed in the air or in inert gas atmosphere such as nitrogen. Among them, an atmosphere without containing any moisture, such as nitrogen gas atmosphere, is preferable, for the sake of reducing moisture content that is contained inside the obtained hole-transport layer 4 and/or that is absorbed on the surface of the hole-transport layer 4. For the same reason, when two or more steps of the heating and/or the irradiation of activating energy line are performed separately, it is particularly preferable that at least the step just before the formation of the organic emitting layer 5 is performed under atmosphere without any moisture, such as nitrogen gas atmosphere.

After performing the polymerization step, drying treatment can be conducted in order to reduce remained solvent.

When drying is performed, the method thereof is not limited. Examples thereof include air drying, heated drying, and reduced pressure-drying. It is also possible that both heated drying and reduced pressure-drying are performed.

Example of the heated drying include drying with a hot plate, with an oven, with infrared irradiation, or with radio wave irradiation.

When performing heated drying, it is desirable that the heating temperature is in the range of usually room temperature or higher, preferably 50° C. or higher, and usually 300° C. or lower, preferably 260° C. or lower. The temperature while performing the heated drying can be either held constant or changed. When performing reduced pressure-drying, it is desirable that the pressure while drying is in the range of usually normal pressure or lower, preferably kPa or lower, more preferably 1 kPa or lower.

It is desirable that the length of time of drying is in the range of usually 1 second or longer, preferably 10 seconds or longer, more preferably 30 seconds or longer, and usually 100 hours or shorter, preferably 24 hours or shorter, more preferably 3 hours or shorter.

There is no limitation on the thickness of the hole-transport layer 4. However, it is desirably in the range of usually 5 nm or larger, preferably 10 nm or larger, and usually 1000 nm or smaller, preferably 500 nm or smaller. When the hole-transport layer 4 is too thin, the luminous efficiency of the device may be lowered. When it is too thick, the voltage at the device may be too high.

The hole-transport layer 4 may be comprised either of a single layer, or of laminated, two or more of layers. When it is comprised of laminated layers, the layers may be formed from either the same or different materials.

[II-6. Organic Emitting Layer]

An organic emitting layer 5 is formed on the hole-transport layer 4.

The organic emitting layer 5 is a layer that constitutes a major light source, by means of excitation caused by reunion between the holes, which are transported through the anode 2, the hole-injection layer 3, and then the hole-transport layer 4, and the electrons, which are transported through the cathode 8, the electron-injection layer 7, and then the hole-inhibition layer 6, when an electric field is given between the electrodes.

The organic emitting layer 5 contains at least a material having luminescent characteristic (luminescence material) and, preferably, a material having hole-transporting characteristic (hole-transporting compound) or a material having electron-transporting characteristic (electron-transporting compound). In addition, the organic emitting layer 5 may contain other ingredients, without departing from the scope of the present invention. However, it is preferable that low-molecular-weight material is used as every such a material, from the standpoint of forming the organic emitting layer 5 by wet coating method as described later.

As the luminescence material, any previously known materials can be applied. Examples include fluorescent materials and phosphorescent materials. However, phosphorescent materials are preferable in terms of internal quantum efficiency.

It is also preferable to lower the symmetry or rigidity of the luminescence material molecules and introduce a lipophilic substituent such as alkyl group, for the purpose of improving the solvent solubility.

Fluorescent dye giving blue emission includes, for example, perylene, pyrene, anthracene, coumarine, p-bis(2-phenylethenyl)benzene, and their derivatives. Green fluorescent dye includes, for example, quinacridone derivatives, and coumarine derivatives. Yellow fluorescent dye includes, for example, rubrene, perimidon derivatives. Red fluorescent dye includes, for example, DCM (4-(dicyanomethylene)-2-methyl-6-(p-dimethylaminostyryl)-4H-pyran) compounds, benzopyran derivatives, rhodamine derivatives, benzo thioxanthene derivatives, and azabenzo thioxanthene.

The phosphorescent material includes, for example, organometallic complexes containing a metal selected from group 7 to group 11 of the long form periodic table (hereinafter, "periodic table" indicates the long form periodic table, unless otherwise stated).

Preferable examples of the metal selected from group 7 to group 11 of the periodic table, contained in the phosphorescent organometallic complex, include ruthenium, rhodium, palladium, silver, rhenium, osmium, iridium, platinum, and gold. Preferable organometallic complexes of these metals include compounds represented by the following formula (VI) or formula (VII).

(VI)

(In the formula (VI), M represents a metal, and q represents the valence of the metal. L and L' represent bidentate ligands. In addition, j represents a number of 0, 1 or 2.)

[Chemical Formula 24]

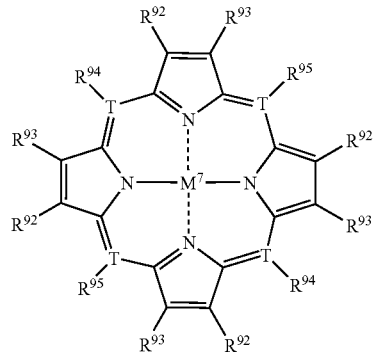

(In the formula (VII), $M^7$ represents a metal, and T represents carbon atom or nitrogen atom. $R^{92}$ to $R^{95}$ represent, independently of each other, a substituent. However, when T is nitrogen atom, $R^{94}$ and $R^{95}$ do not exist.)

In the following, explanation will be given on the compounds represented by the formula (VI) first.

In the formula (VI), M represents an arbitrary metal. Preferable examples thereof include metals listed earlier as those selected from group 7 to group 11 of the periodic table.

In addition, in the formula (VI), the bidentate ligand L represents a ligand having the following partial structure.

[Chemical Formula 25]

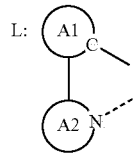

In the above partial structure of L, the ring A1 represents an aromatic hydrocarbon group that may have a substituent or an aromatic heterocyclic group that may have a substituent.

Examples of the aromatic hydrocarbon group include 5- or 6-membered monocyclic rings and ring structures having 2 to 5 condensed rings. Examples include univalent groups derived from ring structures such as benzene, naphthalene, anthracene, phenanthrene, perylene, tetracene, pyrene, benzpyrene, chrysene, triphenylene, acenaphthene, fluoranthene, and fluorene rings.

Examples of the aromatic heterocyclic group include 5- or 6-membered monocyclic rings or ring structures having 2 to 4 condensed rings. Examples include univalent groups derived from ring structures such as furan, benzofuran, thiophen, benzothiophen, pyrrole, pyrazole, imidazole, oxadiazole, indole, carbazole, pyrroloimidazole, pyrrolopyrazole, pyrrolopyrrole, thienopyrrole, thienothiophen, furopyrrole, furofuran, thienofuran, benzoisoxazole, benzoisothiazole, benzimidazole, pyridine, pyrazine, pyridazine, pyrimidine, triazine, quinoline, isoquinoline, cinnnoline, quinoxaline, phenanthridine, perimidine, quinazoline, quinazolinone, and azulene rings.

In the above partial structure of L, the ring A2 represents a nitrogen-containing aromatic heterocyclic group that may have a substituent.

Examples of the nitrogen-containing aromatic heterocyclic group include 5- or 6-membered monocyclic rings or ring structures having 2 to 4 condensed rings. Examples include univalent groups derived from ring structures such as pyrrole, pyrazole, imidazole, oxadiazole, indole, carbazole, pyrroloimidazole, pyrrolopyrazole, pyrrolopyrrole, thienopyrrole, furopyrrole, thienofuran, benzoisoxazole, benzoisothiazole, benzimidazole, pyridine, pyrazine, pyridazine, pyrimidine, triazine, quinoline, isoquinoline, quinoxaline, phenanthridine, perimidine, quinazoline, and quinazolinone.

Examples of the substituents that A1 or A2 may carry include: halogen atom; alkyl group; alkenyl group; alkoxycarbonyl group; alkoxy group; aryloxy group; dialkylamino group; diarylamino group; carbazolyl group; acyl group; haloalkyl group; cyano group; and aromatic hydrocarbon group.

In addition, in the formula (VI), the bidentate ligand L' represents a ligand having the following partial structures. In the following formulae, "Ph" represents a phenyl group.

[Chemical Formula 26]

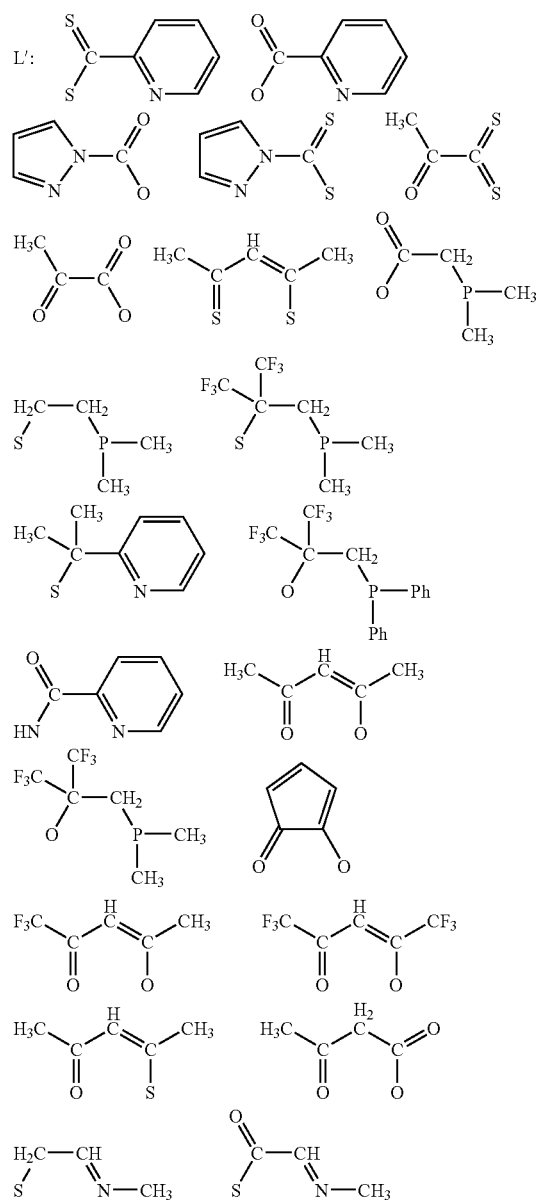

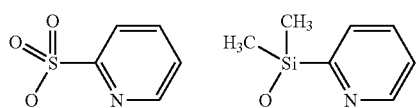

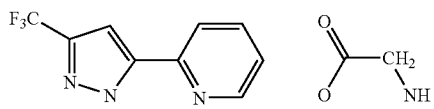

Among them, the ligands listed below are preferable as L' in terms of stability of the complex.

[Chemical Formula 27]

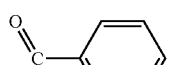

More preferable examples of the compounds represented by the formula (VI) include the compounds represented by the following formulae (VIa), (VIb), and (VIc).

[Chemical Formula 28]

(VIa)

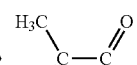

(In the formula (VIa), M⁴ represents a metal that is the same as M, w represents the valence of the metal, the ring A1 represents an aromatic hydrocarbon group that may have a substituent, and the ring A2 represents a nitrogen-containing aromatic heterocyclic group that may have a substituent.)

[Chemical Formula 29]

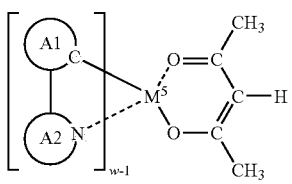
(VIb)

(In the formula (VIb), M⁵ represents a metal that is the same as M, w represents the valence of the metal, the ring A1 represents an aromatic hydrocarbon group that may have a substituent or an aromatic heterocyclic group that may have a substituent, and the ring A2 represents a nitrogen-containing aromatic heterocyclic group that may have a substituent.)

[Chemical Formula 30]

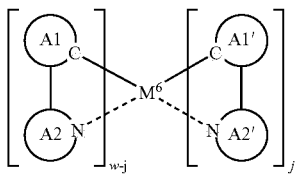
(VIc)

(In the formula (VIc), M⁶ represents a metal that is the same as M, w represents the valence of the metal, j represents 0, 1 or 2, the rings A1 and A1' represent, independently of each other, an aromatic hydrocarbon group that may have a substituent or an aromatic heterocyclic group that may have a substituent, and the rings A2 and A2' represent, independently of each other, a nitrogen-containing aromatic heterocyclic group that may have a substituent.)

Preferable examples of the rings A1 and A1' in the above-mentioned formulae (VIa) to (VIc) include phenyl group, biphenyl group, naphthyl group, anthryl group, thienyl group, furyl group, benzothienyl group, benzofuryl group, pyridyl group, quinolyl group, isoquinolyl group, and carbazolyl group.

Preferable examples of the rings A2 and A2' in the above-mentioned formulae (VIa) to (VIc) include pyridyl group, pyrimidil group, pyrazyl group, triazyl group, benzothiazole group, benzoxazole group, benzimidazole group, quinolyl group, isoquinolyl group, quinoxalyl group, and phenantridyl group.

Examples of the substituents that compounds represented by the above-mentioned formulae (VIa) to (VIc) may carry include: halogen atom; alkyl group; alkenyl group; alkoxycarbonyl group; alkoxy group; aryloxy group; dialkylamino group; diarylamino group; carbazolyl group; acyl group; haloalkyl group; and cyano group.

These substituents may combine together to form a ring. Specifically, the substituents belonging to the ring A1 and ring A2 or the substituents belonging to the ring A1' and ring A2' may combine with each other to form a condensed ring. Such a condensed ring includes 7,8-benzoquinoline group.

Preferable examples of the substituents of the rings A1, A1', A2, and A2' include alkyl group, alkoxy group, aromatic hydrocarbon group, cyano group, halogen atom, haloalkyl group, diarylamino group, and carbazolyl group.

Preferable examples of M⁴ to M⁶ in the formulae (VIa) to (VIc) include ruthenium, rhodium, palladium, silver, rhenium, osmium, iridium, platinum, and gold.

Examples of the organometallic complexes represented by the above-mentioned formulae (VI) and (VIa) to (VIc) are listed below. However, the complexes are by no means limited to the following compounds.

[Chemical Formula 31]

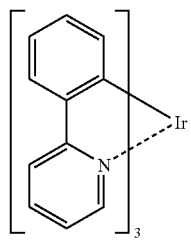
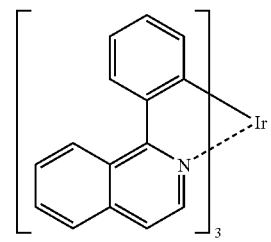
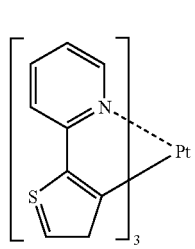
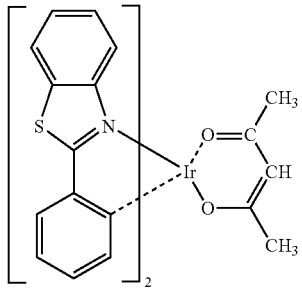
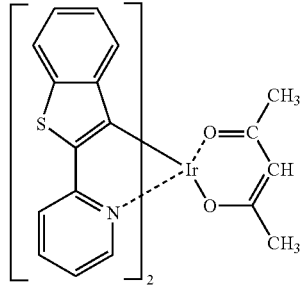
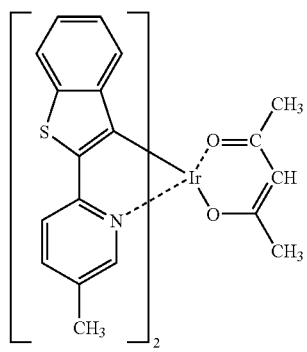
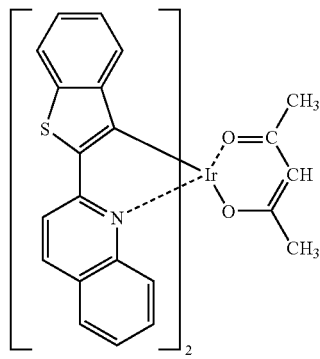

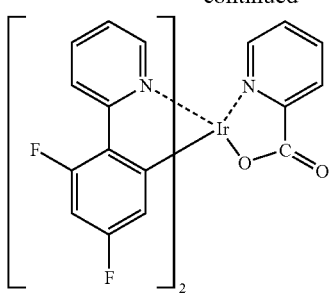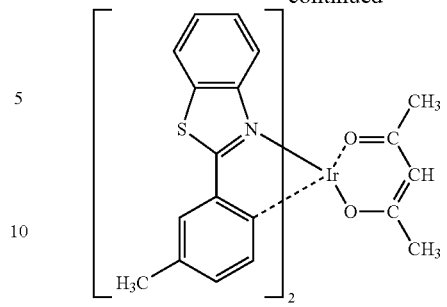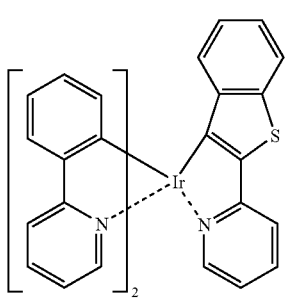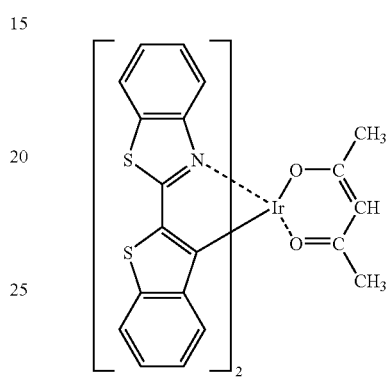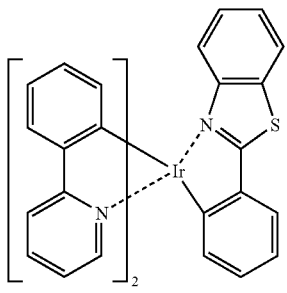
[Chemical Formula 32]
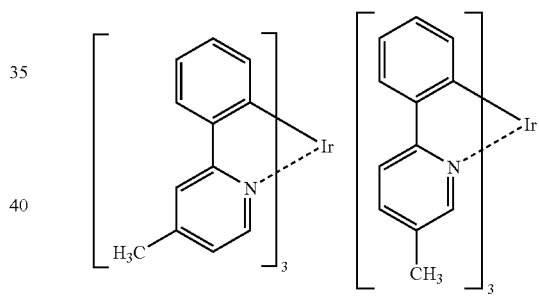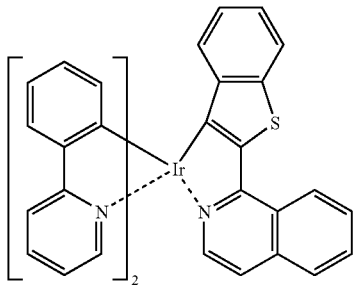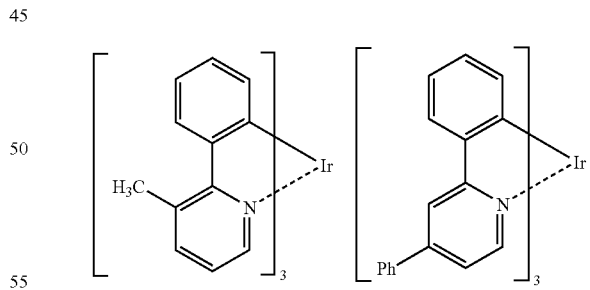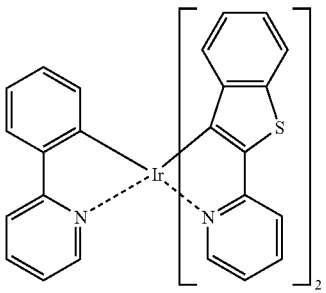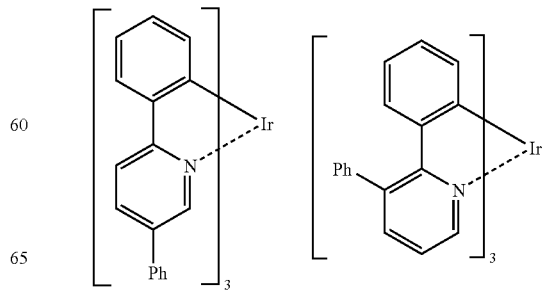

-continued

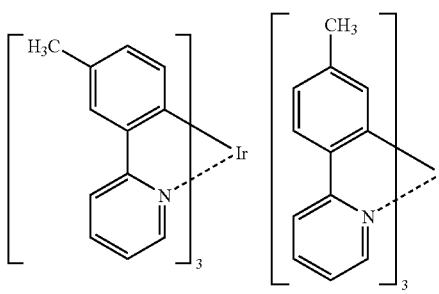

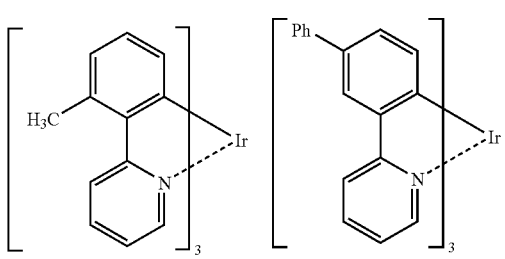

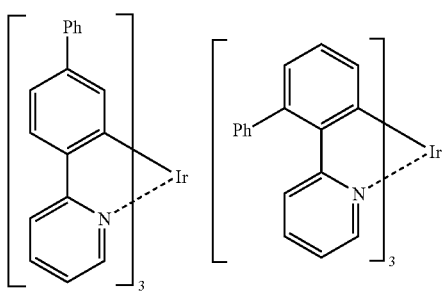

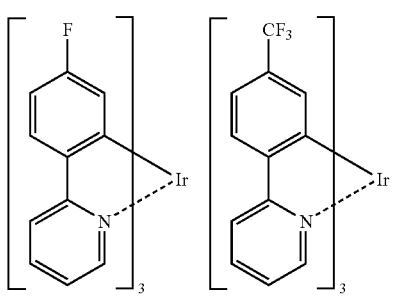

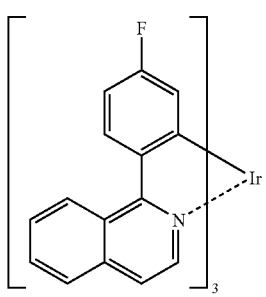

-continued

[Chemical Formula 33]

(C-3)

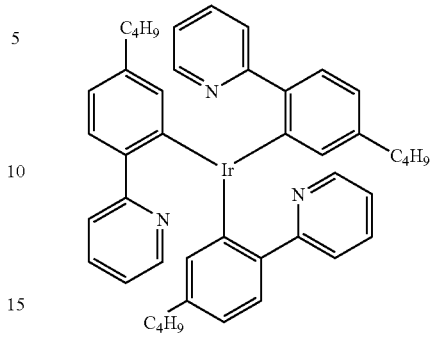

Of the organometallic complexes represented by the above-mentioned formula (VI), particularly preferable is a compound having, as ligands L and/or L', 2-arylpyridine ligand, namely, 2-arylpyridine to which an arbitrary substituent is connected or to which an arbitrary group is connected through condensation reaction.

Also, a compound disclosed in the pamphlet of International Publication No. 2005/019373 can be used as the luminescence material.

Next, explanation will be given on the compounds represented by the formula (VII).

In the formula (VII), $M^7$ represents a metal. Examples thereof include metals listed earlier as those selected from group 7 to group 11 of the periodic table. Of those, preferable are ruthenium, rhodium, palladium, silver, rhenium, osmium, iridium, platinum, and gold. Particularly preferable are bivalent metals such as platinum and palladium.

In addition, $R^{92}$ and $R^{93}$ in the formula (VII) represent, independently of each other, hydrogen atom, halogen atom, alkyl group, aralkyl group, alkenyl group, cyano group, amino group, acyl group, alkoxycarbonyl group, carboxyl group, alkoxy group, alkylamino group, aralkylamino group, haloalkyl group, hydroxyl group, aryloxy group, aromatic hydrocarbon group, or aromatic heterocyclic group.

Further, when T is carbon atom, $R^{94}$ and $R^{95}$ represent, independently of each other, a substituent that is the same as the substituents exemplified for $R^{92}$ and $R^{93}$ earlier. In addition, when T is nitrogen atom, $R^{94}$ and $R^{95}$ do not exist.

Moreover, $R^{92}$ to $R^{95}$ may carry a substituent additionally. When they carry a substituent, there is no special limitation on the kind thereof, and any group can be selected as the substituent.

Furthermore, any two or more groups of the $R^{92}$ to $R^{95}$ may combine together to form a ring.

Each of the $R^{92}$s, $R^{93}$s, $R^{94}$s, and $R^{95}$s that are present in one and the same compound may be the same or different from each other.

Examples (T-1, and T-10 to T-15) of the organometallic complexes represented by the above-mentioned formula (VII) are listed below. However, the complex is by no means limited to the following examples. In the following chemical formulae, Me represents methyl group, and Et represents ethyl group.

[Chemical Formula 34]

(T-1)
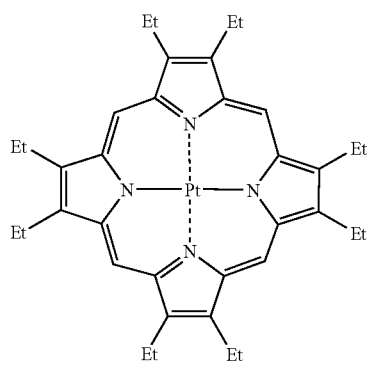

(T-10)
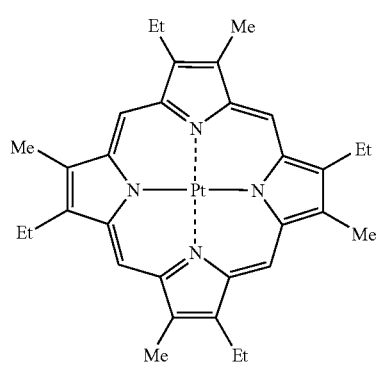

(T-11)
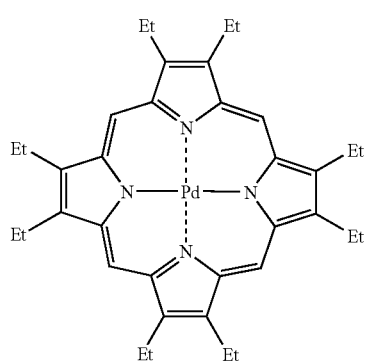

(T-12)
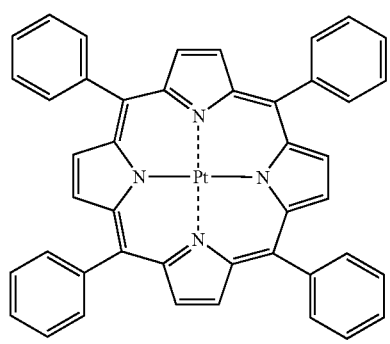

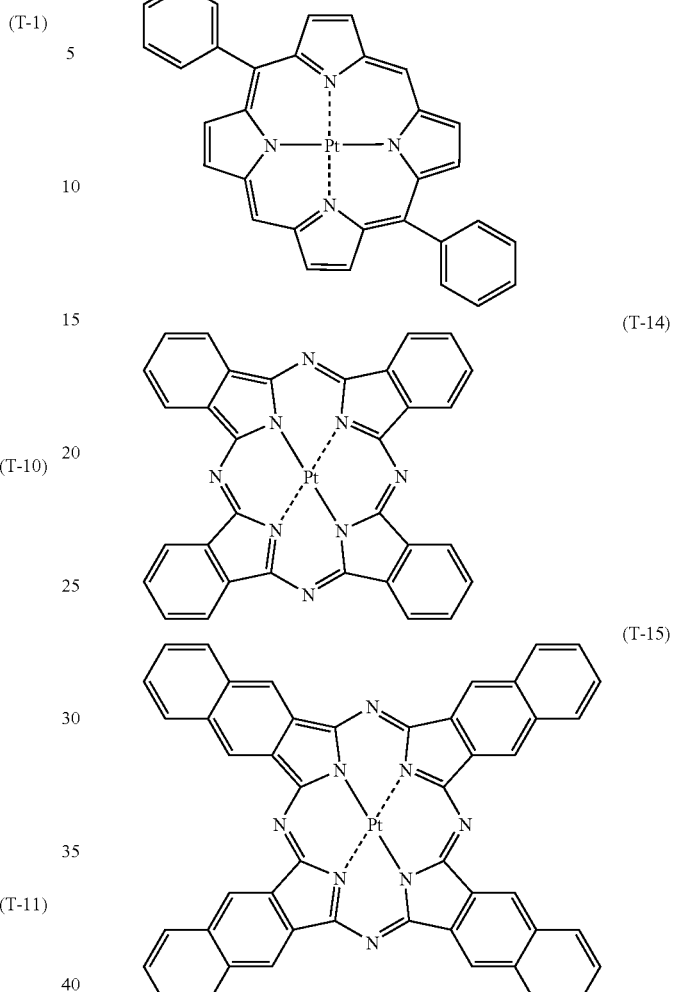

The molecular weight of the compound used as the luminescence material is in the range of usually 10000 or smaller, preferably 5000 or smaller, more preferably 4000 or smaller, still more preferably 3000 or smaller, and usually 100 or larger, preferably 200 or larger, more preferably 300 or larger, still more preferably 400 or larger. Too small a molecular weight may cause a remarkable decrease in heat resistance, gas evolution, deterioration in film quality when forming a film, and morphology change in the organic electroluminescence device due to, for example, migration. When the molecular weight is too large, it may be difficult to purify the organic compound, or dissolution of the organic compound in a solvent may take a considerable time.

The organic emitting layer 5 can include one kind of the various luminescence materials described above singly or two or more kinds of them in any combination and in any ratio.

Examples of the low-molecular-weight hole-transporting compound include, in addition to the various compounds exemplified as the hole-transporting compound of the aforementioned hole-transport layer, aromatic diamines in which two or more tertiary amines, represented by 4,4'-bis[N-(1-naphthyl)-N-phenylamino]biphenyl, are contained and in which two or more condensed aromatic rings are substituted for the nitrogen atoms (Japanese Patent Laid-Open Publication No. HEI 5-234681); aromatic amine compounds possessing a star-burst structure such as 4,4',4''-tris(1-naphthylphenylamino)triphenylamine (Journal of Luminescence, 1997, Vol. 72-74, pp. 985); aromatic amine compounds comprised of tetramer of triphenylamine (Chemical Communications, 1996, pp. 2175); spiro compounds such as 2,2',7,7'-tetrakis-(diphenylamino)-9,9'-spirobifluorene (Synthetic Metals, 1997, Vol. 91, pp. 209).

Examples of the low-molecular-weight electron-transporting compound include 2,5-bis(1-naphthyl)-1,3,4-oxadiazole (BND), 2,5-bis(6'-(2',2''-bipyridyl))-1,1-dimethyl-3,4-diphenylsilole (PyPySPyPy), basophenanthroline (BPhen), 2,9-dimethyl-4,7-diphenyl-1,10-phenanthroline (BCP, basocuproin), 2-(4-biphenylyl)-5-(p-tertialbutylphenyl)-1,3,4-oxadiazole (tBu-PBD), and 4,4'-bis(9-carbazole)-biphenyl (CBP).

It is preferable for these hole-transporting compounds and electron-transporting compounds to be used as a host substance in the emitting layer. Examples of the host substance include the following compounds.

preferable for forming the organic emitting layer 5, from the standpoint that, as described above, a homogeneous thin film without a defect can be obtained easily then, the formation takes just a little time, and further, the method can benefit from the advantageous effect of insolubility of the hole-transport layer 4 in the organic compound of the present invention. When the organic emitting layer 5 is formed by wet coating method, a composition for organic emitting layer (Namely, a composition containing ingredients that constitute the organic emitting layer 5. It is also referred to as "coating liquid".) is prepared by dissolving the above-mentioned materials in a proper solvent. The composition for organic emitting layer is applied on the above-mentioned hole-transport layer 4 that is already formed to form a film and then the solvent is removed by drying. Thereby the organic emitting layer 5 is formed. Such a formation method is the same as that of the hole-transport layer mentioned earlier.

There is no limitation on the thickness of the organic emitting layer 5. However, it is desirably in the range of usually 5

[Chemical Formula 35]

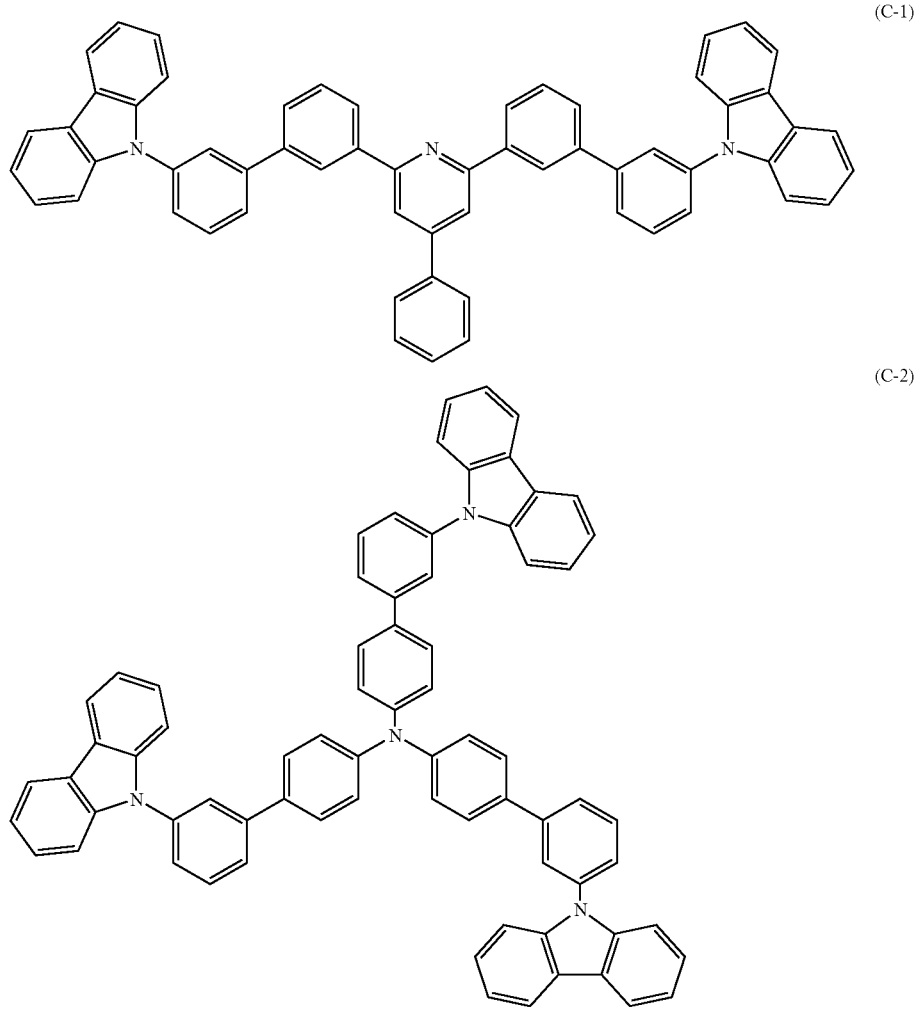

(C-1)

(C-2)

Methods of forming the organic emitting layer 5 include wet coating method and vacuum deposition method. Of these, wet coating method using low-molecular-weight materials is nm or larger, preferably 20 nm or larger, and usually 1000 nm or smaller, preferably 100 nm or smaller. When the organic emitting layer 5 is too thin, the luminous efficiency of the device may be lowered, or the lifetime thereof may be shortened. When it is too thick, the voltage at the device may be too high.

The organic emitting layer 5 may be comprised either of a single layer, or of laminated, two or more of layers. When it is comprised of laminated layers, the layers may be formed from either the same or different materials.

[II-7. Hole-Inhibition Layer]

A hole-inhibition layer 6 is formed on the organic emitting layer 5.

The hole-inhibition layer 6 is laminated on the organic emitting layer 5 in a manner that it contacts the interface of the organic emitting layer 5 on the side of the cathode 8. It is formed from a compound that can perform functions of inhibiting the holes moved from the anode 2 from reaching the cathode 8 and efficiently transporting the electrons injected from the cathode 8 toward the organic emitting layer 5.

The physicochemical properties required for the material of the hole-inhibition layer 6 includes high electron mobility and low hole mobility, large energy gap (the difference of HOMO and LUMO), and high excited triplet level (T1).

Examples of the hole-inhibition material that meet the above requirements include: mixed ligand complexes such as bis(2-methyl-8-quinolinolato), (phenolato)aluminium, and (triphenylhenyl silanolato)aluminium; metal complexes such as binuclear metal complex of bis(2-methyl-8-quinolato)aluminium-μ-oxo-bis-(2-methyl-8-quinolilato)aluminium; styryl compounds such as distyrylbiphenyl derivatives (Japanese Patent Laid-Open Publication No. Hei 11-242996); triazole derivatives such as 3-(4-biphenylyl)-4-phenyl-5(4-tert-butylphenyl)-1,2,4-triazole (Japanese Patent Laid-Open Publication No. Hei 7-41759); and phenanthroline derivatives such as basocuproin (Japanese Patent Laid-Open Publication No. Hei 10-79297). In addition, the compound having at least one pyridine ring that carries substituents at positions 2, 4, and 6, which is described in the pamphlet of International Publication No. 2005-022962, is also used preferably as the hole-inhibition material.

Examples of the hole-inhibition material include the compounds having the following structure.

[Chemical Formula 36]

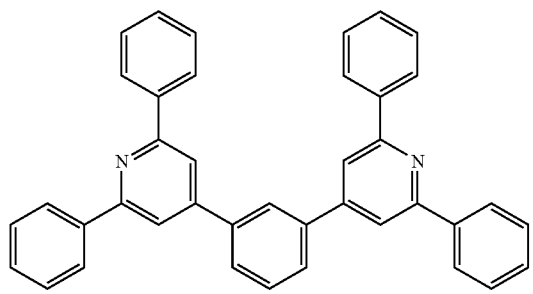

(C-4)

These hole-inhibition materials can be used either as a single kind or as a mixture of two or more kinds in any combination and in any ratio.

The hole-inhibition layer 6 can be also formed by wet coating method, as is the case with the hole-injection layer 3 and organic emitting layer 5. However, it is usually formed by vacuum deposition. The procedure of the vacuum deposition is the same as that of the electron-injection layer 7 to be described later.

There is no limitation on the thickness of the hole-inhibition layer 6. However, it is preferably in the range of usually 0.5 nm or larger, preferably 1 nm or larger, and usually 100 nm or smaller, preferably 50 nm or smaller. When the hole-inhibition layer 6 is too thin, the luminous efficiency may be lowered due to insufficient hole-inhibiting capability. When it is too thick, the voltage at the device may be too high.

The hole-inhibition layer 6 may be comprised either of a single layer, or of laminated, two or more of layers. When it is comprised of laminated layers, the layers may be formed from either the same or different materials.

[II-8. Electron-Injection Layer]

An electron-injection layer 7 is formed on or above the hole-inhibition layer 6.

The electron-injection layer 7 performs a function of injecting electrons that are injected from the cathode 8 efficiently into the organic emitting layer 5.

As material that constitutes the electron-injection layer 7, metals of which work functions are low are preferable, for the sake of efficient electron injection. Examples thereof include alkali metals such as sodium and cesium, and alkaline-earth metals such as barium and calcium.

In this case, it is desirable that the thickness of the electron-injection layer 7 is in the range of usually 0.1 nm or larger, preferably 0.5 nm or larger, and usually 5 nm or smaller, preferably 2 nm or smaller.

Furthermore, by using an organic electron-transport material typified by metal complex such as aluminium complex of nitrogen-containing heterocyclic compound (like basophenanthroline, described above) or of 8-hydroxyquinoline, doped with alkali metal such as sodium, potassium, cesium, lithium or rubidium (refer to Japanese Patent Laid-Open Publication No. Hei 10-270171, Japanese Patent Laid-Open Publication No. 2002-100478, Japanese Patent Laid-Open Publication No. 2002-100482, and the like), a film having characteristics of both increased electron injecting/transporting property and excellent film quality can be realized.

In this case, it is desirable that the thickness of the electron-injection layer 7 is in the range of usually 5 nm or larger, preferably 10 nm or larger, and usually 200 nm or smaller, preferably 100 nm or smaller.

These materials of the electron-injection layer 7 can be used either as a single kind or as a mixture of two or more kinds in any combination and in any ratio.

The electron-injection layer 7 is formed by laminating it on the hole-inhibition layer 6, by means of wet coating method or vacuum deposition method.

The detail of the wet coating method is the same as that in the case of the above-mentioned hole-injection layer 3 and organic emitting layer 5.

On the other hand, in the case of vacuum deposition, deposition source is put in a crucible or a metal boat placed in a vacuum chamber and then the inside of the vacuum chamber is evacuated to about $10^{-4}$ Pa with an appropriate vacuum pump. Then, the source is evaporated through heating of the crucible or the metal boat. Consequently, the electron-injection layer 7 is formed on the hole-inhibition layer 6 overlying the substrate 1 that is placed facing the crucible or the metal boat.

The deposition of alkali metal while forming the electron-injection layer 7 is conducted using an alkali metal dispenser in which nichrome is filled with an alkali metal chromate and a reducing agent. By heating this dispenser in a vacuum chamber, the alkali metal chromate is reduced and the alkali metal is evaporated.

When conducting co-deposition of an organic electron-transport material and an alkali metal, the organic electron-transport material is put in a crucible placed in a vacuum chamber and then the inside of the vacuum chamber is evacuated to about $10^{-4}$ Pa with an appropriate vacuum pump. Then, the crucible, containing the organic electron-transport material, and the dispenser, containing the alkali metal, are heated spontaneously to evaporate them. Consequently, the electron-injection layer 7 is formed on the substrate that is placed facing the crucible and the dispenser.

In this case, the co-deposited product is usually formed homogeneously in the direction of film thickness of the electron-injection layer 7, but there may be a distribution in concentration in the film-thickness direction.

The electron-injection layer 7 may be comprised either of a single layer, or of laminated, two or more of layers. When it is comprised of laminated layers, the layers may be formed from either the same or different materials.

[II-9. Cathode]

A cathode 8 is formed on the electron-injection layer 7.

The cathode 8 performs a function of injecting electrons into the layer on the side of the organic emitting layer 5 (electron-injection layer 7, organic emitting layer 5 or the like).

As material of the cathode 8, those used for the above-mentioned anode 2 can be used. However, metals of which work functions are low are preferable, for the sake of efficient electron injection. Examples of the low-work-function metals include tin, magnesium, indium, calcium, aluminium, silver, or alloys of them. Examples of the alloys include: magnesium-silver alloy, magnesium-indium alloy, and aluminum-lithium alloy.

These materials of the cathode 8 can be used either as a single kind or as a mixture of two or more kinds in any combination and in any ratio.

There is no limitation on the thickness of the cathode 8, but it is usually the same as that of the anode 2.

The cathode 8 may be comprised either of a single layer, or of laminated, two or more of layers. When it is comprised of laminated layers, the layers may be formed from either the same or different materials.

[II-10. Others]

The details of the organic device of the present invention and the production method of the present invention have been described above, taking the organic electroluminescence device 100 shown in FIG. 1 as an example. However, the details of the organic device of the present invention and the production method of the present invention are not limited to the above-mentioned description.

For example when the organic device of the present invention is an organic electroluminescence device, its construction is not limited to that of the organic electroluminescence device 100 shown in FIG. 1, but arbitrary modifications can be added to the construction of the organic electroluminescence device 100.

Examples of such modifications include change in the order of lamination of each layer contained in the organic electroluminescence device 100, omission of one or more of the layers, and addition of one or more layers.

Examples of the different lamination order include a structure in which respective layers except the substrate 1 are laminated in reverse order to the organic electroluminescence device 100, namely a structure in which a cathode 8, electron-injection layer 7, hole-inhibition layer 6, organic emitting layer 5, hole-transport layer 4, hole-injection layer 3, and anode 2 are laminated on a substrate 1 in this order.

Examples of the omission of a part of the layers include a structure in which the organic emitting layer 5 and the electron-injection layer 7 are disposed adjacently to each other without the hole-inhibition layer 6.

Examples of the addition of another layer include: a structure in which an anode buffer layer is provided between the anode 2 and the hole-injection layer 3 for the purpose of improving hole injection efficiency and adhesive force of the whole organic layer to the anode 2; and a structure in which a metal layer that is stable toward the air (for example, a layer comprised of aluminium, silver, copper, nickel, chromium, gold, platinum or the like) is added on the cathode 8 for the purpose of protecting the cathode, which is comprised of a low-work-function metal.

In addition, the organic device of the present invention is by no means limited to an organic electroluminescence device, but it can be other kinds of organic devices. Examples of such other kinds of organic devices include, as described earlier, organic transistor, organic solar battery, organic light-emitting transistor, organic magnetic device, organic diode, organic actuator (such as a motor), and organic sensor (such as pressure sensor, temperature sensor, and humidity sensor). The organic device of the present invention can be any one of the above-listed organic devices, as far as its two neighboring layers, among the plurality of organic layers that are disposed between the anode and the cathode overlying the substrate, are formed as a layer formed by means of polymerization of a polymerizable compound (namely, the first layer) and a layer containing a polymerization initiator (namely, the second layer), respectively.

Moreover, the production method of the present invention is by no means limited to the method described for the organic electroluminescence device 100 shown in FIG. 1, either. Appropriate modifications can be added thereto, depending on the structure of the organic device of the present invention to be produced, insofar as the method includes at least the above-mentioned (1) film formation step using a composition for hole-injection layer, (2) film formation step using a composition for hole-transport layer, and (3) polymerization step.

EXAMPLE

Next, the present invention will be further described in detail by way of Examples. It is to be understood that the present invention is by no means limited by the following Examples insofar as they do not depart from the intent of the invention.

Example 1

A glass substrate measuring 17.5 mm×35 mm (and 0.7 mm in thickness) was washed, successively, with a surfactant solution using ultrasonic, with extra-pure water, with extra-pure water using ultrasonic and again with extrapure water, followed by drying with nitrogen blow and, finally, ultraviolet ray-ozone cleaning was conducted.

On this glass substrate, a layer containing a polymerization initiator was formed by wet coating method according to the following procedure.

Namely, spin coating was carried out under the conditions described below using a coating liquid (composition) that contains a polymer compound (weight-average molecular weight: 29400, number-average molecular weight: 12600, this will be hereinafter referred to as the "compound (P-1)") having an aromatic amino group with a structure represented by the following formula P-1, as hole-transport agent, and a compound with a structure represented by the following formula A-1 (hereinafter referred to as the "compound (A-1)") as both electron-accepting compound and polymerization initiator.

[Chemical Formula 37]

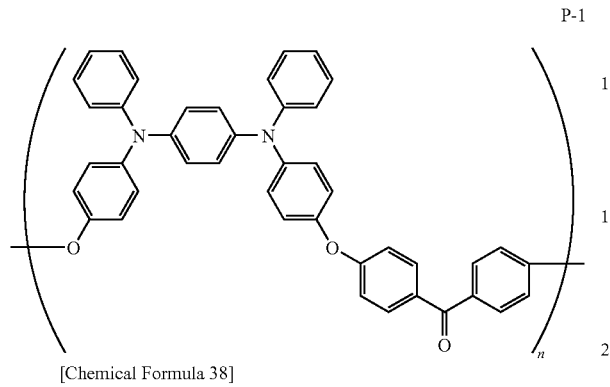

P-1

[Chemical Formula 38]

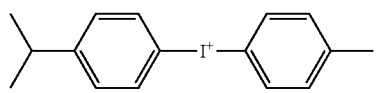

A-1

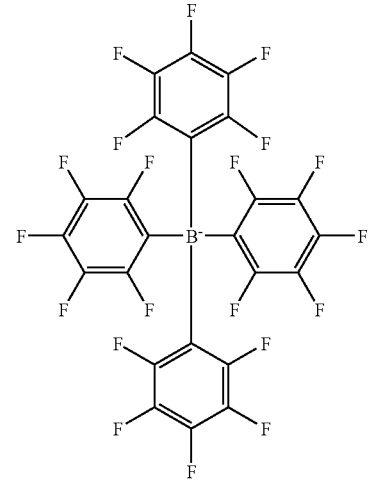

<Spin Coating Condition>
Coating Environment: In the Air
Solvent for Coating Liquid: Ethyl Benzoate
Concentration of Coating Liquid:

| Compound (P-1) | 2.0 Weight % |
|---|---|
| Compound (A-1) | 0.8 Weight % |

Revolution of Spinner: 1500 rpm
Time of Revolution of Spinner: 30 Seconds
Drying Condition: 230° C.×3 Hours By the above-mentioned spin coating, a homogeneous thin film (a layer containing a polymerization initiator) of 30 nm thickness was formed.

Subsequently, on the above-mentioned thin film (the layer containing a polymerization initiator), a layer containing a polymerizable compound was formed, by wet coating method according to the following procedure.

Namely, spin coating was carried out under the conditions described below using a coating liquid that contains a compound with a structure represented by the following formula H-1 (hereinafter referred to as the "compound (H-1)") as polymerizable compound.

[Chemical Formula 39]

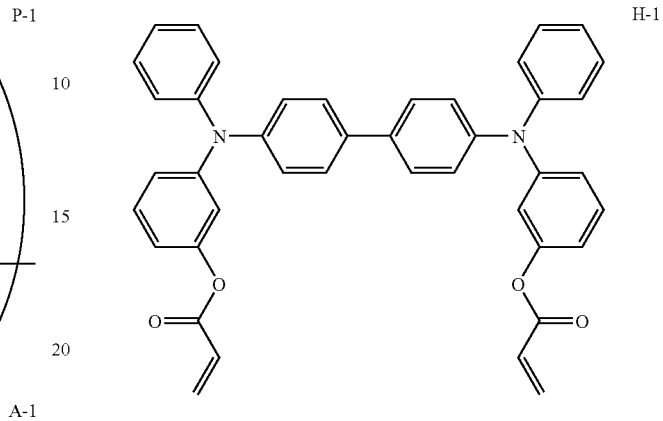

H-1

<Spin Coating Condition>
Coating Environment: In the Air
Solvent: Xylene
Concentration of Coating Liquid: Compound (H-1) 2 Weight %
Revolution of Spinner: 1500 rpm
Time of Revolution of Spinner: 30 Seconds The obtained spin-coated film was irradiated with UV light using a high-pressure mercury lamp in an accumulated light amount of 5 J/cm$^2$ (energy value of 365-nm light) in the air. Subsequently, by heating it in the air at 200° C. for 1 hour, a homogeneous, laminated thin film (a thin film in which two layers containing a polymerization initiator and a polymerizable compound respectively are laminated) of which total thickness was 60 nm was obtained.

The substrate, on which the laminated thin film was formed, was set at a spin coater and 0.2 mL of xylene was dropped thereon in the form of a film, followed by allowing it to stand in the air at 23° C. for 10 seconds. Subsequently, the solvent was dried by conducting spin coating at 1500 rpm for 30 seconds. Then, the film thickness was measured, resulting in the value of 60 nm. In this way, insolubility of the film produced in xylene was verified.

Example 2

A homogeneous, laminated thin film (a thin film in which two layers containing a polymerization initiator and a polymerizable compound respectively are laminated) of which total thickness was 60 nm was obtained under the same condition as used for Example 1, except that the spin-coated film was heated in the air at 180° C. for 1 hour when forming the layer containing a polymerization initiator after irradiated with UV light using a high-pressure mercury lamp in an accumulated light amount of 5 J/cm$^2$ (energy value of 365-nm light).

The substrate, on which the laminated thin film was formed, was set at a spin coater and 0.2 mL of xylene was dropped thereon in the form of a film, followed by allowing it to stand in the air at 23° C. for 10 seconds. Subsequently, the solvent was dried by conducting spin coating at 1500 rpm for 30 seconds. Then, the film thickness was measured, resulting in the value of 60 nm. In this way, insolubility of the produced film in xylene was verified.

Example 3

A homogeneous, laminated thin film (a thin film in which two layers containing a polymerization initiator and a polymerizable compound respectively are laminated) of which total thickness was 60 nm was obtained under the same condition as used for Example 1, except that the spin-coated film was heated in the air at 150° C. for 1 hour when forming the layer containing a polymerization initiator after irradiated with UV light using a high-pressure mercury lamp in an accumulated light amount of 5 J/cm$^2$ (energy value of 365-nm light).

The substrate, on which the laminated thin film was formed, was set at a spin coater and 0.2 mL of xylene was dropped thereon in the form of a film, followed by allowing it to stand in the air at 23° C. for 10 seconds. Subsequently, the solvent was dried by conducting spin coating at 1500 rpm for 30 seconds. Then, the film thickness was measured, resulting in the value of 60 nm. In this way, insolubility of the produced film in xylene was verified.

Comparative Example 1

A glass substrate measuring 17.5 mm×35 mm (and 0.7 mm in thickness) was washed, successively, with a surfactant solution using ultrasonic, with extra-pure water, with extra-pure water using ultrasonic and again with extra-pure water, followed by drying with nitrogen blow and, finally, ultraviolet ray-ozone cleaning was conducted.

On this glass substrate, a layer containing a polymerizable compound was formed by wet coating method according to the following procedure.

Namely, spin coating was carried out under the conditions described below using a coating liquid that contains the above-mentioned compound (H-1) as polymerizable compound.
<Spin Coating Condition>
    Coating Environment: In the Air
    Solvent: Xylene
    Concentration of Coating Liquid: Compound (H-1) 2 Weight %
    Revolution of Spinner: 1500 rpm
    Time of Revolution of Spinner: 30 Seconds By heating the obtained spin-coated film in the air at 200° C. for 1 hour, a homogeneous thin film (a layer containing a polymerizable compound) of which thickness was 30 nm was obtained.

The substrate, on which the thin film was formed, was set at a spin coater and 0.2 mL of xylene was dropped thereon in the form of a film, followed by allowing it to stand in the air at 23° C. for 10 seconds. Subsequently, the solvent was dried by conducting spin coating at 1500 rpm for 30 seconds. Then, the film thickness measured turned out to be 0 nm, which showed that the entire film was dissolved.

Reference Example 1

A glass substrate measuring 17.5 mm×35 mm (and 0.7 mm in thickness) was washed, successively, with a surfactant solution using ultrasonic, with extra-pure water, with extra-pure water using ultrasonic and again with extra-pure water, followed by drying with nitrogen blow and, finally, ultraviolet ray-ozone cleaning was conducted.

On this glass substrate, a layer containing a polymerizable compound and a polymerization initiator was formed by wet coating method according to the following procedure.

Namely, spin coating was carried out under the conditions described below using a coating liquid that contains the above-mentioned compound (H-1) as polymerizable compound and IRGACURE 651, manufactured by Ciba Specialty Chemicals Inc., as polymerization initiator.
<Spin Coating Condition>
    Coating Environment: In the Air
    Solvent: Xylene
    Concentration of Coating Liquid:

| Compound (H-1) | 1.9 Weight % |
| IRGACURE 651 | 0.1 Weight % |

Revolution of Spinner: 1500 rpm
    Time of Revolution of Spinner: 30 Seconds

The obtained spin-coated film was irradiated with UV light using a high-pressure mercury lamp in an accumulated light amount of 5 J/cm$^2$ (energy value of 365-nm light) in the air. Subsequently, by heating in the air at 180° C. for 1 hour, a homogeneous thin film (a layer containing a polymerizable compound and a polymerization initiator) of which thickness was 30 nm was obtained.

The substrate, on which the thin film was formed, was set at a spin coater and 0.2 mL of xylene was dropped thereon in the form of a film, followed by allowing it to stand in the air at 23° C. for 10 seconds. Subsequently, the solvent was dried by conducting spin coating at 1500 rpm for 30 seconds. Then, the film thickness was measured, resulting in the value of 30 nm. In this way, insolubility of the produced film in xylene was verified.

Reference Example 2

A homogeneous thin film (a layer containing a polymerizable compound and a polymerization initiator) of which film thickness was 30 nm was obtained under the same condition as used for Comparative Example 2 to be described later, except that the spin-coated film was heated in the air at 150° C. for 1 hour when forming the layer containing a polymerizable compound and a polymerization initiator after irradiated with UV light using a high-pressure mercury lamp in an accumulated light amount of 5 J/cm$^2$ (energy value of 365-nm light).

The substrate, on which the thin film was formed, was set at a spin coater and 0.2 mL of xylene was dropped thereon in the form of a film, followed by allowing it to stand in the air at 23° C. for 10 seconds. Subsequently, the solvent was dried by conducting spin coating at 1500 rpm for 30 seconds. Then, the film thickness was measured, resulting in the value of 30 nm. In this way, insolubility of the produced film in xylene was verified.

[Result]

From the above results, it was evident that, in Examples 1 to 3, in which two adjacent layers containing a polymerization initiator and a polymerizable compound respectively were formed, effect of improving solvent resistance due to polymerization reaction could be achieved to the same extent as in Reference Examples 1 and 2, in which a layer containing both a polymerization initiator and a polymerizable compound was formed.

Example 4

A thin film in which layers containing a polymerization initiator and a polymerizable compound respectively are laminated was obtained under the same condition as used for Example 1, except that the formation condition of the layer containing the polymerizable compound was changed as follows.

Namely, spin coating was carried out under the conditions described below using a coating liquid that contains a compound with a structure represented by the following formula H-2 (hereinafter referred to as the "compound (H-2)") as polymerizable compound.

[Chemical Formula 40]

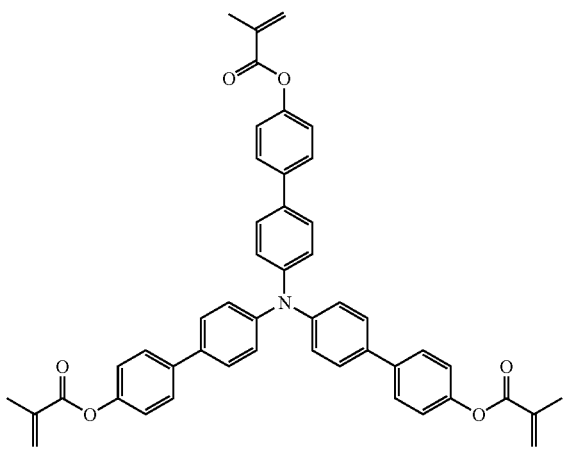

H-2

<Spin Coating Condition>
  Coating Environment: In the Air
  Solvent: Xylene
  Concentration of Coating Liquid: Compound (H-2) 2.0 Weight %
  Revolution of Spinner: 1500 rpm
  Time of Revolution of Spinner: 30 Seconds The obtained spin-coated film was irradiated with UV light using a high-pressure mercury lamp in an accumulated light amount of 2 J/cm$^2$ (energy value of 365-nm light) in the air. Subsequently, by heating it in the air at 150° C. for 1 hour, a homogeneous, laminated thin film (a thin film in which two layers containing a polymerization initiator and a polymerizable compound respectively are laminated) of which total thickness was 69 nm was obtained.

The substrate, on which the laminated thin film was formed, was set at a spin coater and 0.2 mL of xylene was dropped thereon in the form of a film, followed by allowing it to stand in the air at 23° C. for 10 seconds. Subsequently, the solvent was dried by conducting spin coating at 1500 rpm for 30 seconds. Then, the film thickness was measured, resulting in the value of 69 nm. In this way, insolubility of the produced film in xylene was verified.

Example 5

A glass substrate measuring 17.5 mm×35 mm (and 0.7 mm in thickness) was washed, successively, with a surfactant solution using ultrasonic, with extra-pure water, with extra-pure water using ultrasonic and again with extra-pure water, followed by drying with nitrogen blow and, finally, ultraviolet ray-ozone cleaning was conducted.

On this glass substrate, a layer containing a polymerization initiator was formed by wet coating method according to the following procedure.

Namely, spin coating was carried out under the conditions described below, using the above-mentioned compound (P-1) as hole-transport agent and the above-mentioned compound (A-1) and IRGACURE 651, manufactured by Ciba Specialty Chemicals Inc., as polymerization initiators.

<Spin Coating Condition>
  Coating Environment: In the Air
  Solvent for Coating Liquid: Ethyl Benzoate
  Concentration of Coating Liquid:

| Compound (P-1) | 2.0 Weight % |
| Compound (A-1) | 0.8 Weight % |
| IRGACURE 651 | 0.2 Weight % |

Revolution of Spinner: 1500 rpm
  Time of Revolution of Spinner: 30 Seconds
  Drying Condition: 230° C.×3 Hours By the above-mentioned spin coating, a homogeneous thin film (a layer containing a polymerization initiator) of 30 nm thickness was formed.

Subsequently, on the above-mentioned thin film (the layer containing a polymerization initiator), a layer containing a polymerizable compound was formed, by wet coating method according to the following procedure.

Namely, spin coating was carried out under the conditions described below using a coating liquid that contains the above-mentioned compound (H-2) as polymerizable compound.

<Spin Coating Condition>
  Coating Environment: In the Air
  Solvent: Xylene
  Concentration of Coating Liquid: Compound (H-2) 2.0 Weight %
  Revolution of Spinner: 1500 rpm
  Time of Revolution of Spinner: 30 Seconds The obtained spin-coated film was irradiated with UV light using a high-pressure mercury lamp in an accumulated light amount of 5 J/cm$^2$ (energy value of 365-nm light) in the air. Subsequently, by heating it in the air at 180° C. for 1 hour, a homogeneous, laminated thin film (a thin film in which two layers containing a polymerization initiator and a polymerizable compound respectively are laminated) of which total thickness was 69 nm was obtained.

The substrate, on which the laminated thin film was formed, was set at a spin coater and 0.2 mL of xylene was dropped thereon in the form of a film, followed by allowing it to stand in the air at 23° C. for 10 seconds. Subsequently, the solvent was dried by conducting spin coating at 1500 rpm for 30 seconds. Then, the film thickness was measured, resulting in the value of 69 nm. In this way, insolubility of the produced film in xylene was verified.

Reference Example 3

A glass substrate measuring 17.5 mm×35 mm (and 0.7 mm in thickness) was washed, successively, with a surfactant solution using ultrasonic, with extra-pure water, with extra-pure water using ultrasonic and again with extra-pure water, followed by drying with nitrogen blow and, finally, ultraviolet ray-ozone cleaning was conducted.

On this glass substrate, a layer containing a polymerizable compound and a polymerization initiator was formed by wet coating method according to the following procedure.

Namely, spin coating was carried out under the conditions described below using a coating liquid that contains the above-mentioned compound (H-2) as polymerizable compound and IRGACURE 651, manufactured by Ciba Specialty Chemicals Inc., as polymerization initiator.

<Spin Coating Condition>
Coating Environment: In the Air
Solvent: Xylene
Concentration of Coating Liquid:

| Compound (H-2) | 1.9 Weight % |
|---|---|
| IRGACURE 651 | 0.1 Weight % |

Revolution of Spinner: 1500 rpm
Time of Revolution of Spinner: 30 Seconds

The obtained spin-coated film was irradiated with UV light using a high-pressure mercury lamp in an accumulated light amount of 5 J/cm$^2$ (energy value of 365-nm light) in the air. Subsequently, by heating in the air at 180° C. for 1 hour, a homogeneous thin film (a layer containing a polymerizable compound and a polymerization initiator) of which thickness was 39 nm was obtained.

The substrate, on which the thin film was formed, was set at a spin coater and 0.2 mL of xylene was dropped thereon in the form of a film, followed by allowing it to stand in the air at 23° C. for 10 seconds. Subsequently, the solvent was dried by conducting spin coating at 1500 rpm for 30 seconds. Then, the film thickness was measured, resulting in the value of 39 nm. In this way, we verified that the chemical stability was improved from the fact that the produced film was insoluble in xylene.

[Result]

From the above results, it was evident that, in Examples 4 and 5, in which two adjacent, namely, laminated layers containing a polymerization initiator and a polymerizable compound respectively were formed, effect of improving solvent resistance due to polymerization reaction could be achieved to the same extent as in Reference Example 3, in which a layer containing both a polymerization initiator and a polymerizable compound was formed.

Example 6

Figure 3:
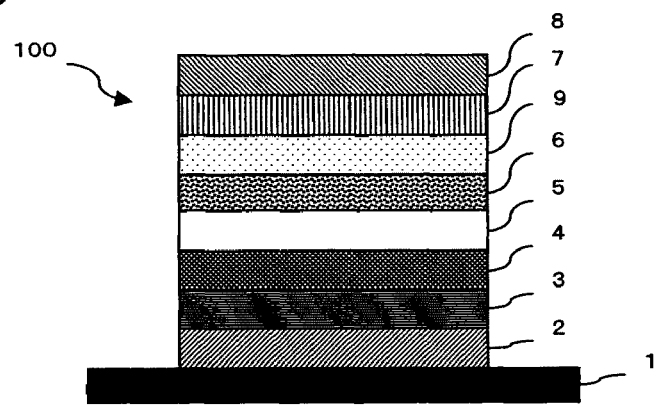
FIG. 3 is a cross-sectional view schematically illustrating the layered structure of the organic electroluminescence device produced in an Example of the present invention.

An organic electroluminescence device having a structure shown in FIG. 3 was produced by the following method.

A glass substrate 1 on which was deposited a transparent electricity conducting film of indium tin oxide (ITO) at a thickness of 150 nm (this is a film formation product by sputtering, manufactured by Sanyo Vacuum Industries Co., Ltd., of which sheet resistance is 15Ω) was subjected to usual photolithography technique and hydrogen chloride etching, leading to a stripe pattern formation of 2 mm in width. Thereby, an anode 2 was prepared.

This ITO substrate 1, patterned with the anode 2, was washed, with acetone using ultrasonic, with purified water, and then with isopropyl alcohol using ultrasonic, followed by drying with nitrogen blow and, finally, ultraviolet ray-ozone cleaning was conducted.

On this anode 2, a hole-injection layer 3 was formed by wet coating method according to the following procedure.

Spin coating was carried out under the conditions described below using a coating liquid that contains the above-mentioned compound (P-1) and the above-mentioned compound (A-1) as materials of the hole-injection layer 3.

<Spin Coating Condition>
Coating Environment: In the Air
Solvent for Coating Liquid: Ethyl Benzoate
Concentration of Coating Liquid:

| Compound (P-1) | 2.0 Weight % |
|---|---|
| Compound (A-1) | 0.8 Weight % |

Revolution of Spinner: 1500 rpm
Time of Revolution of Spinner: 30 Seconds
Drying Condition: 230° C.×3 Hours By the above-mentioned spin coating, a homogeneous thin film (hole-injection layer 3) of 30 nm in thickness was formed on the anode 2.

Subsequently, on this hole-injection layer 3, a hole-transport layer 4 was formed by wet coating method according to the following procedure.

Namely, spin coating was carried out under the conditions described below using a coating liquid that contains the above-mentioned compound (H-2) as hole-transport layer 4.

<Spin Coating Condition>
Coating Environment: In Nitrogen Glove Box
Solvent: Xylene
Concentration of Coating Liquid: Compound (H-2) 1 Weight %
Revolution of Spinner: 1500 rpm
Time of Revolution of Spinner: 30 Seconds By heating the obtained spin-coated film in a nitrogen glove box at 200° C. for 1 hour, a homogeneous thin film (hole-transport layer 4) of which thickness was 18 nm was obtained.

Subsequently, on this hole-transport layer 4, an emitting layer 5 was formed by wet coating method according to the following procedure.

Spin coating was carried out under the conditions described below using a coating liquid that contains compounds with structures represented by the following formulae E-1 and E-2, respectively, (hereinafter referred to as the "compound (E-1)" and "compound (E-2)", respectively) and an iridium complex represented by the following formula D-1 (hereinafter referred to as the "compound (D-1)") as materials of the emitting layer 5.

[Chemical Formula 41]

E-1

[Chemical Formula 42]

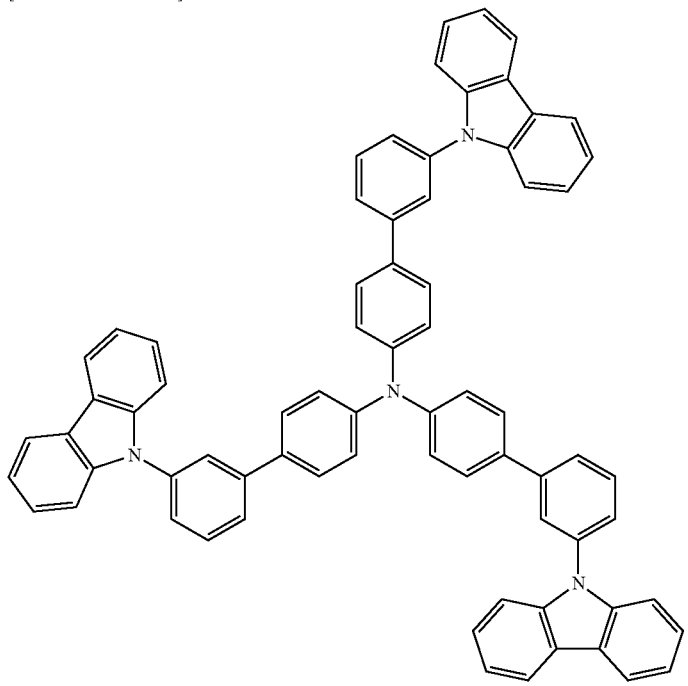

E-2

[Chemical Formula 43]

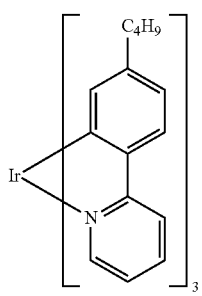

D-1

<Spin Coating Condition>
Coating Environment: In Nitrogen Glove Box
Solvent: Xylene
Concentration of Coating Liquid:

| | |
|---|---|
| Compound (E-1) | 1.0 Weight % |
| Compound (E-2) | 1.0 Weight % |
| Compound (D-1) | 0.1 Weight % |

Revolution of Spinner: 1500 rpm
Time of Revolution of Spinner: 30 Seconds
Drying Condition: 130° C.×60 Minutes (Under a Reduced Pressure)

By the above-mentioned spin coating, a homogeneous thin film (emitting layer 5) of 40 nm thickness was formed.

The substrate, on which each of the above-mentioned layers up to the emitting layer 5 was formed, was transferred into the organic layer deposition chamber of a multi-chamber vacuum deposition equipment that is connected to the nitrogen glove box, without exposing it to the air. After air was evacuated until the degree of vacuum reached $3.8 \times 10^{-5}$ Pa, a hole-inhibition layer 6 and an electron-transport layer 9 were formed by vacuum deposition according to the following procedure.

Namely, on the above-mentioned emitting layer 5, a film of pyridine derivative with a structure represented by the following formula HB-1 (hereinafter referred to as the "compound (HB-1)") was formed at a thickness of 5 nm at a deposition speed of 0.07~0.1 nm/sec. Thereby a hole-inhibition layer 6 was formed. The degree of vacuum at the time of deposition was $3.5 \times 10^{-5}$ Pa.

[Chemical Formula 44]

HB-1

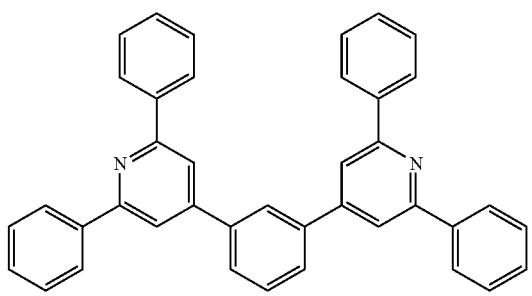

Subsequently, on the hole-inhibition layer 6, an 8-hydroxyquinoline complex of aluminium with a structure represented by the following formula ET-1 (hereinafter referred to as the "compound (ET-1)") was deposited in a similar manner. Thereby an electron-transport layer 9 was formed. The degree of vacuum at the time of deposition was $3.1 \sim 3.2 \times 10^{-5}$ Pa. The deposition speed was 0.09~0.11 nm/sec. The film thickness was 30 nm.

[Chemical Formula 45]

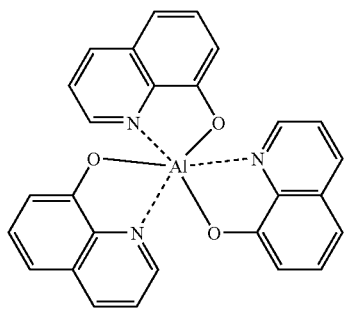

ET-1

The substrate temperatures at the time of vacuum depositions of the hole-inhibition layer 6 and the electron-transport layer 9 were maintained at room temperature.

The device, on which each of the layers up to the electron-transport layer 9 was formed, was transferred within a vacuum from the organic layer deposition chamber to the metal deposition chamber of the above-mentioned multichamber vacuum deposition equipment. As a mask for cathode vapor deposition, a stripe-shaped shadow mask of 2 mm in width was contacted closely with the device at right angles to the ITO stripe of the anode 2, and air was evacuated until the degree of vacuum reached $4.0 \times 10^{-5}$ Pa or lower. Then, a two-layer cathode that consists of an electron-injection layer 7 and a cathode 8 was formed by vacuum deposition according to the following procedure.

On the electron-transport layer 9, a film of lithium fluoride (LiF) was first formed at a thickness of 0.5 nm at a deposition speed of 0.015~0.014 nm/sec and degree of vacuum of $4.9 \sim 5.2 \times 10^{-5}$ Pa using a molybdenum boat. Thereby an electron-injection layer 7 was formed.

Subsequently, a film of aluminium was formed on the electron-injection layer 7 at a thickness of 85 nm at a deposition speed of 0.1~1.3 nm/sec and degree of vacuum of $7.5 \sim 9.1 \times 10^{-5}$ Pa by heating aluminum also in a molybdenum boat, to form a cathode 8.

While the above two-layer cathode was being prepared by vapor deposition, the substrate temperature was maintained at room temperature.

An ultraviolet ray-curable resin (sealing agent for FPD, 3124, manufactured by ThreeBond Co., Ltd.) of approx. 1 mm in width was coated on the peripheral part of a glass plate and a desiccant agent (moisture getter agent for organic EL, HD-S050914W-40, manufactured by Dynic Juno Corp.) was placed on its central area. The device, on which each of the layers up to the cathode 8 was formed, was placed on the plate under nitrogen atmosphere so that the surface of the vapor deposition faces the surface with the desiccant agent. Then, the ultraviolet ray-curable resin was hardened by irradiation with UV light that was delivered only on and around that resin-coated area.

By the above procedure, an organic electroluminescence device (the device of Example 6) having a light-emitting face measuring 2 mm×2 mm was obtained.

When applying a direct current to the device of Example 6 at a current density of 250 mA/cm² continuously, it gave a green light emission of 30080 cd/m² at the beginning of the energization, and of 24470 cd/m² after 20 seconds from the beginning.

Measurement of the emission spectrum of the device of Example 6 showed that the maximum wavelength thereof was 513 nm. This was identified as spectrum from the iridium complex (D-1).

In addition, the chromaticity of the device of Example 6 was such that CIE(x,y)=(0.31, 0.62).

Comparative Example 2

An organic electroluminescence device was produced in the same way as Example 6, except that the film formation of the hole-transport layer 4 was performed by the following procedure.

Namely, spin coating was carried out by the following procedure on the ITO substrate formed with a hole-injection layer 3 by the same method as Example 6, using a coating liquid that contains the above-mentioned compound (H-2) as polymerizable compound and IRGACURE 651, manufactured by Ciba Specialty Chemicals Inc., as polymerization initiator.

<Spin Coating Condition>
Coating Environment: In Nitrogen Glove Box
Solvent: Xylene
Concentration of Coating Liquid:

| | |
|---|---|
| Compound (H-2) | 0.95 Weight % |
| IRGACURE 651 | 0.05 Weight % |

Revolution of Spinner: 1500 rpm
Time of Revolution of Spinner: 30 Seconds

The obtained spin-coated film was irradiated with UV light using a high-pressure mercury lamp in an accumulated light amount of 5 J/cm² (energy value of 365-nm light) in a nitrogen glove box. Subsequently, by heating it in the air at 120° C. for 1 hour, a homogeneous thin film (hole-transport layer 4) of which thickness was 18 nm was obtained.

By the above procedure, an organic electroluminescence device (the device of Comparative Example 2) having a light-emitting face measuring 2 mm×2 mm was obtained.

When applying a direct current to the device of Comparative Example 2 at a current density of 250 mA/cm² continuously, it gave a green light emission of 29720 cd/m² at the beginning of the energization, and of 21170 cd/m² after 20 seconds from the beginning.

Measurement of the emission spectrum of the device of Comparative Example 2 showed that the maximum wavelength thereof was 512 nm. This was identified as spectrum from the iridium complex (D-1).

In addition, the chromaticity of the device of Comparative Example 2 was such that CIE(x,y)=(0.30, 0.63).

[Result]

The luminescent characteristics of the devices of Example 6 and Comparative Example 2 are summarized in Table 1 below.

TABLE 1

|  | 250 mA/cm² brightness at the beginning of the energization [cd/m²] | 250 mA/cm² brightness after 20 seconds from the beginning [cd/m²] | brightness after 20 seconds from the beginning divided by brightness at the beginning of the energization |
|---|---|---|---|
| Example 6 | 30080 | 24470 | 0.81 |
| Comparative Example 2 | 29720 | 21170 | 0.71 |

As is clear from Table 1, it is evident that the device of Example 6, in which a hole-injection layer containing a polymerization initiator and a hole-transport layer containing a polymerizable compound are laminated, is more stable than the device of Comparative Example 2, which comprises a hole-transport layer containing both a polymerization initiator and a polymerizable compound, since the device of Example 6 showed smaller decrease in brightness at the time of continuous energization.

Example 7

A glass substrate measuring 37.5 mm×25 mm (and 0.7 mm in thickness) was washed, successively, with a surfactant solution using ultrasonic, with extra-pure water, with extra-pure water using ultrasonic and again with extra-pure water, followed by drying with nitrogen blow and, finally, ultraviolet ray-ozone cleaning was conducted.

On this glass substrate, a layer containing a polymerization initiator was formed by wet coating method according to the following procedure.

Namely, spin coating was carried out under the conditions described below using a coating liquid that contains the above-mentioned compound (P-1) as charge-transport agent and the above-mentioned compound (A-1) as both electron-accepting compound and polymerization initiator.

<Spin Coating Condition>
Coating Environment: In the Air
Solvent for Coating Liquid: Ethyl Benzoate
Concentration of Coating Liquid:

| Compound (P-1) | 2.0 Weight % |
| Compound (A-1) | 0.8 Weight % |

Revolution of Spinner: 1500 rpm
Time of Revolution of Spinner: 30 Seconds
Drying Condition: 230° C.×3 Hours By the above-mentioned spin coating, a homogeneous thin film (a layer containing a polymerization initiator) of 30 nm thickness was formed.

Subsequently, on the above-mentioned thin film (the layer containing a polymerization initiator), a layer containing a polymerizable compound was formed, by wet coating method according to the following procedure.

Namely, spin coating was carried out under the conditions described below using a coating liquid that contains a compound with a structure represented by the following structural formula H-3 (weight-average molecular weight: 100000; this compound will be hereinafter referred to as the "compound (H-3)") as polymerizable compound.

[Chemical Formula 46]

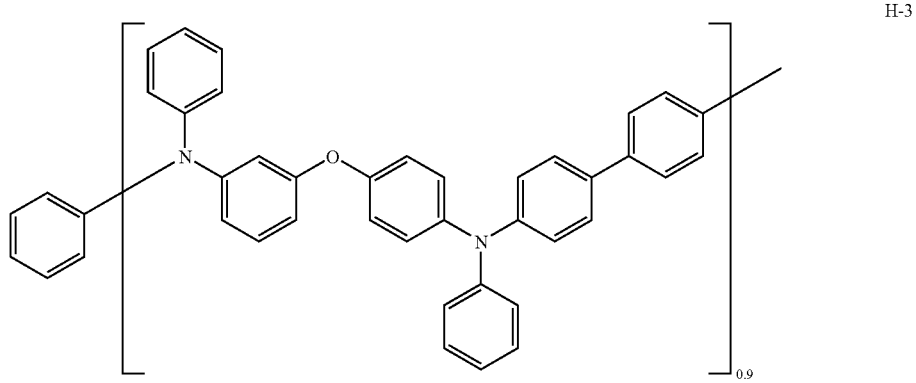

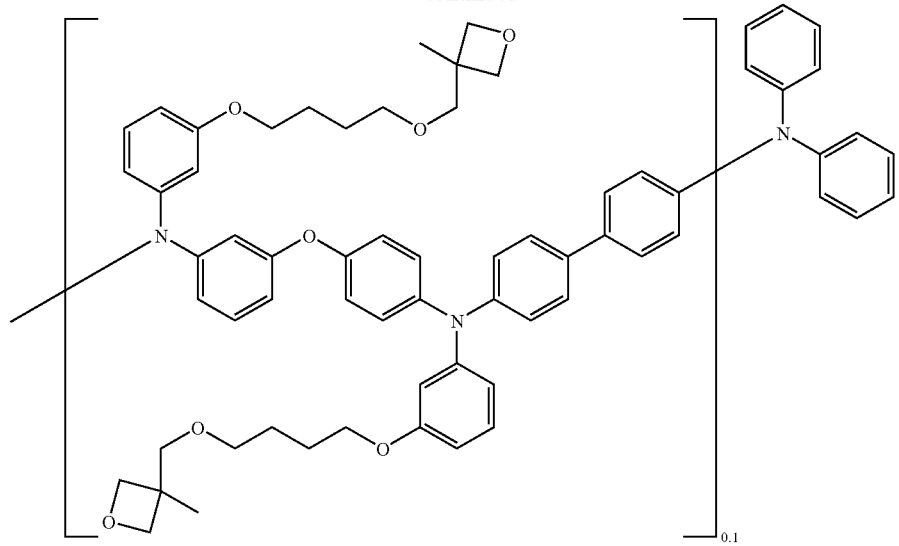

<Spin Coating Condition>
  Coating Environment: In Nitrogen
  Solvent: Toluene
  Concentration of Coating Liquid: Compound (H-3) 1.0 Weight %
  Revolution of Spinner: 1500 rpm
  Time of Revolution of Spinner: 30 Seconds By heating the obtained spin-coated film in nitrogen at 200° C. for 1 hour, a homogeneous, laminated thin film (a thin film in which two layers containing a polymerization initiator and a polymerizable compound respectively are laminated) having total thickness of 80 nm was obtained.

The substrate, on which the laminated thin film was formed, was set at a spin coater and 0.2 mL of xylene was dropped thereon in the form of a film, followed by allowing it to stand in the air at 23° C. for 10 seconds. Subsequently, the solvent was dried by conducting spin coating at 1500 rpm for 30 seconds. Then, the film thickness was measured, resulting in the value of 80 nm. In this way, insolubility of the formed film in xylene was verified.

Comparative Example 3

A glass substrate measuring 37.5 mm×25 mm (and 0.7 mm in thickness) was washed, successively, with a surfactant solution using ultrasonic, with extra-pure water, with extra-pure water using ultrasonic and again with extra-pure water, followed by drying with nitrogen blow and, finally, ultraviolet ray-ozone cleaning was conducted.

On this glass substrate, a layer containing a polymerizable compound was formed by wet coating method according to the following procedure.

Namely, spin coating was carried out under the conditions described below using a coating liquid that contains the compound (H-3) as polymerizable compound.
<Spin Coating Condition>
  Coating Environment: In Nitrogen
  Solvent: Toluene
  Concentration of Coating Liquid: Compound (H-3) 1.0 Weight %
  Revolution of Spinner: 1500 rpm
  Time of Revolution of Spinner: 30 Seconds By heating the obtained spin-coated film in nitrogen at 200° C. for 1 hour, a homogeneous thin film (a film on which is laminated only a layer containing a polymerizable compound) having thickness of 50 nm was obtained.

The substrate, on which the thin film was formed, was set at a spin coater and 0.2 mL of xylene was dropped thereon in the form of a film, followed by allowing it to stand in the air at 23° C. for 10 seconds. Subsequently, the solvent was dried by conducting spin coating at 1500 rpm for 30 seconds. Then, the film thickness measured turned out to be 30 nm, which showed that the film, which was formed from the polymerizable compound, was not insoluble completely.

Example 8

An organic electroluminescence device having a structure shown in FIG. 3 was produced by the following method.

A glass substrate 1 on which was deposited a transparent electricity conducting film of indium tin oxide (ITO) at a thickness of 120 nm (this is a film formation product by sputtering, manufactured by Sanyo Vacuum Industries Co., Ltd.) was subjected to usual photolithography technique and hydrogen chloride etching, leading to a stripe pattern formation of 2 mm in width. Thereby, an anode 2 was prepared.

This ITO substrate 1, patterned with the anode 2, was washed, successively, with a surfactant solution using ultrasonic, with extra-pure water, with extra-pure water using ultrasonic and again with extra-pure water, followed by drying with compressed air and, finally, ultraviolet ray-ozone cleaning was conducted.

On this anode 2, a hole-injection layer 3 was formed by wet coating method according to the following procedure.

A coating liquid was first prepared which contains the compound (P-1), the compound (A-1), a compound shown in the structural formula (A-2) below (hereinafter referred to as the "compound (A-2)") as polymerization initiator, and ethyl benzoate. Spin coating was then conducted on the anode 2 using the coating liquid, under the conditions described below.

[Chemical Formula 47]

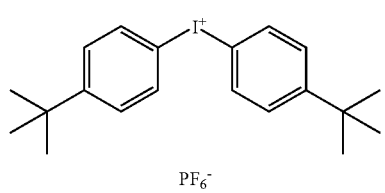

A-2

<Spin Coating Condition>
Coating Environment: In the Air
Solvent for Coating Liquid: Ethyl Benzoate

[Chemcial Formula 48]

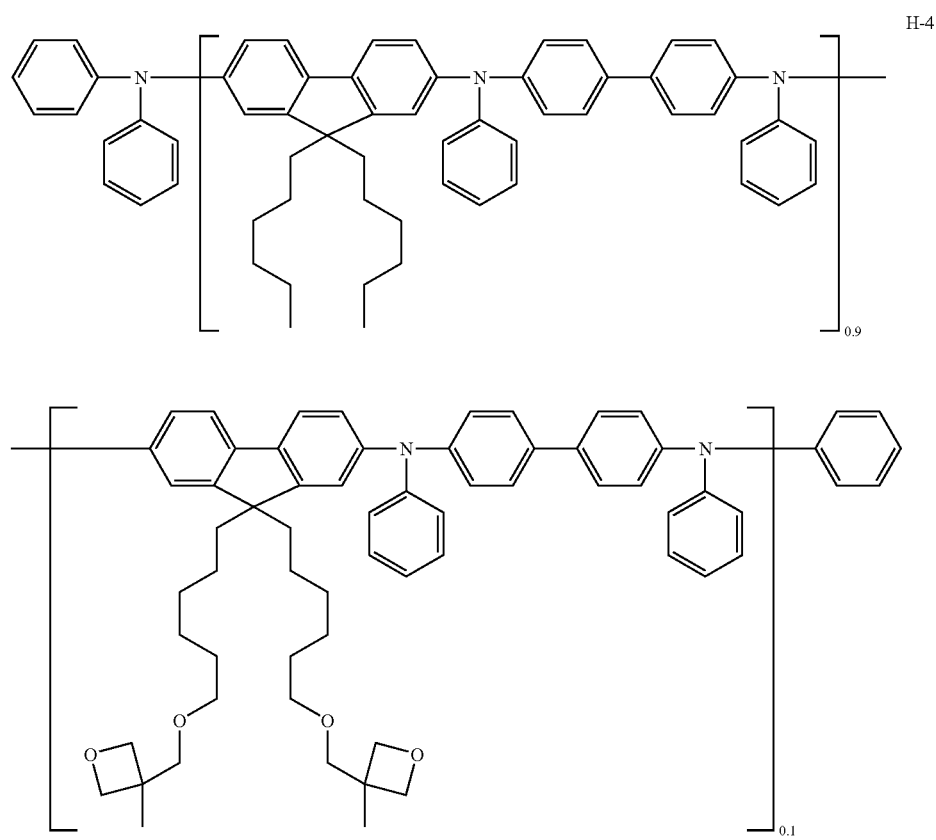

H-4

Concentration of Coating Liquid:

| Compound (P-1) | 2.0 Weight % |
|---|---|
| Compound (A-1) | 0.8 Weight % |
| Compound (A-2) | 0.2 Weight % |

Revolution of Spinner: 1500 rpm
Time of Revolution of Spinner: 30 Seconds
Drying Condition: 230° C.×1 Hour By the above-mentioned spin coating, a homogeneous thin film (hole-injection layer 3) of 30 nm in thickness was formed on the anode 2.

Subsequently, on this hole-injection layer 3, a hole-transport layer 4 was formed by wet coating method according to the following procedure.

A coating liquid was prepared which contains an organic compound shown in the structural formula (H-4) below (weight-average molecular weight: 91700; this will be hereinafter referred to as the "compound (H-4)") as material for the hole-transport layer 4. Spin coating was then conducted using the coating liquid under the conditions described below.

<Spin Coating Condition>
Coating Environment: In Nitrogen
Solvent: Toluene
Concentration of Coating Liquid: Compound (H-4) 0.4 Weight %
Revolution of Spinner: 1500 rpm
Time of Revolution of Spinner: 30 Seconds By heating the obtained spin-coated film in nitrogen at 200° C. for 1 hour, a homogeneous thin film (hole-transport layer 4) of which thickness was 20 nm was obtained.

Subsequently, on this hole-transport layer 4, an emitting layer 5 was formed by wet coating method according to the following procedure.

A coating liquid was prepared using the above-mentioned compound (E-1), compound (E-2) and compound (D-1) as material for the emitting layer 5. Spin coating was then conducted using the coating liquid under the conditions described below.

<Spin Coating Condition>
Coating Environment: In Nitrogen
Solvent: Xylene
Concentration of Coating Liquid:

| | |
|---|---|
| Compound (E-1) | 1.8 Weight % |
| Compound (E-2) | 0.2 Weight % |
| Compound (D-1) | 0.1 Weight % |

Revolution of Spinner: 1500 rpm
Time of Revolution of Spinner: 30 Seconds
Drying Condition: 130° C.×1 Hour By the above-mentioned spin coating, a homogeneous thin film (emitting layer 5) of 40 nm thickness was formed.

The substrate, on which each of the above-mentioned layers up to the emitting layer 5 was formed, was transferred into a vacuum deposition equipment, and first evacuation was performed with an oil-sealed rotary pump, followed by final evacuation by a cryopump until the degree of vacuum in the equipment reached $2.4 \times 10^{-4}$ Pa or lower. Subsequently, a film of the above-mentioned compound (HB-1) was laminated thereon at a thickness of 5 nm at a deposition speed of 0.7~0.8 Å/sec. Thereby a hole-inhibition layer 6 was formed. The degree of vacuum at the time of deposition was $2.4 \sim 2.7 \times 10^{-4}$ Pa.

Subsequently, on the hole-inhibition layer 6, the above-mentioned compound (ET-1) was deposited in a similar manner. Thereby an electron-transport layer 9 was formed. The degree of vacuum at the time of deposition was $0.4 \sim 1.6 \times 10^{-4}$ Pa. The deposition speed was 1.0~1.5 Å/sec. The film thickness was 30 nm.

The device processed up to this vapor deposition stage of the electron-transport layer 9 was taken out into the air from the above-mentioned vacuum deposition equipment. The device was then placed in another vacuum deposition equipment so that a stripe-shaped shadow mask of 2 mm in width, as a mask for cathode vapor deposition, was contacted with the device at right angles to the ITO stripe of the anode 2. Then, air was evacuated until the degree of vacuum in the equipment reached $6.4 \times 10^{-4}$ Pa or lower, in the same way as when the organic layers were formed.

On the electron-transport layer 9, a film of lithium fluoride (LiF) was first formed at a thickness of 0.5 nm at a deposition speed of 0.1~0.4 Å/sec and degree of vacuum of $3.2 \sim 6.7 \times 10^{-4}$ Pa using a molybdenum boat. Thereby an electron-injection layer was formed.

Next, a film of aluminium was formed on the electron-injection layer 7 at a thickness of 80 nm at a deposition speed of 0.7~5.3 Å/sec and degree of vacuum of $2.8 \sim 11.1 \times 10^{-4}$ Pa by heating aluminum also in a molybdenum boat, to form a cathode 8.

While the above two layers were being prepared by vapor deposition, the substrate temperature was maintained at room temperature.

Subsequently, the device was subjected to the following sealing treatment to prevent the deterioration of the device due to moisture in the air or the like during storage.

In a nitrogen glove box, a light-hardening resin (30Y-437, manufactured by ThreeBond Co., Ltd.) of approx. 1 mm in width was coated on the peripheral part of a glass plate measuring 23 mm×23 mm and a moisture getter sheet (manufactured by Dynic Juno Corp.) was placed on the central area. The substrate, whose vapor deposition of the cathode had been completed, was placed thereon so that the surface of the vapor deposition faces the desiccant sheet. Then, the light-hardening resin was hardened by irradiation with UV light that was delivered only on that resin-coated area.

By the above procedure, an organic electroluminescence device having a light-emitting face measuring 2 mm×2 mm was obtained. The characteristics of the obtained device are shown in Table 2.

Comparative Example 4

An organic electroluminescence device shown in FIG. 3 was produced in the same way as Example 8, except that the hole-transport layer 4 was formed by the following procedure.

A coating liquid was prepared that contains the compound (H-4), which has polymerizable group, and a compound shown in the structural formula (A-3) below (hereinafter referred to as the "compound (A-3)") as polymerization initiator. Spin coating was then conducted under the following conditions. Thereby, a thin film (hole-transport layer 4) of 20 nm in film thickness was formed.

[Chemical Formula 49]

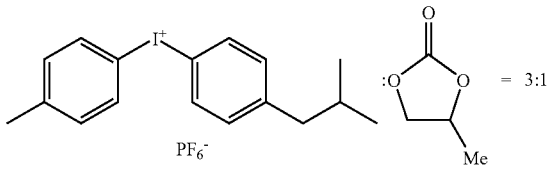

A-3

<Spin Coating Condition>
Coating Environment: In Nitrogen
Solvent: Toluene
Concentration of Coating Liquid:

| | |
|---|---|
| Compound (H-4) | 0.4 Weight % |
| compound (A-3) | 0.08 Weight % |

Revolution of Spinner: 1500 rpm
Time of Revolution of Spinner: 30 Seconds
Drying Condition: 200° C.×1 Hour By the above procedure, an organic electroluminescence device having a light-emitting face measuring 2 mm×2 mm was obtained. The characteristics of the obtained device are shown in Table 2.

TABLE 2

| | current efficiency at 100 cd/m² [cd/A] | standardized driving lifetime (decrease from default 2500 cd/m² to 2000 cd/m²) (Comparative Example 4 regarded as 1) |
|---|---|---|
| Example 8 | 20.8 | 1.5 |
| Comparative Example 4 | 18.8 | 1 |

As is clear from Table 2, it is evident that the organic electroluminescence device of Example 8, in which a hole-injection layer containing a polymerization initiator and a hole-transport layer containing a polymerizable compound are laminated, is more stable than the device of Comparative Example 4, which comprises a hole-transport layer containing both a polymerizable compound and a polymerization initiator, since the device of Example 8 showed higher efficiency and smaller decrease in brightness while driving.

Example 9

An organic electroluminescence device shown in FIG. 3 was produced in the same way as Example 8, except that the hole-injection layer 3 was formed by the following procedure.

A coating liquid was prepared that contains the compound (P-1), the compound (A-1), the compound (A-3) as polymerization initiator, and ethyl benzoate. Spin coating was then conducted on the anode 2 under the following conditions. Thereby, a thin film (hole-injection layer 3) of 30 nm in film thickness was formed.

<Spin Coating Condition>
Coating Environment: In the Air
Solvent for Coating Liquid: Ethyl Benzoate
Concentration of Coating Liquid:

| Compound (P-1) | 2.0 Weight % |
|---|---|
| Compound (A-1) | 0.8 Weight % |
| Compound (A-3) | 0.2 Weight % |

Revolution of Spinner: 1500 rpm
Time of Revolution of Spinner: 30 Seconds
Drying Condition: 230° C.×1 Hour By the above procedure, an organic electroluminescence device having a light-emitting face measuring 2 mm×2 mm was obtained. The characteristics of the obtained device are shown in Table 3.

Comparative Example 5

An organic electroluminescence device shown in FIG. 3 was produced in the same way as Example 9, except that the hole-transport layer 4 was formed by the following procedure.

A coating liquid was prepared that contains the compound (H-4), which has polymerizable group, and the compound (A-3) as polymerization initiator. Spin coating was then conducted under the following conditions. Thereby, a thin film (hole-transport layer 4) of 20 nm in film thickness was formed.

<Spin Coating Condition>
Coating Environment: In Nitrogen
Solvent: Toluene
Concentration of Coating Liquid:

| Compound (H-4) | 0.4 Weight % |
|---|---|
| Compound (A-3) | 0.08 Weight % |

Revolution of Spinner: 1500 rpm
Time of Revolution of Spinner: 30 Seconds
Drying Condition: 200° C.×1 Hour By the above procedure, an organic electroluminescence device having a light-emitting face measuring 2 mm×2 mm was obtained. The characteristics of the obtained device are shown in Table 3.

TABLE 3

|  | current efficiency at 100 cd/m$^2$ [cd/A] | standardized driving lifetime (decrease from default 2500 cd/m$^2$ to 2000 cd/m$^2$) (Comparative Example 5 regarded as 1) |
|---|---|---|
| Example 9 | 27.1 | 1.27 |
| Comparative Example 5 | 10.7 | 1 |

As is clear from Table 3, it is evident that the organic electroluminescence device of Example 9, in which a hole-injection layer containing a polymerization initiator and a hole-transport layer containing a polymerizable compound are laminated, is more stable than the device of Comparative Example 5, which comprises a hole-transport layer containing both a polymerizable compound and a polymerization initiator, since the device of Example 9 showed higher efficiency and smaller decrease in brightness while driving.

Example 10

An organic electroluminescence device shown in FIG. 3 was produced in the same way as Example 8, except that the hole-injection layer 3 was formed by the following procedure.

A coating liquid was prepared which contains a polymer compound shown in the structural formula (P-2) below (46000 of weight-average molecular weight; this will be hereinafter referred to as the "compound (P-2)"), the compound (A-3) as polymerization initiator, and ethyl benzoate. Spin coating was then conducted on the anode 2 under the following conditions. Thereby, a thin film (hole-injection layer 3) of 30 nm in film thickness was formed.

[Chemical Formula 50]

P-2

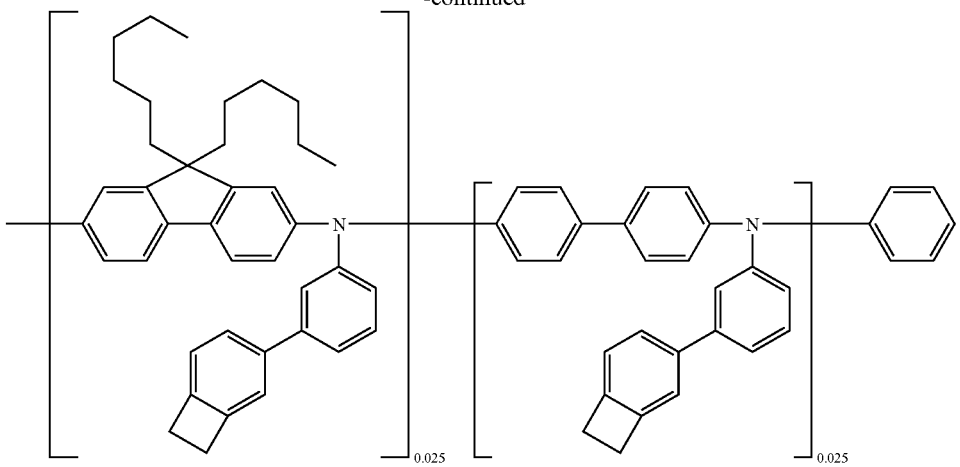

<Spin Coating Condition>
  Coating Environment: In the Air
  Solvent: Toluene
  Concentration of Coating Liquid:

| Compound (P-2) | 0.7 Weight % |
| Compound (A-3) | 0.15 Weight % |

Revolution of Spinner: 1500 rpm
Time of Revolution of Spinner: 30 Seconds
Drying Condition: 230° C.×1 Hour By the above procedure, an organic electroluminescence device having a light-emitting face measuring 2 mm×2 mm was obtained. The characteristics of the obtained device are shown in Table 4.

Comparative Example 6

An organic electroluminescence device shown in FIG. 3 was produced in the same way as Example 10, except that the hole-transport layer 4 was formed by the following procedure.

A coating liquid was prepared that contains the compound (H-4), which has polymerizable group, and the compound (A-3) as polymerization initiator. Spin coating was then conducted under the following conditions. Thereby, a thin film (hole-transport layer 4) of 20 nm in film thickness was formed.

<Spin Coating Condition>
  Coating Environment: In Nitrogen
  Solvent: Toluene
  Concentration of Coating Liquid:

| Compound (H-4) | 0.4 Weight % |
| Compound (A-3) | 0.08 Weight % |

Revolution of Spinner: 1500 rpm
Time of Revolution of Spinner: 30 Seconds
Drying Condition: 200° C.×1 Hour By the above procedure, an organic electroluminescence device having a light-emitting face measuring 2 mm×2 mm was obtained. The characteristics of the obtained device are shown in Table 4.

TABLE 4

|  | current efficiency at 100 cd/m$^2$ [cd/A] | standardized driving lifetime (decrease from default 2500 cd/m$^2$ to 2000 cd/m$^2$) (Comparative Example 6 regarded as 1) |
| --- | --- | --- |
| Example 10 | 8.5 | 1.75 |
| Comparative Example 6 | 7.5 | 1 |

As is clear from Table 4, it is evident that the organic electroluminescence device of Example 10, in which a hole-injection layer containing a polymerization initiator and a hole-transport layer containing a polymerizable compound are laminated, is more stable than the device of Comparative Example 6, which comprises a hole-transport layer containing both a polymerizable compound and a polymerization initiator, since the device of Example 10 showed higher efficiency and smaller decrease in brightness while driving.

Example 11

An organic electroluminescence device shown in FIG. 3 was produced in the same way as Example 8, except that the hole-injection layer 3 was formed by the following procedure.

A coating liquid was prepared which contains the compound (P-1), the compound (A-1), a compound shown in the structural formula (A-4) below (hereinafter referred to as the "compound (A-4)") as polymerization initiator, and ethyl benzoate. A film of the coating liquid was formed by spin coating on the anode 2 under the following conditions. Thereby, a thin film (hole-injection layer 3) of 30 nm in film thickness was formed.

[Chemical Formula 51]

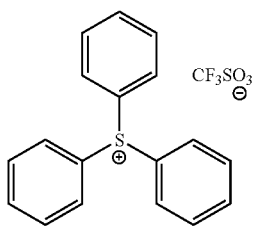

A-4

<Spin Coating Condition>
Coating Environment: In the Air
Solvent for Coating Liquid: Ethyl Benzoate
Concentration of Coating Liquid:

| Compound (P-1) | 2.0 Weight % |
|---|---|
| Compound (A-1) | 0.8 Weight % |
| Compound (A-4) | 0.2 Weight % |

Revolution of Spinner: 1500 rpm
Time of Revolution of Spinner: 30 Seconds
Drying Condition: 230° C.×1 Hour By the above procedure, an organic electroluminescence device having a light-emitting face measuring 2 mm×2 mm was obtained. The characteristics of the obtained device are shown in Table 5.

Comparative Example 7

An organic electroluminescence device shown in FIG. 3 was produced in the same way as Example 11, except that the hole-transport layer 4 was formed by the following procedure.

A coating liquid was prepared that contains the compound (H-2), which has polymerizable group, and the compound (A-3) as polymerization initiator. Spin coating was then conducted under the following conditions. Thereby, a thin film (hole-transport layer 4) of 20 nm in film thickness was formed.

<Spin Coating Condition>
Coating Environment: In Nitrogen
Solvent: Toluene
Concentration of Coating Liquid:

| Compound (H-2) | 0.4 Weight % |
|---|---|
| Compound (A-3) | 0.08 Weight % |

Revolution of Spinner: 1500 rpm
Time of Revolution of Spinner: 30 Seconds
Drying Condition: 200° C.×1 Hour By the above procedure, an organic electroluminescence device having a light-emitting face measuring 2 mm×2 mm was obtained. The characteristics of the obtained device are shown in Table 5.

TABLE 5

| | driving voltage at 2500 cd/m² [V] | standardized driving lifetime (decrease from default 2500 cd/m² to 1500/m²) (Comparative Example 7 regarded as 1) |
|---|---|---|
| Example 11 | 9.6 | 1.68 |
| Comparative Example 7 | 10.5 | 1 |

As is clear from Table 5, it is evident that the organic electroluminescence device of Example 11, in which a hole-injection layer containing a polymerization initiator and a hole-transport layer containing a polymerizable compound are laminated, is more stable than the device of Comparative Example 7, which comprises a hole-transport layer containing both a polymerizable compound and a polymerization initiator, since the device of Example 11 required lower driving voltage for the same emission brightness and showed smaller decrease in brightness while driving.

Example 12

(Preparation of Sample for Measuring QA)

An ITO substrate measuring 37.5 mm×25 mm (and 0.7 mm in thickness) was washed, successively, with a surfactant solution using ultrasonic, with extra-pure water, with extra-pure water using ultrasonic and again with extra-pure water, followed by drying with nitrogen blow and, finally, ultraviolet ray-ozone cleaning was conducted.

On this glass substrate, a layer containing a polymerization initiator was formed by wet coating method according to the following procedure.

Namely, spin coating was carried out under the conditions described below using a coating liquid that contains the compound (P-1) and the compound (A-1), which functions as both electron-accepting compound and polymerization initiator.

<Spin Coating Condition>
Coating Environment: In the Air
Solvent for Coating Liquid: Ethyl Benzoate
Concentration of Coating Liquid:

| Compound (P-1) | 2.0 Weight % |
|---|---|
| Compound (A-1) | 0.8 Weight % |

Revolution of Spinner: 1500 rpm
Time of Revolution of Spinner: 30 Seconds
Drying Condition: 230° C.×3 Hours By the above-mentioned spin coating, a homogeneous thin film (a layer containing a polymerization initiator) of 30 nm thickness was formed. This is used as the sample for measuring QA.

(Calculation of QA by XPS Measurement)

XPS measurement was performed as follows for the sample for measuring QA, which was prepared as described above, with a scanning X-ray photoelectron spectrometer, QUANTUM2000, manufactured by ULVAC-PHI, INCORPORATED.

First, the central part of the substrate measuring 25 mm×37.5 mm, namely the sample for measuring QA, of about 10 mm square was cut out and it was set on the sample holder using a molybdenum mask with a hole of 1~2 mm ϕ formed. As X-ray source for the measurement, Al—Kα line that was passed through a monochromator (energy: 1486.6 eV) was used. The measurement was performed with acceleration voltage of 16 kV and output power of 34 W.

The analysis was performed for the measured data with an analyzer, multipak ver. 8.0, manufactured by ULVAC-PHI, INCORPORATED. The quantities that were proportional to the numbers of atoms of carbon and fluorine were decided, by dividing the peak areas of most intensive peaks of carbon and fluorine by the sensitivity correction coefficient. From these molecular weights of compound (P-1)resulting from the calculation (the molecular weight of the repetitive unit was used for compound (P-1), which comprises the repetitive units) and compound (A-1), QA, the ratio of the number of molecules of compound (A-1) relative to number of molecules of compound (P-1) (namely, relative to the number of repetitive unit of compound (P-1)) contained in the surface part of the sample for measuring QA (the layer containing the polymerization initiator), was calculated. The calculated QA was 44.60%.

(Preparation of Sample for Measuring QB)

On the thin film of the sample for measuring QA (the layer containing a polymerization initiator), a layer containing a polymerizable compound was formed, by wet coating method according to the following procedure.

Namely, spin coating was carried out under the conditions described below using a coating liquid that contains the compound (H-3) as polymerizable compound.

<Spin Coating Condition>

Coating Environment: In Nitrogen
Solvent: Toluene
Concentration of Coating Liquid: Compound (H-3) 0.4 Weight %
Revolution of Spinner: 1500 rpm
Time of Revolution of Spinner: 30 Seconds
Drying Condition: 230° C.×1 Hour By the above procedure, a homogeneous, laminated thin film (a thin film in which two layers containing a polymerization initiator and a polymerizable compound respectively are laminated) of which total thickness was 50 nm was obtained. This is used as the sample for measuring QB.

(Calculation of QB by XPS Measurement)

XPS measurement was performed for the sample for measuring QB, which was prepared as described above, in the same manner as the measurement for QA. At this point, since the compound (H-3) is a compound comprising two or more kinds of repetitive units, as molecular weight of the compound (H-3), mean molecular weight of the repetitive units, namely, average value weighted according to the number ratio of each repetitive unit, was used. In the result, QB, the ratio of the number of molecules of compound (A-1) relative to number of molecules of compound (H-3) (namely, relative to the number of repetitive unit of compound (H-3)) contained in the surface part of the sample for measuring QB (the layer containing the polymerizable compound), was calculated. The calculated QB was 13.26%.

The value of QB/QA turned out to be 0.30, from the above calculations.

The present invention has been explained in detail above with reference to specific embodiments. However, it is evident to those skilled in the art that various modifications can be added thereto without departing from the intention and the scope of the present invention.

The present application is based on Japanese Patent Application (Patent Application No. 2007-34466) filed on Feb. 15, 2007 and their entireties are incorporated herewith by reference.

The invention claimed is:

1. A method of producing an organic device comprising a plurality of organic layers comprising at least a first layer formed by polymerization of a polymerizable compound, a second layer disposed adjacent to said first layer and comprising a polymerization initiator and an emitting layer; a substrate; and an anode and a cathode overlying said substrate, said method comprising:
    forming said second layer through film formation using a composition comprising a polymerization initiator;
    forming a layer comprising said polymerizable compound through film formation using a composition comprising said polymerization compound and which is free from a polymerization initiator; and
    forming said first layer by polymerization of said polymerizable compound by activating said polymerization initiator,
    wherein said emitting layer, said first layer and said second layer are arranged in the listed order,
    said plurality of organic layers comprising said first layer, and said second layer are formed between said anode and said cathode and
    said polymerization initiator has a molecular weight of 3,000 or less.

2. An organic electroluminescence device produced by the method of claim 1.

3. The organic electroluminescence device according to claim 2, wherein said first layer is a hole-transport layer, and said second layer is hole-injection layer.

4. The method of producing an organic device of claim 1, wherein a content of said polymerization initiator in said second layer is 0.1 weight % or higher.

5. A method of producing an electroluminescence device comprising:
    a substrate, an anode and a cathode overlying said substrate; an emitting layer disposed between said anode and said cathode; a polymerized layer formed by polymerization of a polymerizable compound and an adjacent layer at an opposite side to said emitting layer and comprising a polymerization initiator, said method comprising:
    forming said adjacent layer through film formation using a composition comprising a polymerization initiator;
    forming a layer comprising said polymerizable compound through film formation using a composition comprising said polymerization compound and which is free from a polymerization initiator; and
    forming said polymerized layer by polymerization of said polymerizable compound by activating said polymerization initiator,
    wherein said emitting layer, said polymerized layer and said adjacent second layer are formed between said anode and said cathode, and said polymerization initiator has a molecular weight of 3,000 or less,
    a ratio between QB and QA meets the condition of $QB/QA<0.5$, where QA (%) is the ratio of the number of molecules of said polymerization initiator contained in the surface part of said adjacent layer at the side of said polymerized layer, measured by means of XPS method, to the number of molecules of the component other than said polymerization initiator, contained in the surface part of said adjacent layer at the side of said polymerized layer, measured by means of XPS method, and QB (%) is the ratio of the number of molecules of said polymerization initiator contained in the surface part of said polymerized layer at the side of said emitting layer, measured by means of XPS method, to the number of molecules of the component other than said polymerization initiator, contained in the surface part of said polymerized layer at the side of said emitting layer, measured by means of XPS method.

6. An organic electroluminescence device produced by the method of claim 5.

7. The organic electroluminescence device according to claim 5, wherein said polymerized layer is a hole-transport layer, and said adjacent layer is hole-injection layer.

8. The method of producing an organic device of claim 5, wherein a content of said polymerization initiator in said second layer is 0.1 weight % or higher.

* * * * *